(12) United States Patent
Okamoto et al.

(10) Patent No.: US 11,870,393 B2
(45) Date of Patent: Jan. 9, 2024

(54) SEMICONDUCTOR DEVICE AND ELECTRONIC DEVICE EACH HAVING OSCILLATOR

(71) Applicant: Semiconductor Energy Laboratory Co., Ltd., Atsugi (JP)

(72) Inventors: Yuki Okamoto, Sagamihara (JP); Yoshiyuki Kurokawa, Sagamihara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/868,688

(22) Filed: May 7, 2020

(65) Prior Publication Data

US 2020/0266761 A1 Aug. 20, 2020

Related U.S. Application Data

(60) Continuation of application No. 16/046,277, filed on Jul. 26, 2018, now Pat. No. 10,651,790, which is a (Continued)

(30) Foreign Application Priority Data

Oct. 30, 2015 (JP) ................................. 2015-213708

(51) Int. Cl.
*H03B 5/06* (2006.01)
*H01L 27/092* (2006.01)
(Continued)

(52) U.S. Cl.
CPC ............. *H03B 5/06* (2013.01); *H01L 27/092* (2013.01); *H01L 27/1207* (2013.01);
(Continued)

(58) Field of Classification Search
CPC ............. H01L 27/1207; H01L 27/1225; H01L 27/092; H01L 27/1255; H01L 29/7869;
(Continued)

(56) References Cited

U.S. PATENT DOCUMENTS 5,418,499 A 5/1995 Nakao
5,594,391 A 1/1997 Yoshizawa
(Continued)

FOREIGN PATENT DOCUMENTS

JP 62-000107 A 1/1987
JP 06-310994 A 11/1994
(Continued)

OTHER PUBLICATIONS

Translation of JP3579980 (Nakamura et al) (Mar. 28, 1997). (Year: 1997).*

(Continued)

*Primary Examiner* — Michael Jung
(74) *Attorney, Agent, or Firm* — ROBINSON INTELLECTUAL PROPERTY LAW OFFICE, P.C.; Eric J. Robinson

(57) ABSTRACT

An oscillator capable of quick startup is provided. A transistor is provided between an output terminal of a certain stage inverter and an input terminal of the following stage inverter included in the voltage controlled oscillator. With the use of the on resistance of the transistor, the oscillation frequency of the clock signal is controlled. While supply of the power supply voltage is stopped, a signal that is input to the input terminal of the inverter just before supply of the power supply voltage is stopped is stored by turning off the transistor. This operation makes it possible to immediately output a clock signal that has the same frequency as that before supply of the power supply voltage is stopped at the time when the power supply voltage is supplied again.

18 Claims, 38 Drawing Sheets

Related U.S. Application Data division of application No. 15/298,305, filed on Oct. 20, 2016, now Pat. No. 10,038,402.

(51) Int. Cl.
*H01L 27/12* (2006.01)
*H03K 3/014* (2006.01)
*H01L 29/786* (2006.01)
*H03K 3/03* (2006.01)

(52) U.S. Cl.
CPC ...... *H01L 27/1225* (2013.01); *H01L 27/1255* (2013.01); *H01L 29/7869* (2013.01); *H03K 3/014* (2013.01); *H03K 3/0315* (2013.01)

(58) Field of Classification Search
CPC . H01L 51/5253; H01L 51/5256; H01L 51/56; H01L 2251/5369; H01L 27/3272; H03K 2/014; H03K 3/0315; H03K 3/014; H03B 5/06

See application file for complete search history.

(56) References Cited

U.S. PATENT DOCUMENTS

| | | | | |
|---|---|---|---|---|
| 5,894,236 | A * | 4/1999 | Mizoguchi | H03F 3/3001 327/108 |
| 6,756,962 | B1 * | 6/2004 | Akimoto | G09G 3/2011 345/98 |
| 9,209,795 | B2 | 12/2015 | Okamoto et al. | |
| 9,344,037 | B2 | 5/2016 | Okamoto et al. | |
| 9,397,637 | B2 | 7/2016 | Kozuma et al. | |
| 9,479,145 | B2 | 10/2016 | Okamoto et al. | |
| 9,843,308 | B2 | 12/2017 | Kozuma et al. | |
| 9,929,736 | B2 | 3/2018 | Okamoto et al. | |
| 10,177,170 | B2 | 1/2019 | Miyamoto et al. | |
| 10,438,973 | B2 | 10/2019 | Miyamoto et al. | |
| 2003/0047785 | A1 | 3/2003 | Kawasaki et al. | |
| 2004/0036526 | A1 * | 2/2004 | Lee | G06F 1/3203 327/544 |
| 2005/0258901 | A1 * | 11/2005 | Khorramabadi | H01L 27/08 330/254 |
| 2006/0017515 | A1 * | 1/2006 | Stanic | H03B 5/124 331/117 R |
| 2010/0085081 | A1 * | 4/2010 | Ofuji | H01L 27/1233 326/102 |
| 2010/0140612 | A1 | 6/2010 | Omura et al. | |
| 2011/0175646 | A1 | 7/2011 | Takemura et al. | |
| 2011/0254538 | A1 | 10/2011 | Kato et al. | |
| 2012/0032606 | A1 | 2/2012 | Fukumoto et al. | |
| 2012/0212995 | A1 | 8/2012 | Kurokawa | |
| 2012/0293200 | A1 | 11/2012 | Takemura | |
| 2013/0243149 | A1 | 9/2013 | Yamazaki | |
| 2014/0339549 | A1 | 11/2014 | Yamazaki et al. | |
| 2015/0256161 | A1 | 9/2015 | Okamoto et al. | |
| 2016/0126888 | A1 | 5/2016 | Okamoto et al. | |
| 2016/0254819 | A1 | 9/2016 | Okamoto et al. | |

FOREIGN PATENT DOCUMENTS

| | | | |
|---|---|---|---|
| JP | 07-074596 A | 3/1995 | |
| JP | 07-202646 A | 8/1995 | |
| JP | 09-083309 A | 3/1997 | |
| JP | 10-242811 A | 9/1998 | |
| JP | 3579980 | * 3/2004 | ............ H03K 3/354 |
| JP | 2014-240833 A | 12/2014 | |
| JP | 2015-181228 A | 10/2015 | |
| JP | 2016-054474 A | 4/2016 | |
| WO | WO-2012/176422 | 12/2012 | |
| WO | WO-2015/132696 | 9/2015 | |

OTHER PUBLICATIONS

Sekine.Y et al., "Success in Measurement the Lowest Off-State Current of Transistor in the World", ECS Transactions, 2011, vol. 37, No. 1, pp. 77-88.

Gao.X et al., "Jitter Analysis and a Benchmarking Figure-of-Merit for Phase-Locked Loops", IEEE Transactions on Circuits and Systems, Feb. 1, 2009, vol. 56, No. 2, pp. 117-121.

Anand.S et al., "A CMOS Clock Recovery Circuit for 2.5-Gb/s NRZ Data", IEEE Journal of Solid-State Circuits, Mar. 1, 2001, vol. 36, No. 3, pp. 432-439.

Zhai.C et al., "An N-path Filter Enhanced Low Phase Noise Ring VCO", 2014 Symposium on VLSI Circuits Digest of Technical Papers, Jun. 10, 2014, pp. 187-188.

Okamoto.Y et al., "CAAC-OS-based Nonvolatile Programmable Analog Device: Voltage Controlled Oscillator Realizing Instant Frequency Switching", SSDM 2014 (Extended Abstracts of the 2014 International Conference on Solid State Devices and Materials), Sep. 8, 2014, pp. 452-453.

* cited by examiner

SEMICONDUCTOR DEVICE AND ELECTRONIC DEVICE EACH HAVING OSCILLATOR

BACKGROUND OF THE INVENTION

1. Field of the Invention

One embodiment of the present invention relates to a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for operating any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

2. Description of the Related Art

A voltage controlled oscillator (VCO) is one of oscillator circuits and is capable of controlling the oscillation frequency of an output signal by signal voltage to be supplied. A ring oscillator VCO is known as an example and disclosed in Patent Document 1.

A voltage controlled oscillator is used in a phase-locked loop (PLL) or a DC-DC converter. A PLL is used, as a circuit for generating stable frequency signals, for a central processing unit (CPU), a programmable logic device, or the like.

REFERENCE

Patent Document

Patent Document 1 Japanese Published Patent Application No. H6-310994

SUMMARY OF THE INVENTION

A high-performance circuit such as a CPU is required to operate at high speed, and the power consumption thereof should be reduced. In order to reduce the power consumption, a control method in which in which power supply is stopped at the time of idling can be used, for example.

FIG. 9 illustrates an example of a ring oscillator voltage controlled oscillator. A signal transmission circuit (also referred to as a delay circuit) is formed using an inverter INV including a p-channel transistor M1 and an n-channel transistor M2 and an n-channel transistor M3 connected between the transistor M2 and a ground terminal. The oscillation frequency is controlled by changing the on resistance of the transistor M3 with Vbias.

In the above voltage controlled oscillator, the input potentials of the inverters are changed when power supply is stopped because the charges flow out through the transistors. Therefore, it takes time until the oscillation frequency is stabilized after the power is turned on again. That is, it is difficult for the voltage controlled oscillator illustrated in FIG. 9 to start up quickly.

In view of the above, an object of one embodiment of the present invention is to provide an oscillator capable of quick startup. Another object is to provide an oscillator that can oscillate at the same frequency as that before supply of power supply voltage is stopped as soon as supply of the power supply voltage, which is once stopped, is restarted. Another object is to provide an oscillator in which an input signal can be stored in each of input terminals of inverters. Another object is to provide an oscillator including a circuit that stores signals for controlling an oscillation frequency. Another object is to provide an oscillator that can be used in a wide temperature range. Another object is to provide a highly reliable oscillator. Another object is to provide a novel oscillator or the like. Another object is to provide an operation method of the oscillator. Another object is to provide a novel semiconductor device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to an oscillator capable of quick startup.

One embodiment of the present invention is a semiconductor device including a first transistor, a second transistor, a third transistor, a fourth transistor, and a capacitor. The first transistor has a polarity different from that of the second transistor. A gate of the first transistor is electrically connected to a gate of the second transistor. One of a source and a drain of the first transistor is electrically connected to one of a source and a drain of the second transistor. The one of the source and the drain of the first transistor is electrically connected to one of a source and a drain of the third transistor. A gate of the third transistor is electrically connected to one of a source and a drain of the fourth transistor. The gate of the third transistor is electrically connected to one electrode of the capacitor. The other electrode of the capacitor is electrically connected to the other of the source and the drain of the first transistor.

Another embodiment of the present invention is a semiconductor device including a first transistor, a second transistor, a third transistor, a fourth transistor, a fifth transistor, and a capacitor. The first transistor has a polarity different from that of the second transistor. The fifth transistor has the same polarity as the second transistor. A gate of the first transistor is electrically connected to a gate of the second transistor. One of a source and a drain of the first transistor is electrically connected to one of a source and a drain of the second transistor. The one of the source and the drain of the first transistor is electrically connected to one of a source and a drain of the fifth transistor. A gate of the fifth transistor is electrically connected to the other of the source and the drain of the first transistor. The other of the source and the drain of the fifth transistor is electrically connected to one of a source and a drain of the third transistor. A gate of the third transistor is electrically connected to one of a source and a drain of the fourth transistor. The gate of the third transistor is electrically connected to one electrode of the capacitor.

The other electrode of the capacitor is electrically connected to the other of the source and the drain of the second transistor.

In the semiconductor device of any of the above two embodiments, the other of the source and the drain of the first transistor can be electrically connected to a high potential power supply line, and the other of the source and the drain of the second transistor can be electrically connected to a low potential power supply line.

Among the transistors used in the semiconductor device of any of the above two embodiments, the third transistor, the fourth transistor, and the fifth transistor preferably include an oxide semiconductor in their channel formation regions.

The oxide semiconductor preferably contains In, Zn, and M (M is Al, Ga, Y, or Sn). The second transistor may include an oxide semiconductor in its channel formation region.

According to one embodiment of the present invention, an oscillator capable of quick startup can be provided. An oscillator that can oscillate at the same frequency as that before supply of power supply voltage is stopped as soon as supply of the power supply voltage, which is once stopped, is restarted can be provided. An oscillator in which an input signal can be stored in an input terminal of an inverter can be provided. An oscillator including a circuit that stores signals for controlling an oscillation frequency can be provided. An oscillator that can be used in a wide temperature range can be provided. A highly reliable oscillator can be provided. A novel oscillator or the like can be provided. An operation method of the oscillator can be provided. A novel semiconductor device or the like can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce the above effects.

DETAILED DESCRIPTION OF THE INVENTION

Figure 1:
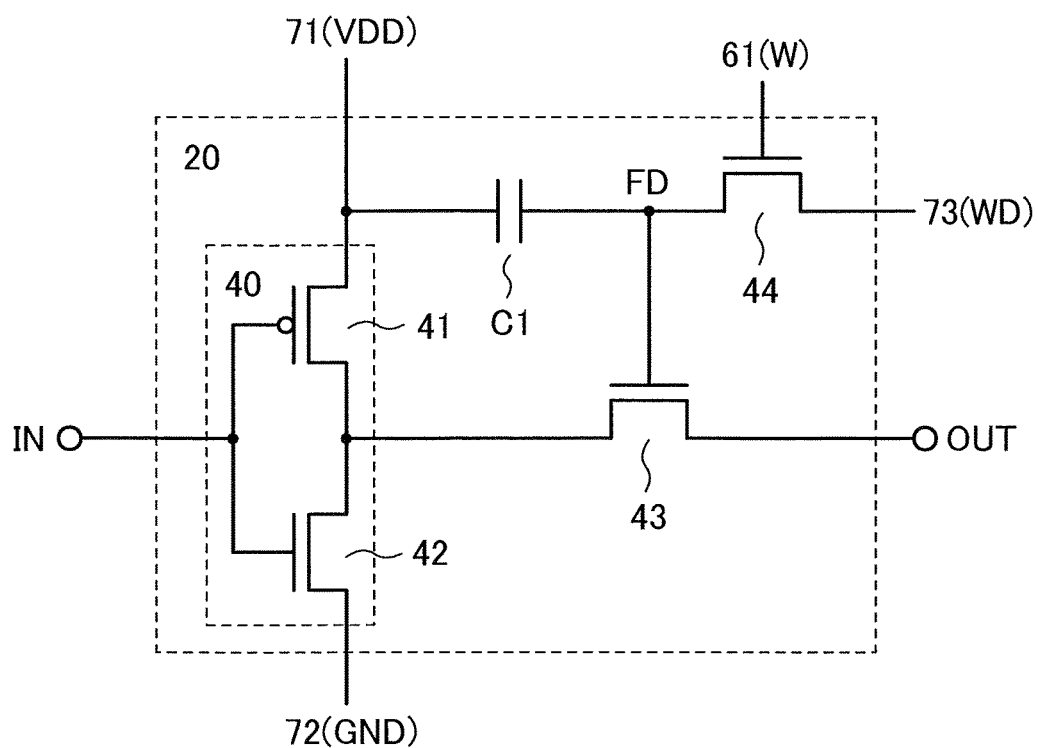
FIG. 1 is a circuit diagram illustrating a signal transmission circuit.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments. In structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Note that ordinal numbers such as "first" and "second" are used for convenience and do not denote the order of steps or the stacking order of layers. Therefore, for example, the term "first" can be replaced with the term "second," "third," or the like as appropriate. In addition, the ordinal numbers in this specification and the like do not correspond to the ordinal numbers which specify one embodiment of the present invention in some cases.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, each of X and Y denotes an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y (e.g., a switch, a transistor, a capacitor, an inductor, a resistor, a diode, a display element, a light-emitting element, or a load) provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to turn on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generator circuit; a storage circuit; or a control circuit) can be connected between X and Y. Note that for example, in the case where a signal output from X is transmitted to Y even when another circuit is provided between X and Y, X and Y are functionally connected. The case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the explicit description "X and Y are connected."

For example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are connected in that order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path." Still another example of the expressions is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, the term "electrical connection" in this specification also means such a case where one conductive film has functions of a plurality of components.

Note that the terms "film" and "layer" can be interchanged with each other depending on circumstances or conditions. For example, the term "conductive layer" can be changed into the term "conductive film" in some cases. In addition, the term "insulating film" can be changed into the term "insulating layer" in some cases.

Note that in general, a potential (voltage) is relative and is determined depending on the amount relative to a certain potential. Therefore, even when the expression "ground," "GND," or the like is used, the potential is not necessarily 0 V. For example, the "ground potential" or "GND" might be defined using the lowest potential in a circuit as a reference. Alternatively, the "ground potential" or "GND" might be defined using an intermediate potential in a circuit as a reference. In those cases, a positive potential and a negative potential are set using the potential as a reference.

Embodiment 1

In this embodiment, an oscillator of one embodiment of the present invention will be described with reference to drawings.

One embodiment of the present invention is a circuit configuration and an operation method of a voltage controlled oscillator that can oscillate at the same frequency as that just before supply of power supply voltage is stopped, as soon as supply of the power supply voltage, which is once stopped during oscillating, is restarted.

The use of one embodiment of the present invention makes it possible to start oscillating immediately after supply of power supply voltage is restarted in the case where supply of power supply voltage to the voltage controlled oscillator in CPUs and the like is temporarily stopped and the voltage controlled oscillator stops oscillating. Therefore, a circuit that operates in synchronism with output signals only at a certain oscillation frequency can be started up quickly.

In one embodiment of the present invention, a transistor is provided between an output terminal of a certain stage inverter and an input terminal of the following stage inverter included in the voltage controlled oscillator. With the use of the on resistance of the transistor, the oscillation frequency of the output signal is controlled. While supply of the power supply voltage is stopped, a signal that is input to the input terminal of the inverter just before supply of the power supply voltage is stopped is stored by turning off the transistor. At the time when the power supply voltage is supplied again, this operation makes it possible to immediately output a signal that has the same frequency as that before supply of the power supply voltage is stopped.

For the above transistor, a transistor including an oxide semiconductor in its channel formation region can be used. Such a transistor has a low off-state current, and can easily form a memory that stores a signal input just before supply of the power supply voltage is stopped.

The transistor including an oxide semiconductor in its channel formation region has lower temperature dependence of change in electrical characteristics than a transistor including silicon in its active region or its active layer, and thus can be used in an extremely wide range of temperatures. Therefore, an oscillator and a semiconductor device which include transistors each including an oxide semiconductor in its channel formation region are suitable also for use in automobiles, aircrafts, spacecrafts, and the like.

FIG. 1 is a circuit diagram of a circuit 20 included in an oscillator of one embodiment of the present invention. The circuit 20 includes a transistor 41, a transistor 42, a transistor 43, a transistor 44, and a capacitor C1. Here, an inverter 40 is formed using the transistor 41 and the transistor 42.

In the circuit 20 illustrated in FIG. 1, a gate of the transistor 41 is electrically connected to a gate of the transistor 42. One of a source and a drain of the transistor 41 is electrically connected to one of a source and a drain of the transistor 42. The one of the source and the drain of the transistor 41 is electrically connected to one of a source and a drain of the transistor 43. A gate of the transistor 43 is electrically connected to one of a source and a drain of the transistor 44. The gate of the transistor 43 is electrically connected to one electrode of the capacitor C1. The other electrode of the capacitor C1 is electrically connected to the other of the source and the drain of the transistor 41.

Note that FIG. 1 illustrates an example where the inverter 40 is formed using a CMOS circuit in which the transistor 41 is a p-channel transistor and the transistor 42 is an n-channel transistor; however, one embodiment of the present invention is not limited thereto. The inverter 40 may be an NMOS inverter or a PMOS inverter. In addition, although the example where the transistor 44 is an n-channel transistor is illustrated, the transistor 44 may alternatively be a p-channel transistor.

A wiring to which the gate of the transistor 43, the one electrode of the capacitor C1, and the one of the source and the drain of the transistor 44 are connected is referred to as a node FD here. A wiring to which the gate of the transistor 41 and the gate of the transistor 42 are electrically connected functions as an input terminal IN of the circuit 20. A wiring to which the other of the source and the drain of the transistor 43 is electrically connected functions as an output terminal OUT of the circuit 20.

In FIG. 1, the other of the source and the drain of the transistor 41 is electrically connected to a wiring 71. The other of the source and the drain of the transistor 42 is electrically connected to a wiring 72 (GND). The other of the source and the drain of the transistor 44 is electrically connected to a wiring 73 (WD). A gate of the transistor 44 is electrically connected to a wiring 61 (W).

The wiring 71 (VDD) and the wiring 72 (GND) can function as power supply lines. The wiring 71 (VDD) can function as a high potential power supply line and supplies power supply voltage VDD, for example. The wiring 72 (GND) can function as a low potential power supply line and supplies 0 V or a ground potential GND, for example. When supply of the power supply voltage is stopped, the wiring 71 (VDD) supplies 0 V or a ground potential GND, for example.

The wiring 61 (W) can function as a signal line for controlling the on/off states of the transistor 44. The wiring 73 (WD) can function as a signal line for supplying a desired potential to the node FD.

Figure 2A:
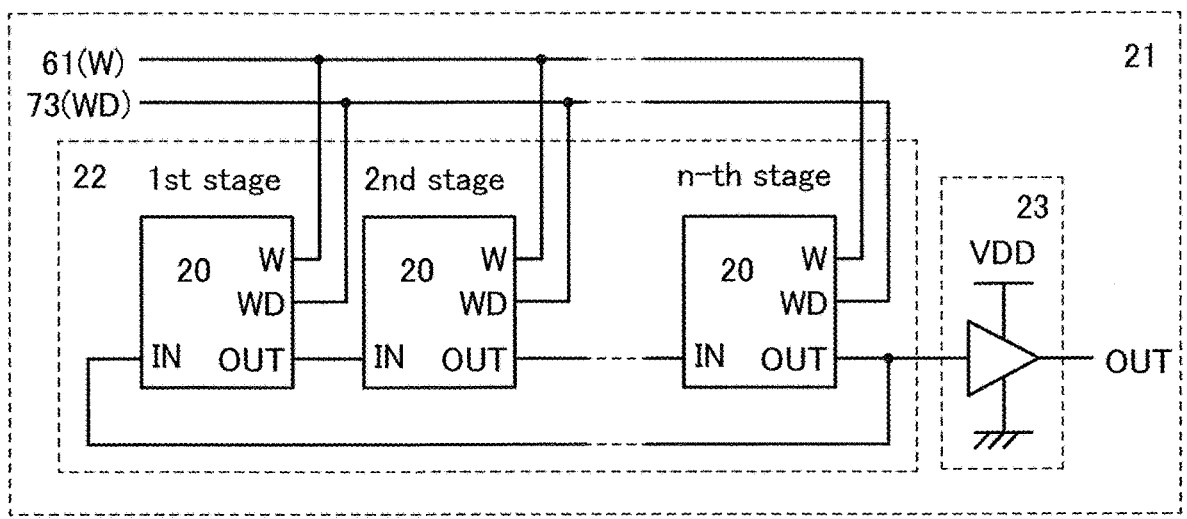
FIGS. 2A and 2B are block diagrams illustrating a voltage controlled oscillator and a PLL.

The circuit 20 can function as a signal transmission circuit of a ring oscillator. FIG. 2A is a circuit diagram of a voltage controlled oscillator 21 of one embodiment of the present invention, which is provided with a ring oscillator 22 including n-stage circuits 20 (n is an odd number) and a buffer circuit 23. An output terminal OUT of a certain stage circuit 20 is electrically connected to an input terminal IN of the following stage circuit 20. An output terminal OUT of the last stage circuit 20 is electrically connected to an input terminal IN of the first stage circuit 20 and to an input terminal of the buffer circuit 23.

The circuit 20 has a function of outputting an inversion signal of an input signal. The ring oscillator 22 is formed by connecting odd numbers of the circuits 20 and can output an output signal having a particular oscillation frequency. The buffer circuit 23 has a function of amplifying current at the time when the output signal from the ring oscillator 22 is output to the outside. Note that a structure without the buffer circuit 23 may also be employed.

Figure 2B:
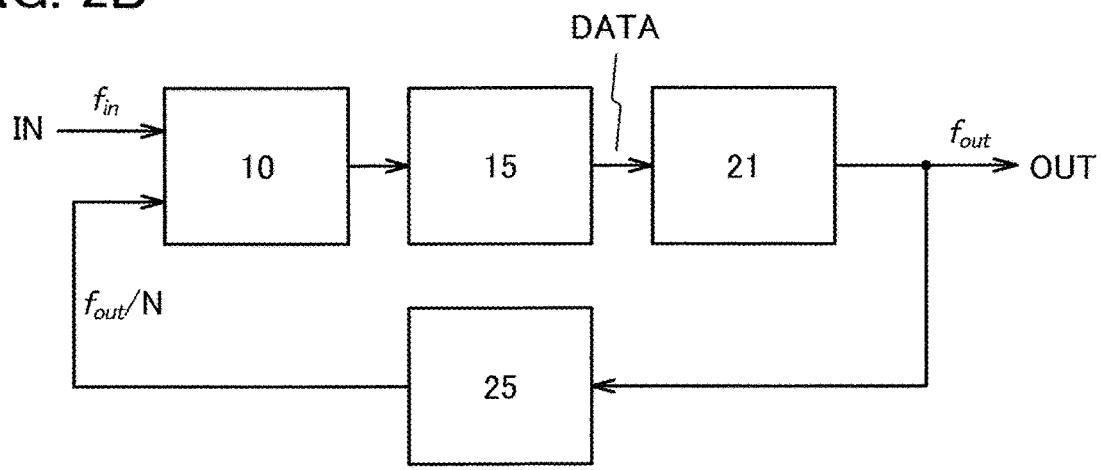

FIG. 2B is a structure example of a PLL which can be provided with the voltage controlled oscillator 21 of one embodiment of the present invention. The PLL includes a phase comparator 10, a loop filter 15, the voltage controlled oscillator 21, and a frequency divider 25. The phase comparator 10 has a function of detecting a phase difference between two input signals and outputs a phase difference between signals with a fundamental frequency fin and with a comparison frequency $f_{out}/N$ as a voltage signal. The loop filter 15 has a function of generating a direct-current voltage signal DATA which is to be input to the voltage controlled oscillator 21. As the loop filter 15, a low path filter or the like is used because a high-frequency component included in an output signal from the phase comparator 10 needs to be removed. The voltage controlled oscillator 21 has a function of outputting an output signal with a particular oscillation frequency depending on DATA. The frequency divider 25 has a function of generating a signal which is 1/N (N is an integer) times the output signal with the particular oscillation frequency that is output from the voltage controlled oscillator 21.

Operation of the circuit 20 illustrated in FIG. 1 and operation of the voltage controlled oscillator 21 illustrated in FIG. 2A including the circuit 20 will be described. The transistor 44 is turned on first, whereby analog data corresponding to the potential of the wiring 73 (WD) is written to the node FD. After that, the transistor 44 is turned off, and the analog data is stored in the node FD.

Whether the transistor 43 is conductive or non-conductive is controlled in accordance with the analog data stored in the node FD. When the transistor 43 is conductive, the circuit 20 outputs an inversion signal of an input signal. That is, the voltage controlled oscillator 21 oscillates. On the other hand, when the transistor 43 is non-conductive, a signal transmission path of the circuit 20 is blocked. That is, the voltage controlled oscillator 21 does not oscillate.

On-state current of the transistor 43 is controlled in accordance with the analog data stored in the node FD. When a relatively high analog potential is applied to the node FD, the on resistance of the transistor 43 is low. That is, the oscillation frequency of an output signal from the voltage controlled oscillator 21 increases. On the other hand, when a relatively low analog potential is applied to the node FD, the on resistance of the transistor 43 is high. That is, the oscillation frequency of an output signal from the voltage controlled oscillator 21 decreases. In other words, the oscillation frequency of the voltage controlled oscillator 21 can be controlled in accordance with the analog potential stored in the node FD of the circuit 20.

For each of the transistor 43 and the transistor 44, it is preferable to use a transistor with a significantly low off-state current that includes an oxide semiconductor in its channel formation region.

With the use of this transistor, the potential of the node FD is stored for a long time when the transistor 44 is off. In addition, when the transistor 43 is off, the potential of the output terminal OUT of the circuit 20 (the potential of the input terminal IN of the following stage circuit 20 in the ring oscillator 22) is stored for a long time.

Accordingly, the oscillation is stopped by setting the potential of the node FD at "L" level when the voltage controlled oscillator 21 is oscillating, whereby the voltage just before the oscillation is stopped is stored in the input terminal IN and the output terminal OUT of each of the circuits 20. For example, a "H" level potential is stored in the output terminal OUT of the first stage circuit 20 (the input terminal IN of the second stage circuit 20), and a "L" level potential is stored in the output terminal OUT of the second stage circuit 20 (the input terminal IN of the third stage circuit 20). Therefore, the voltage controlled oscillator 21 can immediately start oscillating in accordance with the voltage stored in the input terminal IN and the output terminal OUT of each of the circuits 20 by setting the potential of the node FD at "H" level again, even when the potential of the node FD is set at "L" level and the oscillation is stopped for a long time.

In order to stop the oscillation of the voltage controlled oscillator 21, it is effective to stop supply of the power supply voltage VDD ("H" level) from the wiring 71 (VDD). Specifically, the voltage level of the wiring 71 (VDD) is changed from "H" level to "L" level (e.g., 0 V or a GND potential). At this time, the inverter 40 does not word, whereby the circuit 20 becomes unable to transmit a signal. That is, the voltage controlled oscillator 21 stops oscillating.

Furthermore, the voltage level of the wiring 71 (VDD) is changed from "H" level to "L" level, whereby capacitive coupling occurs through the capacitor C1, and the potential of the node FD is reduced to "L" level. That is, the transistor 43 is turned off. In other words, the transistor 43 can be turned off at the same time when supply of the power supply voltage VDD is stopped. In addition, at the same time when the transistor 43 is turned off, the voltage just before the voltage controlled oscillator 21 stops oscillating is stored in the input terminal IN and the output terminal OUT of each of the circuits 20.

When the power supply voltage VDD is supplied again to the wiring 71 (VDD), the voltage level of the wiring 71 (VDD) is changed from "L" level to "H" level, whereby capacitive coupling occurs through the capacitor C1. The potential of the node FD increases to "H" level. Accordingly, the transistor 43 is turned on and the voltage controlled oscillator 21 restarts oscillating immediately.

In order that the voltage controlled oscillator 21 stops oscillating, operation in which the wiring 73 (WD) is set at "L" level, the transistor 44 is turned on, and the node FD is set at "L" level may be performed. In this case, in order to oscillate the voltage controlled oscillator 21, operation may be performed as follows: the voltage level of the wiring 71 (VDD) is not changed, the wiring 73 (WD) is set at "H" level, the transistor 44 is turned on, and the node FD is set at "H" level.

Figure 4A:
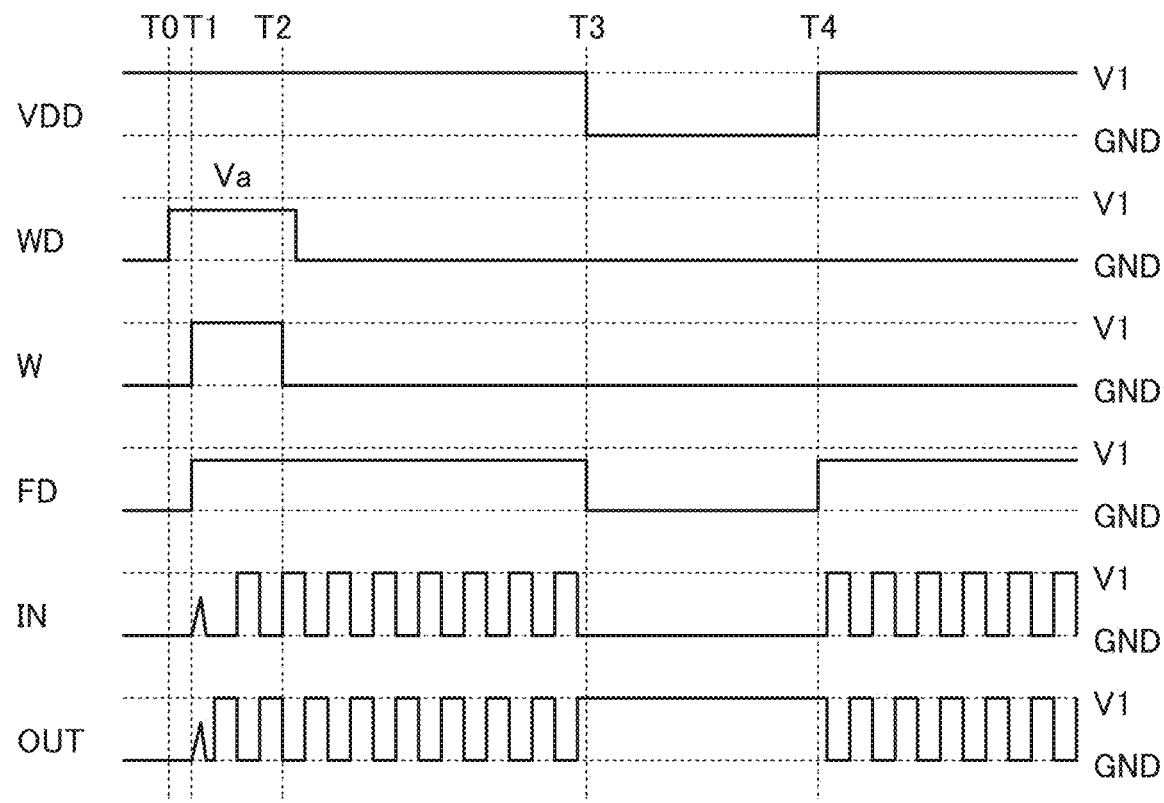
FIGS. 4A and 4B are timing charts each illustrating operation of a voltage controlled oscillator.

FIG. 4A is a timing chart illustrating one example of driving methods when the circuit 20 in FIG. 1 is used for the voltage controlled oscillator 21 in FIG. 2A. VDD is the potential of the wiring 71 (VDD), WD is the potential of the wiring 73 (WD), W is the potential of the wiring 61 (W), FD is the potential of the node FD, IN is the potential of an input terminal IN of a particular circuit 20, and OUT is the potential of the output terminal OUT of the particular circuit 20. A voltage by which positive logic is given is V1 ("H" level), and a voltage by which negative logic is given is GND ("L" level).

At time T0, a "H" level potential (a power supply voltage VDD) is applied to the wiring 71 (VDD) and an analog potential Va is applied to the wiring 73 (WD). Note that Va is higher than or equal to the threshold voltage (Vth) of the transistor 43.

At time T1, a "H" level potential is applied to the wiring 61 (W), whereby the transistor 44 is turned on, and then the potential of the node FD is set to Va. Accordingly, the transistor 43 is turned on, whereby the voltage controlled oscillator 21 starts oscillating. Note that at the first time of the operation, the potential of the input terminal IN of the circuit 20 is not determined, so that the operation is unstable and irregular signals are output at the beginning of the oscillation.

At time T2, a "L" level potential is applied to the wiring 61 (W), whereby the transistor 44 is turned off and the analog potential Va is stored in the node FD. After that, a "L" level potential is applied to the wiring 73 (WD).

At time T3, a "L" level potential is applied to the wiring 71 (VDD), whereby the inverter 40 becomes non-operational and the potential of the node FD decreases to "L" level due to capacitive coupling through the capacitor C1. Consequently, the transistor 43 is turned off. The transistor 43 is non-conductive, whereby the potential of the input terminal IN and the potential of the output terminal OUT of each of the circuits 20 are stored. It is supposed that, in the particular circuit 20, the "L" level potential is stored in the input terminal IN and the "H" level potential is stored in the output terminal OUT.

At time T4, a "H" level potential is applied to the wiring 71 (VDD), whereby the inverter 40 becomes operational and the potential of the node FD increases to Va due to capacitive coupling through the capacitor C1. Consequently, the transistor 43 is turned on. The transistor 43 is conductive, whereby each of the circuits 20 outputs an output signal in response to the stored input signal. That is, the voltage controlled oscillator 21 can oscillate as soon as the power supply voltage VDD is supplied again to the wiring 71 (VDD).

Figure 3A:
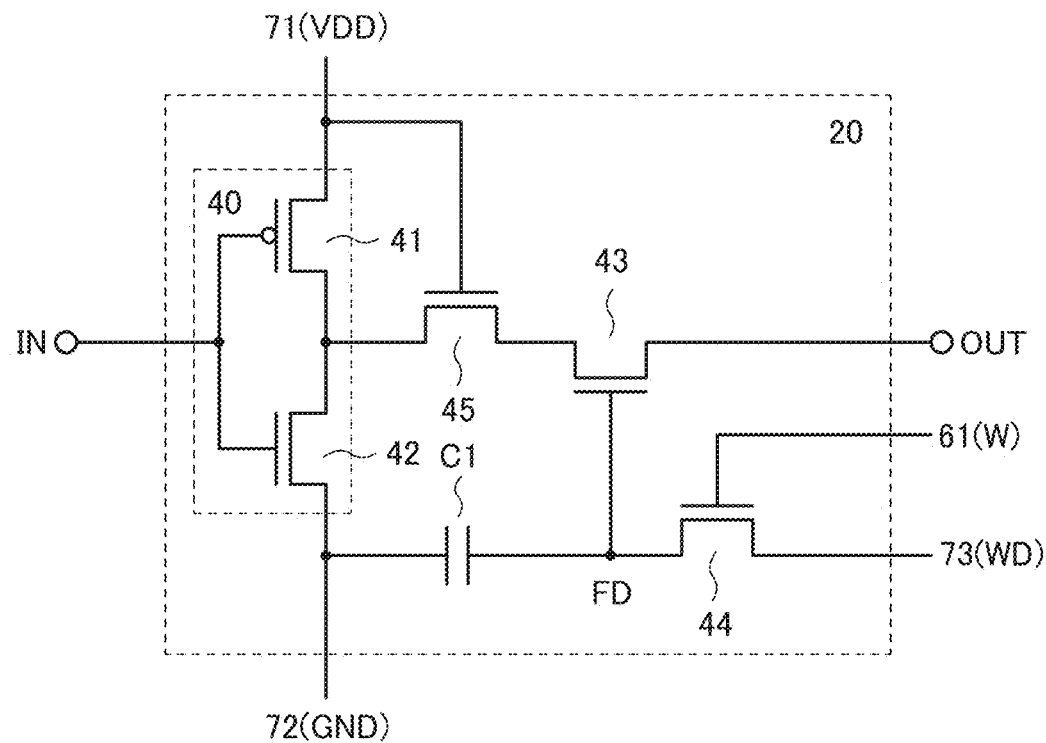
FIGS. 3A and 3B are circuit diagrams each illustrating a signal transmission circuit.

The circuit 20 may have a structure illustrated in FIG. 3A. The circuit 20 illustrated in FIG. 3A includes the transistor 41, the transistor 42, the transistor 43, the transistor 44, a transistor 45, and the capacitor C1.

In the circuit 20 in FIG. 3A, the gate of the transistor 41 is electrically connected to the gate of the transistor 42. One of the source and the drain of the transistor 41 is electrically connected to one of the source and the drain of the transistor 42. The one of the source and the drain of the transistor 41 is electrically connected to one of a source and a drain of the transistor 45. A gate of the transistor 45 is electrically connected to the other of the source and the drain of the transistor 41. The other of the source and the drain of the transistor 45 is electrically connected to one of the source and the drain of the transistor 43. The gate of the transistor 43 is electrically connected to one of the source and the drain of the transistor 44. The gate of the transistor 43 is electrically connected to one electrode of the capacitor C1. The other electrode of the capacitor C1 is electrically connected to the other of the source and the drain of the transistor 42.

The circuit 20 illustrated in FIG. 3A is different from the circuit 20 illustrate in FIG. 1 in that the transistor 45 is provided, the gate of the transistor 45 is electrically connected to the other of the source and the drain of the transistor 41, and the other electrode of the capacitor C1 is electrically connected to the other of the source and the drain of the transistor 42. Note that, as illustrated in FIG. 3B, the structure in which one of the source and the drain of the transistor 43 is electrically connected to the one of the source and the drain of the transistor 41 and the other of the source and the drain of the transistor 43 is electrically connected to the one of the source and the drain of the transistor 45 may be used.

For the transistor 45, it is preferable to use a transistor with a significantly low off-state current that includes an oxide semiconductor in its channel formation region. With the use of this transistor, the potential of the output terminal OUT of the circuit 20 (the potential of the input terminal IN of the following circuit 20 in the ring oscillator 22) is stored for a long time when the transistor 45 is off.

Figure 3B:
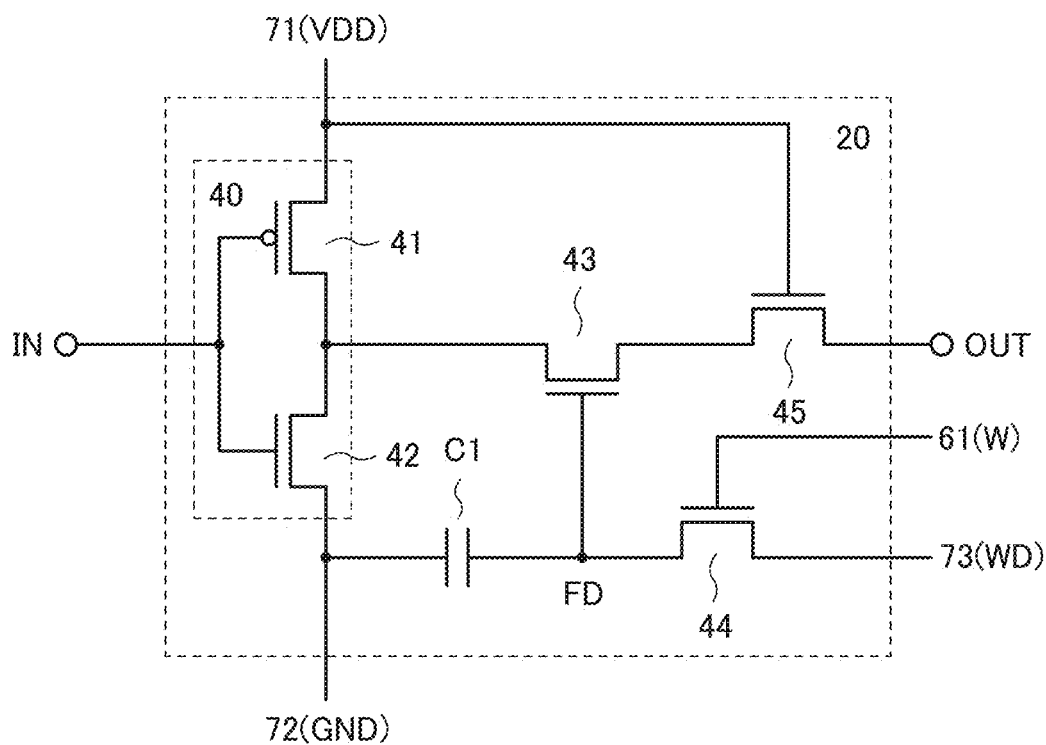

In the circuits 20 illustrated in FIGS. 3A and 3B, the transistor 45 is provided between an output side of the inverter 40 and the output terminal OUT of the circuit 20, and the gate of the transistor 45 is electrically connected to the wiring 71 (VDD). Thus, the power supply voltage VDD is applied to the wiring 71 (VDD), whereby the inverter 40 becomes operational and the transistor 45 is turned on. The circuit 20 outputs an inversion signal of an input signal. That is, the voltage controlled oscillator 21 oscillates. When supply of the power supply voltage VDD is stopped, the inverter 40 becomes non-operational and the transistor 45 is turned off. A signal transmission path of the circuit 20 is blocked. That is, the voltage controlled oscillator 21 does not oscillate.

If supply of the power supply voltage VDD is stopped at the time when the voltage controlled oscillator 21 is oscillating, the voltage level of the wiring 71 (VDD) is changed from "H" level to "L" level. Therefore, the transistor 45 is turned off, and the voltage just before the voltage controlled oscillator 21 stops oscillating is stored in the input terminal IN and the output terminal OUT of each of the circuits 20.

When the power supply voltage VDD is applied again to the wiring 71 (VDD), the voltage level of the wiring 71 (VDD) is changed from "L" level to "H" level, whereby the transistor 45 is turned on and the voltage controlled oscillator 21 restarts oscillating immediately.

Figure 4B:
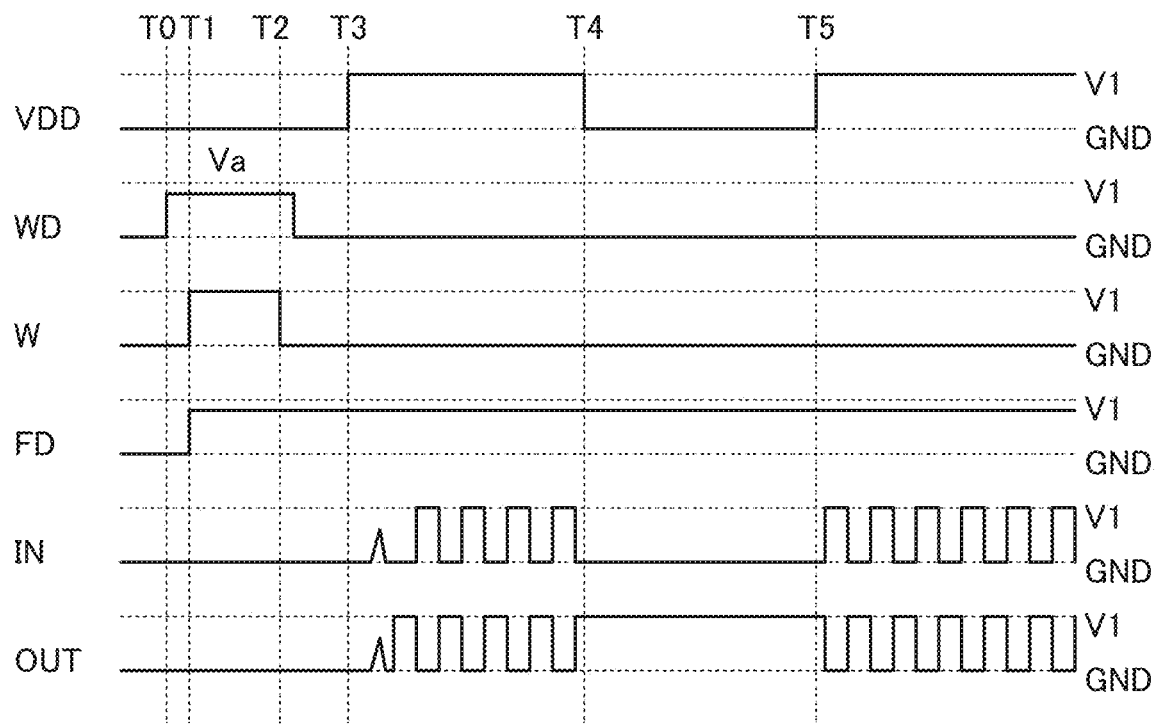

FIG. 4B is a timing chart illustrating one example of driving methods when the circuit 20 in FIG. 3A or 3B is used for the voltage controlled oscillator 21 in FIG. 2A.

At time T0, an analog potential Va is applied to the wiring 73 (WD). Note that Va is higher than or equal to the threshold voltage (Vth) of the transistor 43.

At time T1, a "H" level potential is applied to the wiring 61 (W), whereby the transistor 44 is turned on and the potential of the node FD is set to Va.

At time T2, a "L" level potential is applied to the wiring 61 (W), whereby the transistor 44 is turned off and the analog potential Va is stored in the node FD. After that, the "L" level potential is applied to the wiring 73 (WD).

At time T3, a "H" level potential (a power supply voltage VDD) is applied to the wiring 71 (VDD), whereby the transistor 45 is turned on, and then the voltage controlled oscillator 21 starts oscillating. Note that at the first time of the operation, the potential of the input terminal IN of the circuit 20 is not determined, so that the operation is unstable and irregular signals are output at the beginning of the oscillation.

At time T4, a "L" level potential is applied to the wiring 71 (VDD), whereby the transistor 45 is turned off. The transistor 45 is non-conductive, whereby the potential of the input terminal IN and the potential of the output terminal OUT of each of the circuits 20 are stored.

At time T5, a "H" level potential is applied to the wiring 71 (VDD), whereby the transistor 45 is turned on. The transistor 45 is conductive, whereby each of the circuits 20 outputs an output signal in response to the stored input signal. That is, the voltage controlled oscillator 21 can oscillate as soon as the power supply voltage VDD is supplied again to the wiring 71 (VDD).

The above circuits 20 (in FIG. 1, and FIGS. 3A and 3B) are capable of outputting output signals having different oscillation frequencies by rewriting the potential of the node FD. However, a circuit having a multi-context function may be used for a signal transmission circuit of the voltage controlled oscillator 21.

The use of a signal transmission circuit having a multi-context function makes it easy to switch the oscillation frequencies. Context means a circuit configuration for controlling the oscillation of the voltage controlled oscillator, here. The voltage controlled oscillator 21 oscillates at a particular oscillation frequency in accordance with an analog potential stored in a selected context.

Figure 5A:
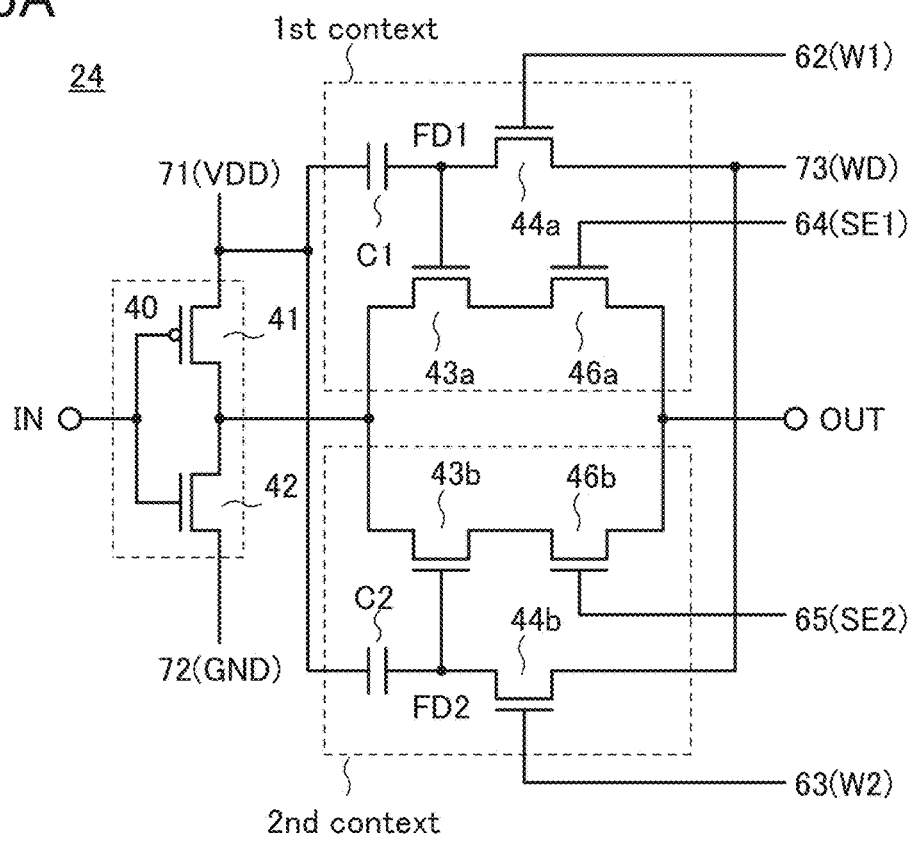
FIGS. 5A and 5B are circuit diagrams each illustrating a signal transmission circuit.

FIG. 5A is a circuit diagram of the circuit 24 that includes two context functions. The circuit 24 includes the transistor 41, the transistor 42, a transistor 43a, a transistor 43b, a transistor 44a, a transistor 44b, a transistor 46a, a transistor 46b, the capacitor C1, and a capacitor C2. The inverter 40 is formed using the transistor 41 and the transistor 42, here. A first context is formed of the transistor 43a, the transistor 44a, the transistor 46a, and the capacitor C1. A second context is formed of the transistor 43b, the transistor 44b, the transistor 46b, and the capacitor C2.

In the circuit 24 illustrated in FIG. 5A, the gate of the transistor 41 is electrically connected to the gate of the transistor 42. One of the source and the drain of the transistor 41 is electrically connected to one of the source and the drain of the transistor 42. The one of the source and the drain of the transistor 41 is electrically connected to one of a source and a drain of the transistor 43a. A gate of the transistor 43a is electrically connected to one of a source and a drain of the transistor 44a. The other of the source and the drain of the transistor 43a is electrically connected to one of a source and a drain of the transistor 46a. The gate of the transistor 43a is electrically connected to one electrode of the capacitor C1. The other electrode of the capacitor C1 is electrically connected to the other of the source and the drain of the transistor 41. The one of the source and the drain of the transistor 41 is electrically connected to one of a source and a drain of a transistor 43b. A gate of the transistor 43b is electrically connected to one of a source and a drain of the transistor 44b. The other of the source and the drain of the transistor 43b is electrically connected to one of a source and a drain of a transistor 46b. The gate of the transistor 43b is electrically connected to one electrode of the capacitor C2. The other electrode of the capacitor C2 is electrically connected to the other of the source and the drain of the transistor 41. The other of the source and the drain of the transistor 46a is electrically connected to the other of the source and the drain of the transistor 46b.

Figure 5B:
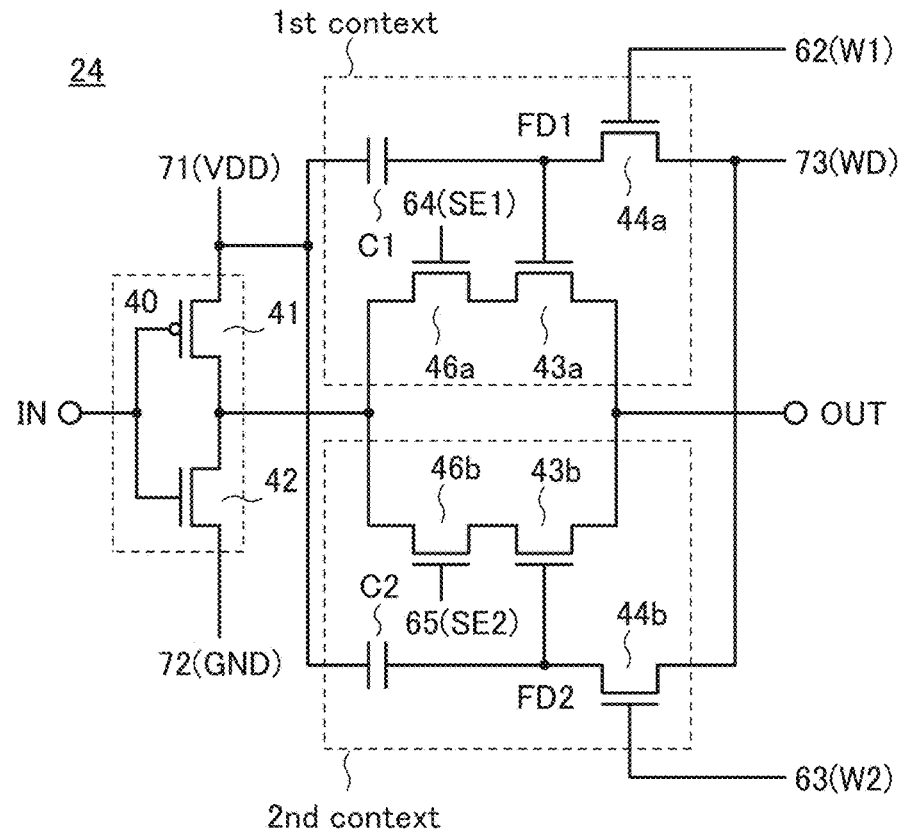

Note that the transistor 46a may be provided between an output side of the inverter 40 and the transistor 43a, and the transistor 46b may be provided between an output side of the inverter 40 and the transistor 43b, as illustrated in FIG. 5B. In this case, the other of the source and the drain of the transistor 43a is electrically connected to the other of the source and the drain of the transistor 43b.

A wiring to which the gate of the transistor 43a, the one electrode of the capacitor C1, and the one of the source and the drain of the transistor 44a are connected is referred to as a node FD1, here. A wiring to which the gate of the transistor 43b, the one electrode of the capacitor C2, and the one of the source and the drain of the transistor 44b are connected is referred to as a node FD2. A wiring to which the gate of the transistor 41 and the gate of the transistor 42 are electrically connected functions as an input terminal IN of the circuit 24. In FIG. 5A, a wiring to which the other of the source and the drain of the transistor 46a and the other of the source and the drain of the transistor 46b are electrically connected functions as an output terminal OUT of the circuit 24. In FIG. 5B, a wiring to which the other of the source and the drain of the transistor 43a and the other of the source and the drain of the transistor 43b are electrically connected functions as an output terminal OUT of the circuit 24.

In FIGS. 5A and 5B, the other of the source and the drain of the transistor 41 is electrically connected to the wiring 71 (VDD). The other of the source and the drain of the transistor 42 is electrically connected to the wiring 72 (GND). The other of the source and the drain of the transistor 44a is electrically connected to the wiring 73 (WD). A gate of the transistor 44a is electrically connected to a wiring 62 (W1). A gate of the transistor 46a is electrically connected to a wiring 64 (SE1). The other of the source and the drain of the transistor 44b is electrically connected to the wiring 73 (WD). A gate of the transistor 44b is electrically connected to a wiring 63 (W2). A gate of the transistor 46b is electrically connected to a wiring 65 (SE2).

The wiring 62 (W1) can function as a signal line for controlling the on/off states of the transistor 44a. The wiring 63 (W2) can function as a signal line for controlling the on/off states of the transistor 44b. The wiring 64 (SE1) can function as a signal line for controlling the on/off states of the transistor 46a. The wiring 65 (SE2) can function as a signal line for controlling the on/off states of the transistor 46b. The wiring 73 (WD) can function as a signal line for supplying a desired potential to the node FD1 or the node FD2.

Figure 7:
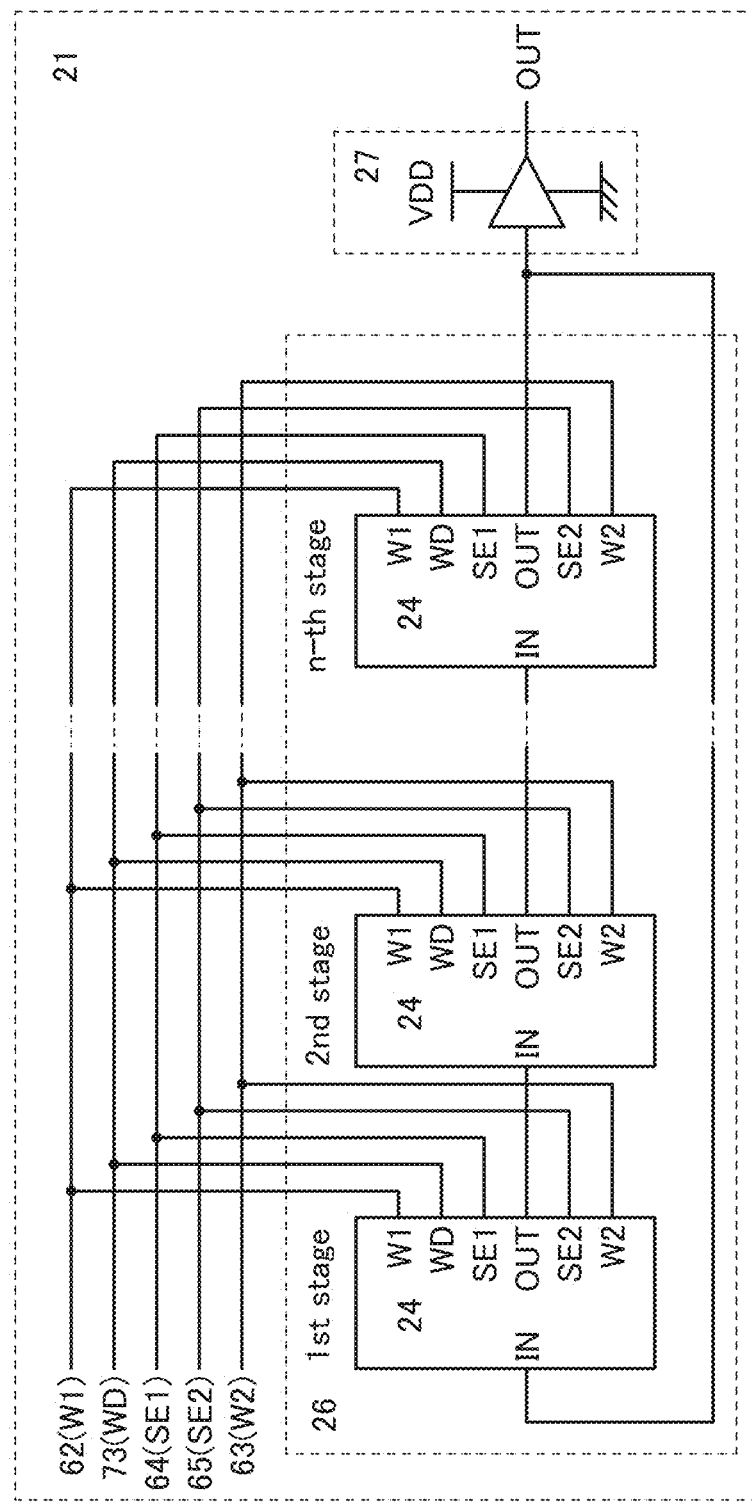
FIG. 7 is a block diagram illustrating a voltage controlled oscillator.

FIG. 7 illustrates the voltage controlled oscillator 21 which can include the circuit 24 and is provided with a ring oscillator 26 including n-stage circuits 24 (n is an odd number) and a buffer circuit 27. An output terminal OUT of a certain stage circuit 24 is electrically connected to an input terminal IN of the following stage circuit 24. An output terminal OUT of the last stage circuit 24 is electrically connected to an input terminal IN of the first stage circuit 24 and to an input terminal of the buffer circuit 27. Note that a structure without the buffer circuit 27 may be employed.

Operation of the circuits 24 illustrated in FIGS. 5A and 5B and operation of the voltage controlled oscillator 21 illustrated in FIG. 7 including the circuit 24 will be described. The transistor 44a is turned on first, and a potential Vb of the wiring 73 (WD) is written in the node FD1. After that, the transistor 44a is turned off, whereby the analog potential Vb is stored in the node FD1. After the potential of the wiring 73 (WD) is changed to Vc, the transistor 44b is turned on, and a potential Vc of the wiring 73 (WD) is written in the node FD2. After that, the transistor 44b is turned off, whereby the analog potential Vc is stored in the node FD2.

Whether the transistor 43a is conductive or non-conductive is controlled in accordance with the analog data stored in the node FD1. Whether the transistor 43b is conductive or non-conductive is controlled in accordance with the analog data stored in the node FD2.

On-state current of the transistor 43a is controlled in accordance with the analog data stored in the node FD1. On-state current of the transistor 43b is controlled in accordance with the analog data stored in the node FD2. In the first context, the on resistance of the transistor 43a is low when a relatively high analog potential is applied to the node FD1. That is, the oscillation frequency of an output signal from the voltage controlled oscillator 21 increases. On the other hand, when a relatively low analog potential is applied to the node FD1, the on resistance of the transistor 43a is high. That is, the oscillation frequency of an output signal from the voltage controlled oscillator 21 decreases. Also in the second context, the oscillation frequency of an output signal from the voltage controlled oscillator 21 changes depending on the potential of the node FD2.

In the first context, whether the transistor 46a is conductive or non-conductive is controlled in accordance with a signal input from the wiring 64 (SE1). When the potential of the wiring 64 (SE1) is at "H" level, the transistor 46a is turned on. Accordingly, when the transistor 43a is on in accordance with the potential Vb of the node FD1 and the transistor 46a is conductive, the circuit 24 outputs an inversion signal of an input signal. That is, the voltage controlled oscillator 21 oscillates at the first oscillation frequency. On the other hand, when the transistor 46a is non-conductive, a signal transmission path of the circuit 24 is blocked. That is, the voltage controlled oscillator 21 does not oscillate.

In the second context, whether the transistor 46b is conductive or non-conductive is controlled in accordance with a signal input from the wiring 65 (SE2). When the potential of the wiring 65 (SE2) is at "H" level, the transistor 46b is turned on. Accordingly, when the transistor 43b is on in accordance with the potential Vc of the node FD2 and the transistor 46b is conductive, the circuit 24 outputs an inversion signal of an input signal. That is, the voltage controlled oscillator 21 oscillates at the second oscillation frequency. On the other hand, when the transistor 46b is non-conductive, a signal transmission path of the circuit 24 is blocked. That is, the voltage controlled oscillator 21 does not oscillate.

In other words, either the first context or the second context is selected, whereby the voltage controlled oscillator 21 can oscillate at one of two different frequencies, the first oscillation frequency and the second oscillation frequency. In order to select the first context, the potential of the wiring 64 (SE1) may be set at "H" level and the potential of the wiring 65 (SE2) may be set at "L" level. In order to select the second context, the potential of the wiring 64 (SE1) may be set at "L" level, and the potential of the wiring 65 (SE2) may be set at "H" level.

For each of the transistor 43a, the transistor 43b, the transistor 46a, and the transistor 46b, it is preferable to use a transistor with a significantly low off-state current that includes an oxide semiconductor in its channel formation region. With the use of this transistor, the potential of the output terminal OUT of the circuit 24 (the potential of the input terminal IN of the following stage circuit 24 in the ring oscillator 26) is stored for a long time when the transistors 46a and 46b are off.

Therefore, when the first context is selected, the voltage just before the voltage controlled oscillator 21 stops oscillating is stored in the input terminal IN and the output terminal OUT of each of the circuits 24 in the following manner: oscillation of the voltage controlled oscillator 21 oscillating at the first oscillation frequency is stopped by turning off the transistor 46a. Accordingly, the voltage controlled oscillator 21 can start oscillating at the first oscillation frequency in accordance with the voltage stored in the input terminal IN and the output terminal OUT of each of the circuits 24 by turning on the transistor 46a again, even when the oscillation is stopped for a long time by turning off the transistor 46a. Also when the second context is selected, the voltage controlled oscillator 21 can start oscillating immediately at the second oscillation frequency, even when the oscillation of the voltage controlled oscillator 21 oscillating at the second oscillation frequency is stopped for a long time.

In order to stop the oscillation of the voltage controlled oscillator 21, supply of the power supply voltage VDD ("H" level) from the wiring 71 (VDD) may be stopped. Specifically, the voltage level of the wiring 71 (VDD) is changed from "H" level to "L" level (e.g., 0 V or a GND potential). At this time, the inverter 40 does not work, whereby the circuit 24 becomes unable to transmit a signal. That is, the voltage controlled oscillator 21 stops oscillating.

When the first context is selected, the potential of the node FD1 decreases to "L" level due to capacitive coupling occurring through the capacitor C1 by changing the voltage level of the wiring 71 (VDD) from "H" level to "L" level. That is, the transistor 43a is turned off. In other words, the transistor 43a can be turned off at the same time when supply of the power supply voltage VDD is stopped. In addition, at the same time when the transistor 43a is turned off, the voltage just before the voltage controlled oscillator 21, which is oscillating at the first oscillation frequency, stops oscillating is stored in the input terminal IN and the output terminal OUT of each of the circuits 24.

When the power supply voltage VDD is supplied again to the wiring 71 (VDD), the voltage level of the wiring 71 (VDD) is changed from "L" level to "H" level, whereby capacitive coupling occurs through the capacitor C1. The potential of the node FD1 increases to "H" level. Accordingly, the transistor 43a is turned on and the voltage controlled oscillator 21 restarts oscillating at the first oscillation frequency immediately. Also when the second context is selected, the voltage just before the voltage controlled oscillator 21 oscillating at the second oscillation frequency stops oscillating can be stored in the input terminal IN and the output terminal OUT of each of the circuits 24, and the voltage controlled oscillator 21 can restart oscillating at the second oscillation frequency as soon as the power supply voltage VDD is supplied again.

Figure 8A:
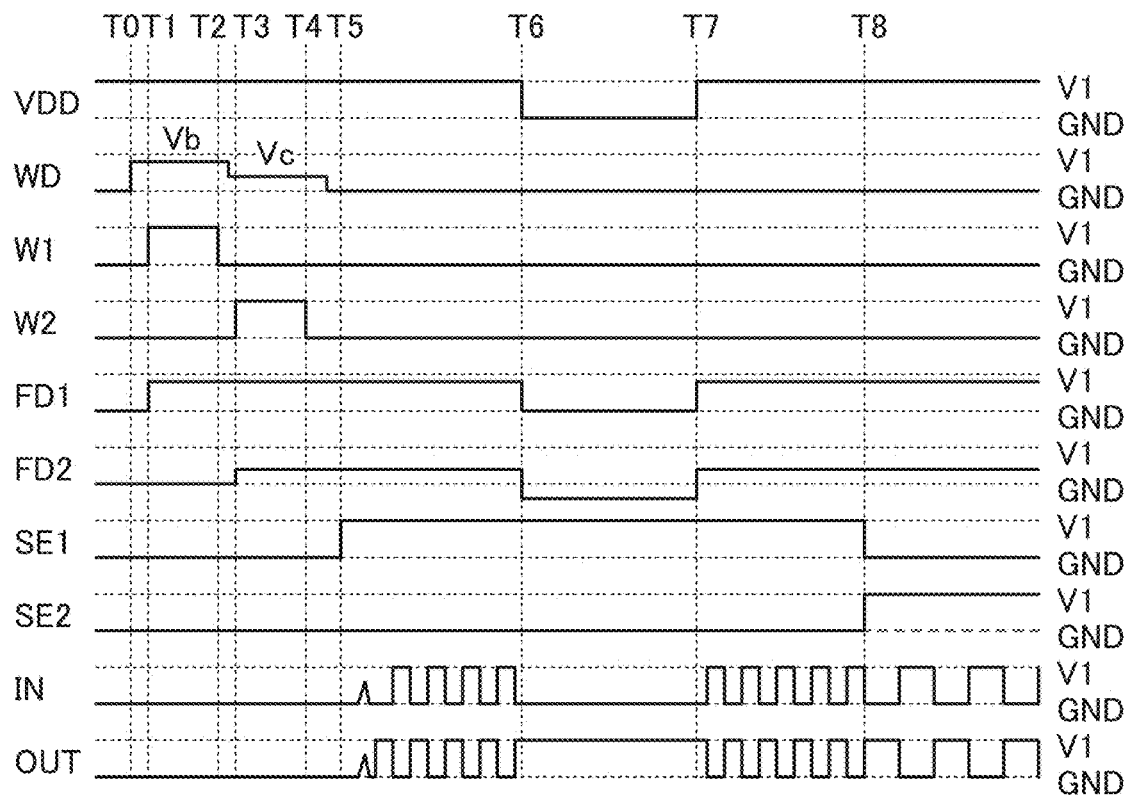
FIGS. 8A and 8B are timing charts each illustrating operation of a voltage controlled oscillator.

FIG. 8A is a timing chart illustrating one example of driving methods when the circuit 24 in FIG. 5A or 5B is used for the voltage controlled oscillator 21 in FIG. 7. VDD is the potential of the wiring 71 (VDD), WD is the potential of the wiring 73 (WD), W1 is the potential of the wiring 62 (W1), W2 is the potential of the wiring 63 (W2), FD1 is the potential of the node FD1, FD2 is the potential of the node FD2, SE1 is the potential of the wiring 64 (SE1), SE2 is the potential of the wiring 65 (SE2), IN is the potential of an input terminal IN of a particular circuit 24, and OUT is the potential of an output terminal OUT of the particular circuit 24. A voltage by which positive logic is given is V1 ("H" level), and a voltage by which negative logic is given is GND ("L" level).

At time T0, a "H" level potential (a power supply voltage VDD) is applied to the wiring 71 (VDD) and an analog potential Vb is applied to the wiring 73 (WD). Note that Vb is higher than or equal to the threshold voltage (Vth) of each of the transistors 43a and 43b.

At time T1, a "H" level potential is applied to the wiring 62 (W1), whereby the transistor 44a is turned on and the potential of the node FD1 is set to Vb.

At time T2, a "L" level potential is applied to the wiring 62 (W1), whereby the transistor 44a is turned off and the analog potential Vb is stored in the node FD1. After that, an analog potential Vc is applied to the wiring 73 (WD). Here, Vc is higher than or equal to the threshold voltage (Vth) of each of the transistors 43a and 43b and lower than Vb.

At time T3, a "H" level potential is applied to the wiring 63 (W2), whereby the transistor 44b is turned on and the potential of the node FD2 is set to Vc.

At time T4, a "L" level potential is applied to the wiring 63 (W2), whereby the transistor 44b is turned off and the analog potential Vc is stored in the node FD2. After that, a "L" level potential is applied to the wiring 73 (WD).

At time T5, a "H" level potential is applied to the wiring 64 (SE1), whereby the transistor 46a is turned on, and then the circuit 24 outputs an inversion signal of an input signal. That is, the voltage controlled oscillator 21 starts oscillating at the first oscillation frequency. Note that at the first time of the operation, the potential of the input terminal IN of the circuit 24 is not determined, so that the operation is unstable and irregular signals are output at the beginning of the oscillation. At this time, the "H" level potential is applied to the wiring 64 (SE1) and a "L" level potential is applied to the wiring 65 (SE2), whereby the first context circuit is selected.

At time T6, a "L" level potential is applied to the wiring 71 (VDD), whereby the inverter 40 becomes non-operational, so that the oscillation of the voltage controlled oscillator 21 oscillating at the first oscillation frequency is stopped. In addition, the potential of the node FD1 decreases to "L" level due to capacitive coupling through the capacitor C1. Consequently, the transistor 43a is turned off. The transistor 43a is non-conductive, whereby the potential of the input terminal IN and the potential of the output terminal OUT of each of the circuits 24 are stored.

At time T7, a "H" level potential is applied to the wiring 71 (VDD), whereby the potential of the node FD1 increases to Vb due to capacitive coupling through the capacitor C1. Consequently, the transistor 43a is turned on. The transistor 43a is conductive, whereby each of the circuits 24 outputs an output signal in response to the stored input signal. That is, the voltage controlled oscillator 21 can oscillate at the first oscillation frequency as soon as the power supply voltage VDD is supplied again to the wiring 71 (VDD).

At time T8, a "L" level potential is applied to the wiring 64(SE1) and a "H" level potential is applied to the wiring 65(SE2), whereby the transistor 46a is turned off and the transistor 46b is turned on. That is, the second context circuit is selected. In other words, the voltage controlled oscillator 21 oscillates at the second oscillation frequency.

At this time, the potential Vc which is stored in the node FD2 is lower than the potential Vb which is stored in the node FD1; therefore, the on resistance of the transistor 43b is higher than the on resistance of the transistor 43a. Accordingly, the second oscillation frequency is lower than the first oscillation frequency.

Figure 6A:
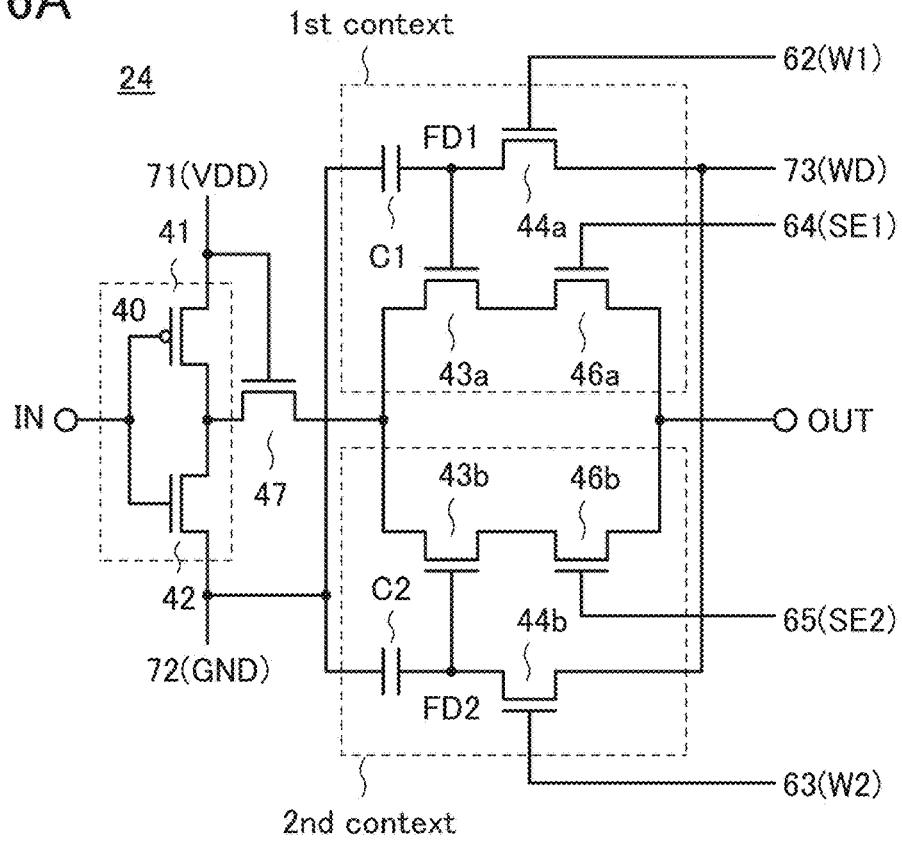
FIGS. 6A and 6B are circuit diagrams each illustrating a signal transmission circuit.
Figure 6B:
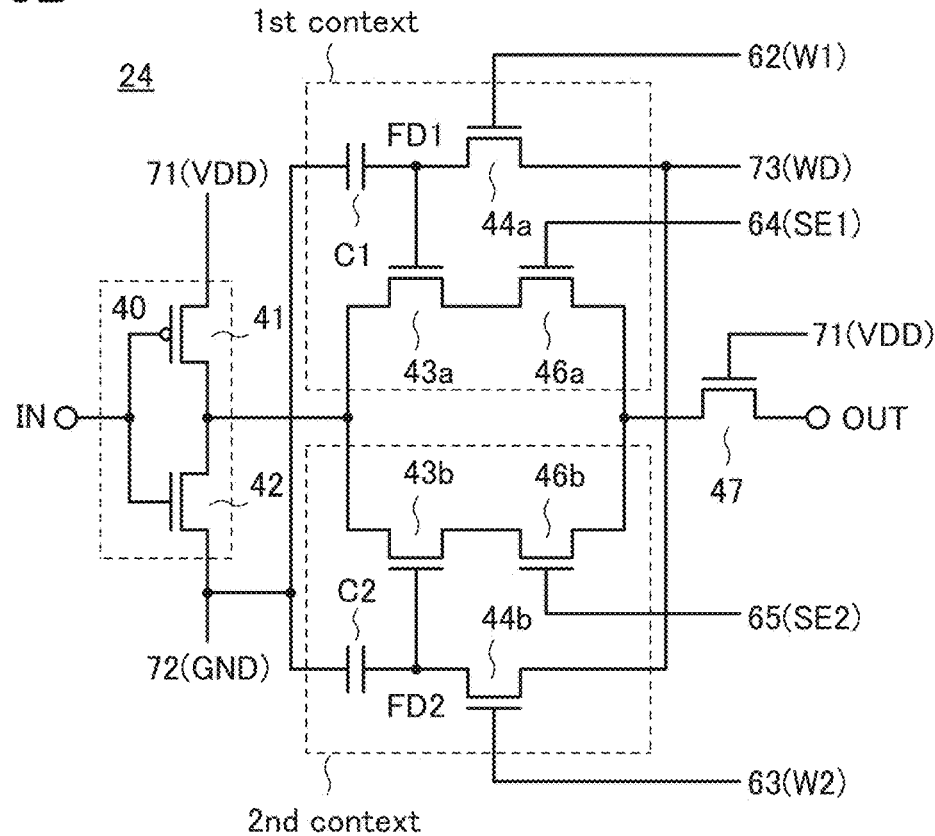

A circuit having a multi-context function which can be used as the signal transmission circuit included in the voltage controlled oscillator 21 illustrated in FIG. 7 may be the circuit 24 illustrated in FIGS. 6A and 6B.

FIG. 6A is a circuit diagram of the circuit 24 that includes two context functions. The circuit 24 includes the transistor 41, the transistor 42, the transistor 43a, the transistor 43b, the transistor 44a, the transistor 44b, the transistor 46a, the transistor 46b, a transistor 47, the capacitor C1, and the capacitor C2. The inverter 40 is formed using the transistor 41 and the transistor 42, here. The first context is formed of the transistor 43a, the transistor 44a, the transistor 46a, and the capacitor C1. The second context is formed of the transistor 43b, the transistor 44b, the transistor 46b, and the capacitor C2.

The circuit 24 illustrated in FIG. 6A is different from the circuit 24 illustrated in FIG. 5A in that the transistor 47 is provided, a gate of the transistor 47 is electrically connected to the other of the source and the drain of the transistor 41, and the other electrode of the capacitor C1 and the other electrode of the capacitor C2 are electrically connected to the other of the source and the drain of the transistor 42.

Note that, in FIG. 6A, the transistor 47 is provided between the inverter 40 and the first and second contexts; however, the transistor 47 may be provided between the first and second contexts and the output terminal OUT as illustrated in FIG. 6B.

For the transistor 47, it is preferable to a transistor with a significantly low off-state current that includes an oxide semiconductor in its channel formation region. With the use of this transistor, the potential of the output terminal OUT of the circuit 24 (the potential of the input terminal IN of the following circuit 24 in the ring oscillator 26) is stored for a long time when the transistor 47 is off.

In the circuit 24 illustrated in FIGS. 6A and 6B, the transistor 47 is provided between an output side of the inverter 40 and the output terminal OUT of the circuit 24, and the gate of the transistor 47 is electrically connected to the wiring 71 (VDD). Thus, the power supply voltage VDD is applied to the wiring 71 (VDD), whereby the inverter 40 becomes operational and the transistor 47 is turned on. Then, the circuit 24 outputs an inversion signal of an input signal if either the transistor 46a or the transistor 46b is conductive. That is, the voltage controlled oscillator 21 oscillates. When supply of the power supply voltage VDD is stopped, the inverter 40 becomes non-operational and the transistor 47 is turned off. A signal transmission path of the circuit 24 is blocked. That is, the voltage controlled oscillator 21 does not oscillate.

If supply of the power supply voltage VDD is stopped at the time when the voltage controlled oscillator 21 is oscillating, the voltage level of the wiring 71 (VDD) is changed from "H" level to "L" level. Therefore, the transistor 47 is turned off, and the voltage just before the voltage controlled oscillator 21 stops oscillating is stored in the input terminal IN and the output terminal OUT of each of the circuits 24.

When the power supply voltage VDD is applied again to the wiring 71 (VDD), the voltage level of the wiring 71 (VDD) is changed from "L" level to "H" level, whereby the transistor 47 is turned on and the voltage controlled oscillator 21 restarts oscillating immediately.

Figure 8B:
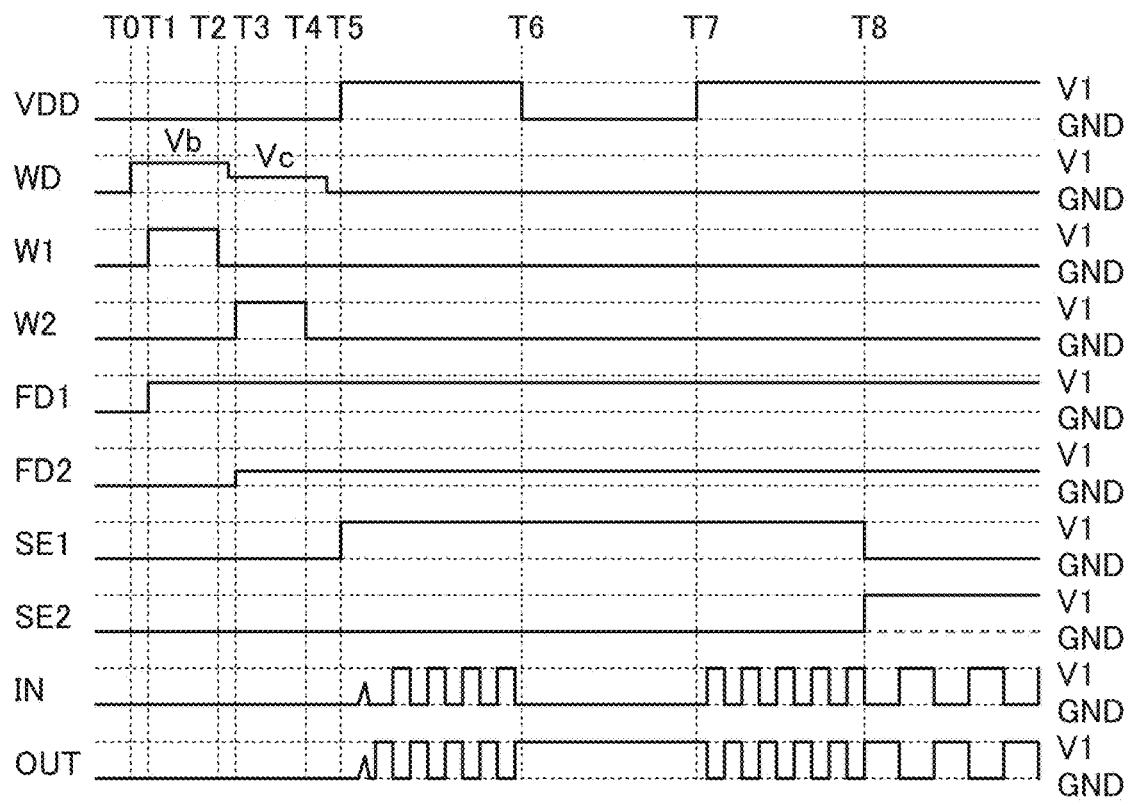
Figure 9:
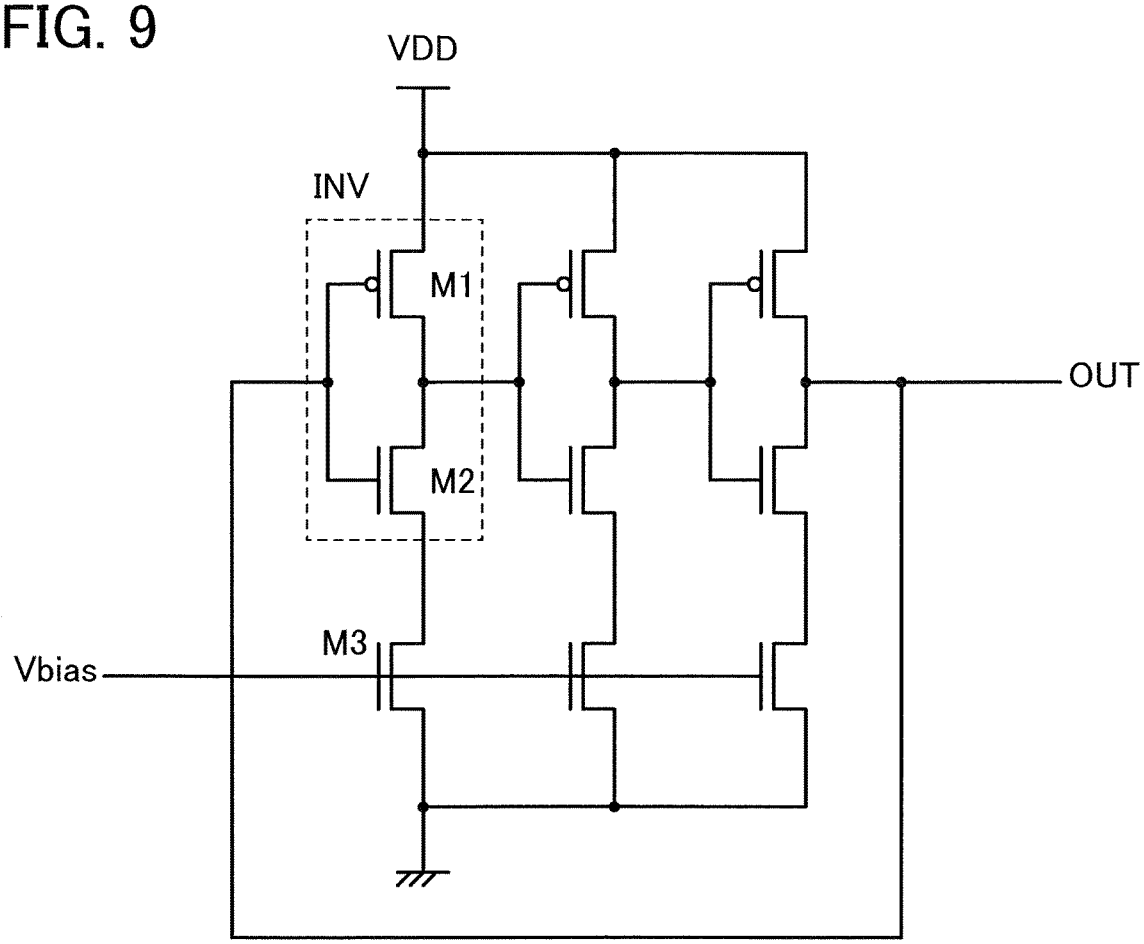
FIG. 9 is a circuit diagram illustrating a signal transmission circuit.

FIG. 8B is a timing chart illustrating one example of driving methods when the circuit 24 in FIG. 6A or 6B is used for the voltage controlled oscillator 21 in FIG. 7.

At time T0, the analog potential Vb is applied to the wiring 73 (WD). Note that Vb is higher than or equal to the threshold voltage (Vth) of each of the transistors 43a and 43b.

At time T1, a "H" level potential is applied to the wiring 62 (W1), whereby the transistor 44a is turned on and the potential of the node FD1 is set to Vb.

At time T2, a "L" level potential is applied to the wiring 62 (W1), whereby the transistor 44a is turned off and the analog potential Vb is stored in the node FD1. After that, the analog potential Vc is applied to the wiring 73 (WD). Here, Vc is higher than or equal to the threshold voltage (Vth) of each of the transistors 43a and 43b and lower than Vb.

At time T3, a "H" level potential is applied to the wiring 63 (W2), whereby the transistor 44b is turned on and the potential of the node FD2 is set to Vc.

At time T4, a "L" level potential is applied to the wiring 63 (W2), whereby the transistor 44b is turned off and the analog potential Vc is stored in the node FD2. After that, a "L" level potential is applied to the wiring 73 (WD).

At time T5, a "H" level potential (the power supply voltage VDD) is applied to the wiring 71 (VDD) and a "H" level potential is applied to the wiring 64 (SE1), whereby the transistors 47 and 46a are turned on, and then the circuit 24 outputs an inversion signal of an input signal. That is, the voltage controlled oscillator 21 starts oscillating at the first oscillation frequency. Note that at the first time of the operation, the potential of the input terminal IN of the circuit 24 is not determined, so that the operation is unstable and irregular signals are output at the beginning of the oscillation. At this time, the "H" level potential is applied to the wiring 64 (SE1) and a "L" level potential is applied to the wiring 65 (SE2), whereby the first context circuit is selected.

At time T6, a "L" level potential is applied to the wiring 71 (VDD), whereby the inverter 40 becomes non-operational, so that the oscillation of the voltage controlled oscillator 21 oscillating at the first oscillation frequency is stopped. In addition, the transistor 47 is turned off. The transistor 47 is non-conductive, whereby the potential of the input terminal IN and the potential of the output terminal OUT of each of the circuits 24 are stored.

At time T7, a "H" level potential is applied to the wiring 71 (VDD), whereby the transistor 47 is turned on. The transistor 47 is conductive, whereby each of the circuits 24 outputs an output signal in response to the stored input signal. That is, the voltage controlled oscillator 21 can oscillate at the first oscillation frequency as soon as the power supply voltage VDD is supplied again to the wiring 71 (VDD).

At time T8, a "L" level potential is applied to the wiring 64(SE1) and a "H" level potential is applied to the wiring 65(SE2), whereby the transistor 46a is turned off and the transistor 46b is turned on. That is, the second context circuit is selected, and the voltage controlled oscillator 21 oscillates at the second oscillation frequency.

The use of structures and operation methods of FIG. 1, FIGS. 3A and 3B, FIGS. 5A and 5B, and FIGS. 6A and 6B makes it possible for the voltage controlled oscillator 21 to start oscillating immediately at the time of restarting supply of power supply voltage even in the case where supply of the power supply voltage is temporarily stopped.

Figure 10A:
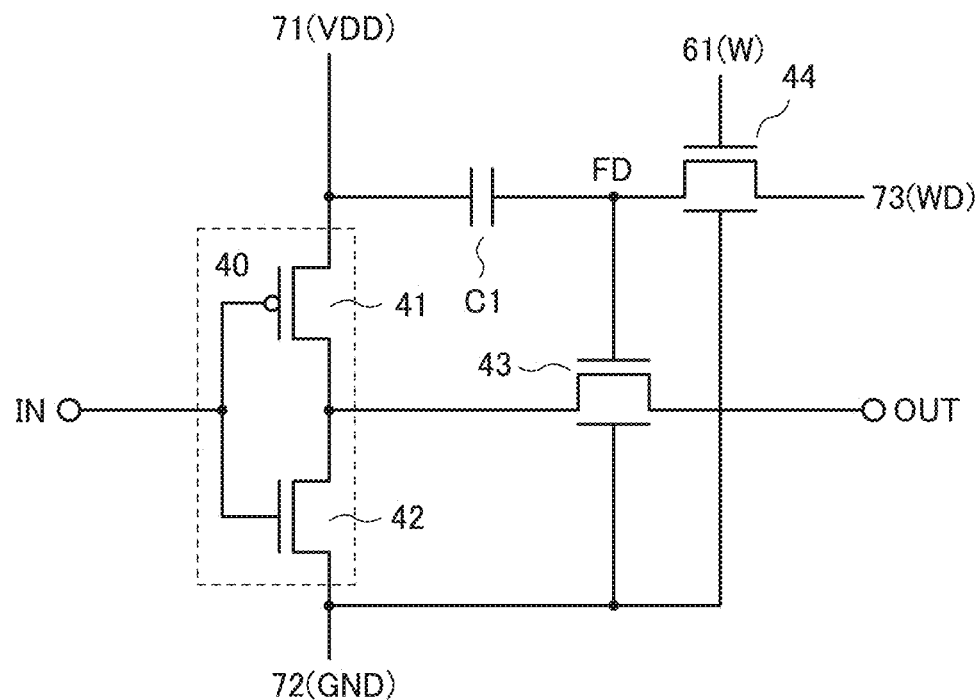
FIGS. 10A and 10B are circuit diagrams each illustrating a signal transmission circuit.
Figure 10B:
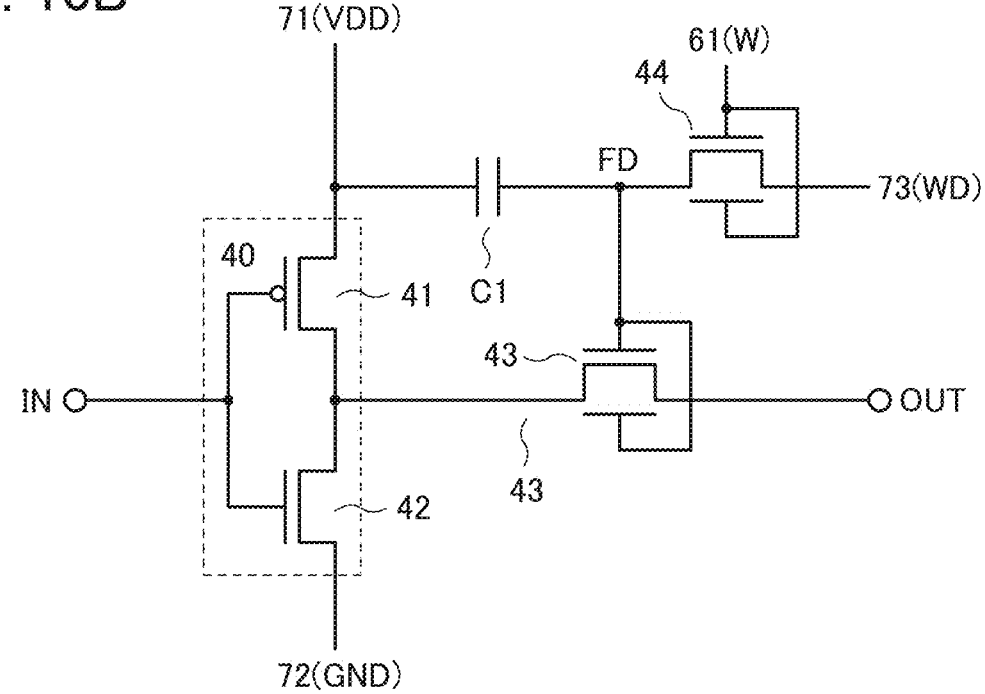

A transistor which is used in the circuits 20 and 24 may be provided with a back gate. For example, FIGS. 10A and 10B illustrate configurations in which back gates are provided for the transistors 43 and 44 of the circuit 20 illustrated in FIG. 1. FIG. 10A illustrates a configuration in which a constant potential is applied to the back gates, which enables control of the threshold voltages. In FIG. 10A, as an example, the back gates are connected to the wiring 72 (GND) that applies a low potential; however, the back gates may be connected to any of the other wirings. FIG. 10B illustrates a configuration in which the same potential is applied to the front gate and the back gate, which enables an increase in on-state current and a decrease in off-state current. The configurations of FIGS. 10A and 10B and the like may be combined such that desired transistors can have appropriate electrical characteristics. Note that a transistor without a back gate may be provided. The configurations in FIGS. 3A and 3B, FIGS. 5A and 5B, and FIGS. 6A and 6B can also have a configuration in which the transistors have back gates.

Figure 11A:
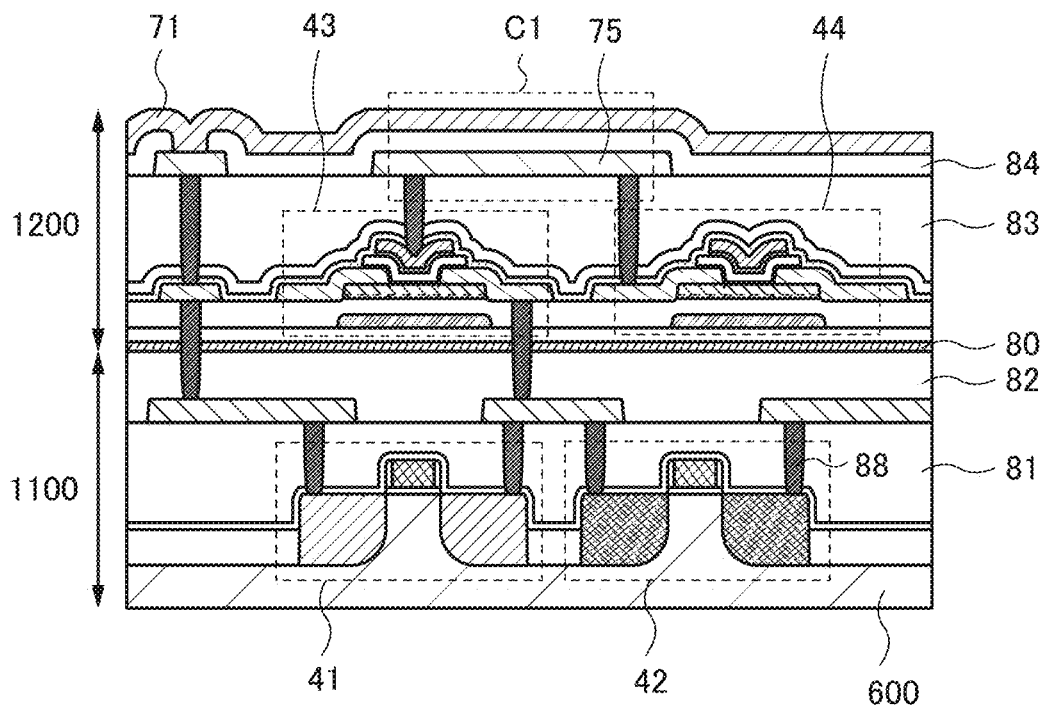
FIGS. 11A and 11B are cross-sectional views illustrating a signal transmission circuit.
Figure 11B:
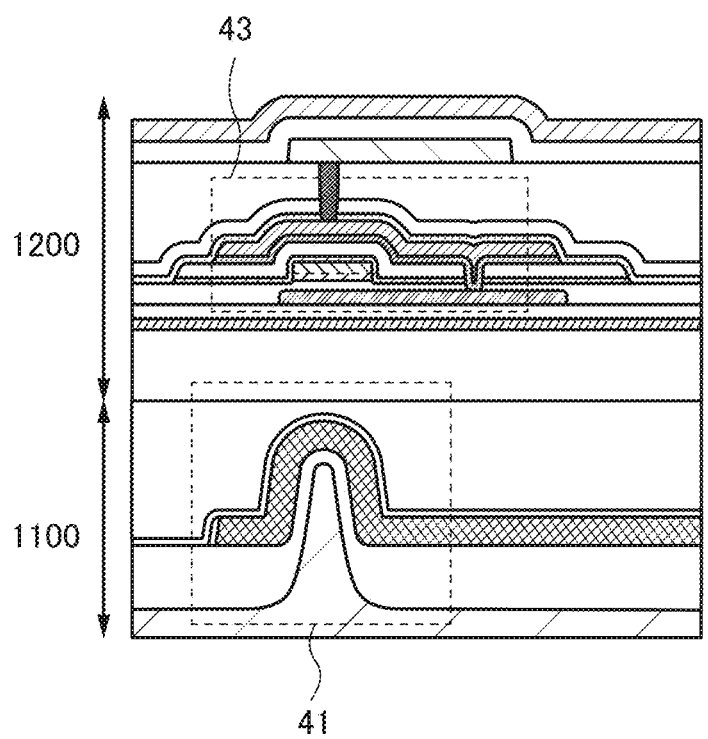

Specific structure examples of the oscillator of one embodiment of the present invention will be described with reference to drawings. FIGS. 11A and 11B illustrate an example of a specific connection between the transistor 41, the transistor 42, the transistor 43, the transistor 44, and the capacitor C1 which are included in the circuit 20 in FIG. 1. FIG. 11A is a cross-sectional view of a transistor in the channel length direction. FIG. 11B is a cross-sectional view of the transistor in the channel width direction.

To achieve both high-speed operation and the structure of a CMOS circuit, the transistors 41 and 42 are preferably formed using transistors including silicon (hereinafter referred to as Si transistors). For example, the transistors 41 and 42 can be formed over a substrate 600 which is a silicon substrate. The transistors 43 and 44 are preferably formed using transistors including an oxide semiconductor (hereinafter referred to as OS transistors) because of its low off-state current or the like.

The substrate 600 is not limited to a bulk silicon substrate and can be a substrate made of germanium, silicon germanium, silicon carbide, gallium arsenide, aluminum gallium arsenide, indium phosphide, gallium nitride, or an organic semiconductor.

For this reason, a stacked structure can be employed, which includes a layer 1100 in which the transistors 41 and 42 are provided and a layer 1200 in which the transistors 43 and 44 are provided as illustrated in FIG. 11A. Such a structure can reduce the area of the oscillator.

The capacitor C1 can be provided in the layer 1200 in such a manner that the wiring 75 connecting the gate of the transistor 43 and the one of the source and the drain of the transistor 44 is used as one electrode, the wiring 71 (VDD) is used as the other electrode, and an insulating layer 84 is used as a dielectric. An inorganic insulating film such as a silicon oxide film or a silicon oxynitride film can be used as the insulating layer 84, for example. Note that the capacitor C1 may alternatively be provided in the layer 1100.

Although the wirings, the electrodes, and contact plugs (conductors 88) are illustrated as independent components in cross-sectional views in this embodiment, some of them are provided as one component in some cases when they are electrically connected to each other. In addition, a structure in which the wiring is connected to the electrode through the conductor 88 is only an example, and the wiring may be directly connected to the electrode.

Insulating layers 81 to 83 and the like that function as protective films, interlayer insulating films, or planarization films are provided over the components. For example, an inorganic insulating film such as a silicon oxide film or a silicon oxynitride film can be used as each of the insulating layers 81 to 83 and the like. Alternatively, an organic insulating film such as an acrylic resin film or a polyimide resin film may be used. Top surfaces of the insulating layers 81 to 83 and the like are preferably planarized by chemical mechanical polishing (CMP) or the like as necessary.

In some cases, one or more of the wirings and the like illustrated in the drawing are not provided or a wiring, a transistor, or the like that is not illustrated in the drawing is included in each layer. In addition, a layer that is not illustrated in the drawing might be included in the stacked-layer structure. Furthermore, one or more of the layers illustrated in the drawing are not included in some cases.

Although the transistors 43 and 44 each include a back gate in FIG. 11A, each of the transistors does not necessarily include a back gate. Alternatively, one of the transistors, e.g., only the transistor 43, may include a back gate. The back gate of the transistor might be electrically connected to its front gate provided opposite to the back gate. Alternatively, different fixed potentials might be supplied to the back gate and the front gate. Note that the presence or absence of the back gate can also be applied to another circuit configuration described in this embodiment.

Figure 12A:
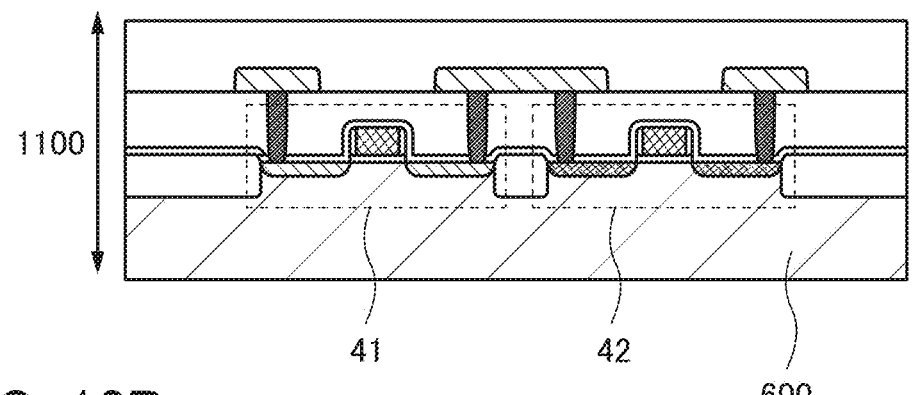
FIGS. 12A and 12B are cross-sectional views each illustrating a signal transmission circuit.
Figure 12B:
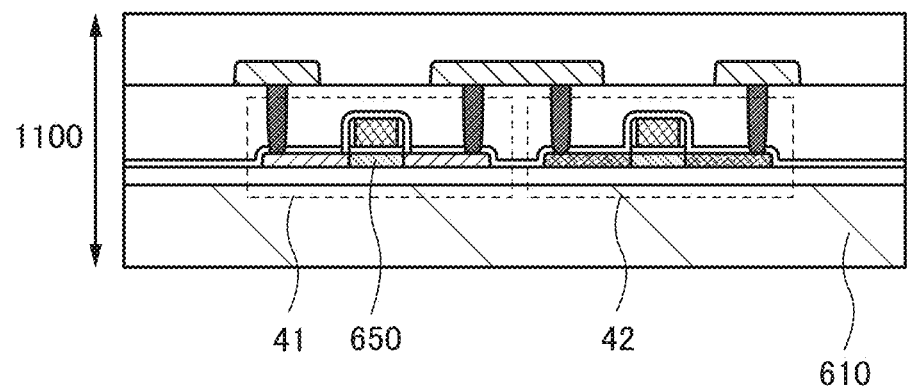

Although FIGS. 11A and 11B illustrate the Si transistors of a fin type, the transistors may be of a planar type as illustrated in FIG. 12A. As illustrated in FIG. 12B, the transistors may each be a transistor including an active layer 650 formed using a silicon thin film. The active layer 650 can be formed using polycrystalline silicon or single crystal silicon of a silicon-on-insulator (SOI) structure. In addition, a glass substrate or the like may be used as a substrate 610 of FIG. 12B.

As illustrated in FIGS. 11A and 11B, an insulating layer 80 is provided between a region including a transistor comprising an oxide semiconductor (an OS transistor) and a region including a Si transistor.

Dangling bonds of silicon are terminated with hydrogen in insulating layers provided in the vicinities of the active regions of the transistors 41 and 42. Therefore, the hydrogen has an effect of improving the reliability of the transistors 41 and 42. Meanwhile, hydrogen in insulating layers which are provided in the vicinity of the oxide semiconductor layer that is the active layer of the transistor 43 or the like causes generation of carriers in the oxide semiconductor layer. Therefore, the hydrogen might reduce the reliability of the transistor 43 or the like. Consequently, in the case where one layer including the transistor formed using a silicon-based semiconductor material and the other layer including the OS transistor are stacked, it is preferable that the insulating layer 80 having a function of preventing diffusion of hydrogen be provided between the layers. Hydrogen is confined in the one layer by the insulating layer 80, so that the reliability of the transistors 41 and 42 can be improved. Furthermore, diffusion of hydrogen from the one layer to the other layer is inhibited, so that the reliability of the transistor 41 or the like can also be improved.

The insulating layer 80 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Figure 13:
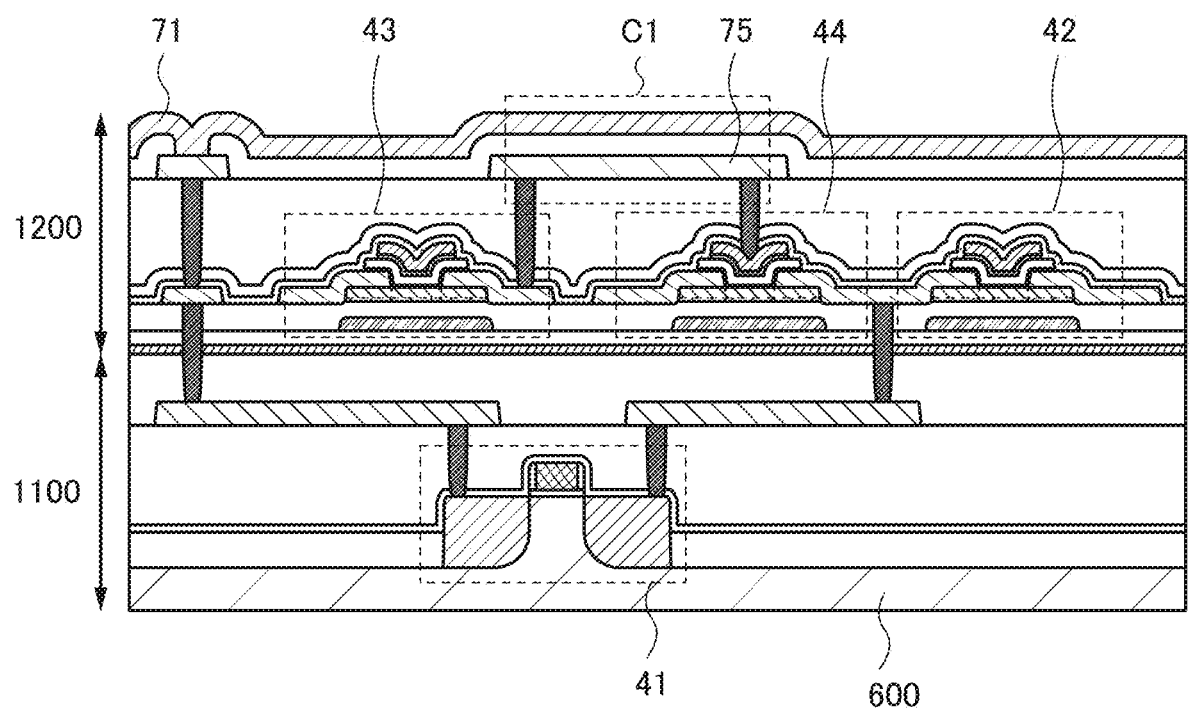
FIG. 13 is a cross-sectional view illustrating a signal transmission circuit.

The oscillator of one embodiment of the present invention can have a structure in FIG. 13. The oscillator in FIG. 13 is a modification example of the oscillator in FIG. 11A. A CMOS inverter is formed using an OS transistor and a Si transistor.

Here, the transistor 41 is a p-channel Si transistor provided in the layer 1100, and the transistor 42 is an n-channel OS transistor provided in the layer 1200. When only the p-channel transistor is provided on the substrate 600, a step of forming a well, an n-type impurity layer, or the like can be skipped.

In the oscillator in FIG. 13, the transistor 42 can be formed in the same process as the transistors 43 and 44 formed in the layer 1200. Thus, the manufacturing process of the oscillator can be simplified. Since the off-state current of the OS transistor is extremely low, the static power consumption of the CMOS circuit can be extremely low.

Note that the structure of the transistor included in each of the oscillators described in this embodiment is only an example. Therefore, for example, either one or both the transistors 41 and 42 can be formed using a transistor including an oxide semiconductor layer as an active layer. Furthermore, either one or both the transistors 43 and 44 can be formed using a transistor in which an active region or an active layer includes silicon or the like.

In this embodiment, one embodiment of the present invention has been described. Other embodiments of the present invention are described in the other embodiments. Note that one embodiment of the present invention is not limited thereto. In other words, various embodiments of the invention are described in this embodiment and the other embodiments, and one embodiment of the present invention is not limited to a particular embodiment. Although an example in which one embodiment of the present invention is applied to an oscillator is described, one embodiment of the present invention is not limited thereto. Depending on circumstances or conditions, one embodiment of the present invention is not necessarily applied to an oscillator. One embodiment of the present invention may be applied to a semiconductor device with another function, for example. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor.

This embodiment can be combined with any of the structures described in the other embodiments as appropriate.

Embodiment 2

In this embodiment, an OS transistor that can be used in one embodiment of the present invention will be described with reference to drawings. In the drawings in this embodiment, some components are enlarged, reduced in size, or omitted for easy understanding.

Figure 14A:
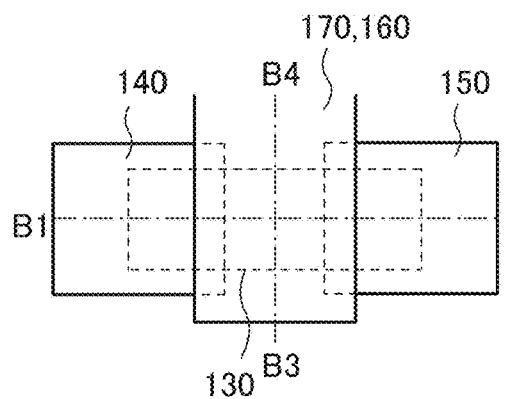
FIGS. 14A to 14F are top views and cross-sectional views illustrating a transistor.
Figure 14B:
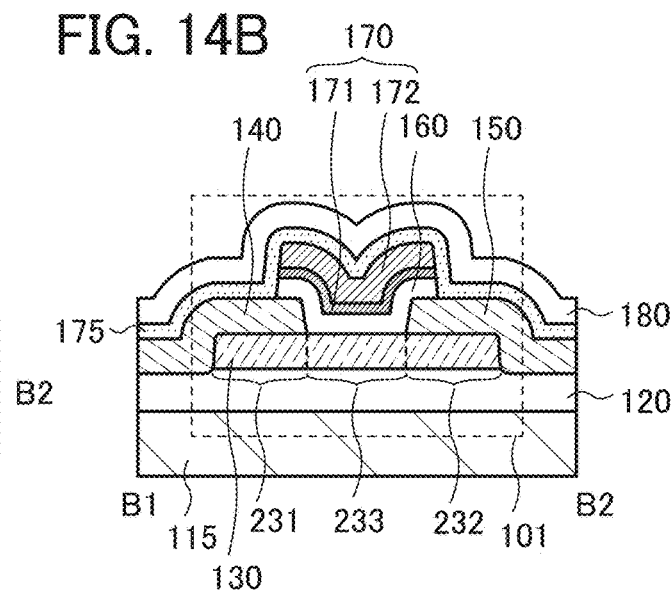
Figure 16A:
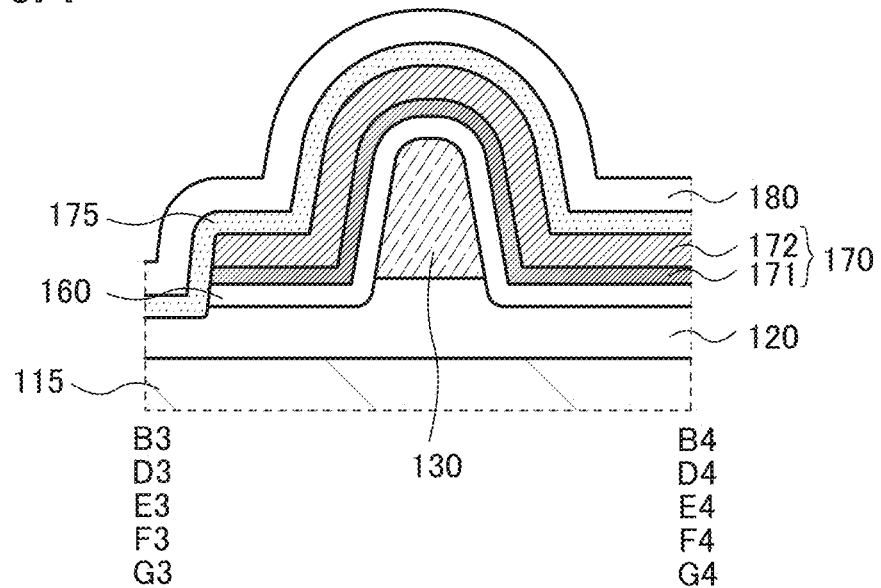
FIGS. 16A to 16D each illustrate a cross section of a transistor in a channel width direction.

FIGS. 14A and 14B are a top view and a cross-sectional view illustrating a transistor 101 of one embodiment of the present invention. FIG. 14A is a top view, and a cross section in the direction of dashed-dotted line B1-B2 in FIG. 14A is illustrated in FIG. 14B. A cross section in the direction of dashed-dotted line B3-B4 in FIG. 14A is illustrated in FIG. 16A. The direction of dashed-dotted line B1-B2 is referred to as a channel length direction, and the direction of dashed-dotted line B3-B4 is referred to as a channel width direction.

The transistor 101 includes an insulating layer 120 in contact with a substrate 115; an oxide semiconductor layer 130 in contact with the insulating layer 120; conductive layers 140 and 150 electrically connected to the oxide semiconductor layer 130; an insulating layer 160 in contact with the oxide semiconductor layer 130 and the conductive layers 140 and 150; a conductive layer 170 in contact with the insulating layer 160; an insulating layer 175 in contact with the conductive layers 140 and 150, the insulating layer 160, and the conductive layer 170; and an insulating layer 180 in contact with the insulating layer 175. The insulating layer 180 may function as a planarization film as necessary.

The conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 14B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layers 140 and 150, the resistance of the regions 231 and 232 can be reduced.

Specifically, since the oxide semiconductor layer 130 is in contact with the conductive layers 140 and 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the regions 231 and 232 to n-type regions with low resistance.

Note that functions of a "source" and a "drain" of a transistor are sometimes interchanged with each other when a transistor of an opposite conductivity type is used or when the direction of current flow is changed in circuit operation, for example. Therefore, the terms "source" and "drain" can be interchanged with each other in this specification. In addition, the term "electrode layer" can be changed into the term "wiring.

The conductive layer 170 includes two layers, conductive layers 171 and 172, but also may be a single layer or a stack of three or more layers. The same applies to other transistors described in this embodiment.

Each of the conductive layers 140 and 150 is a single layer, but also may be a stack of two or more layers. The same applies to other transistors described in this embodiment.

Figure 14C:
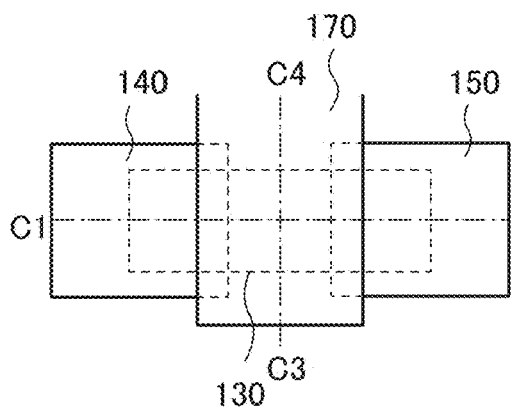
Figure 14D:
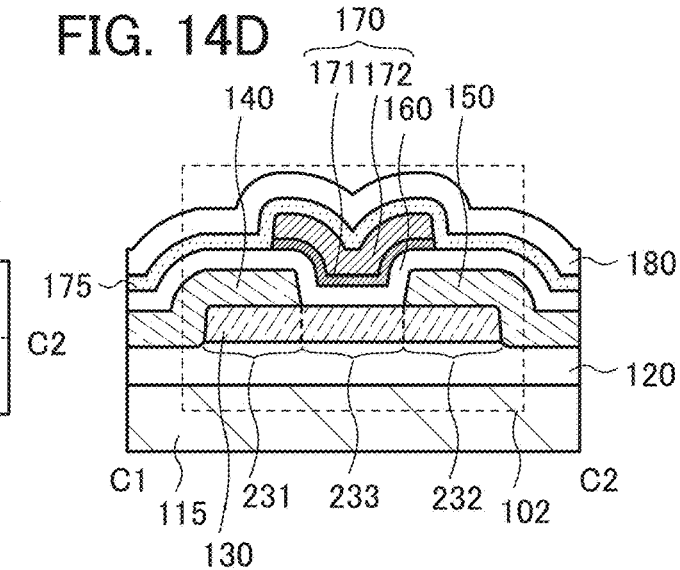
Figure 16B:
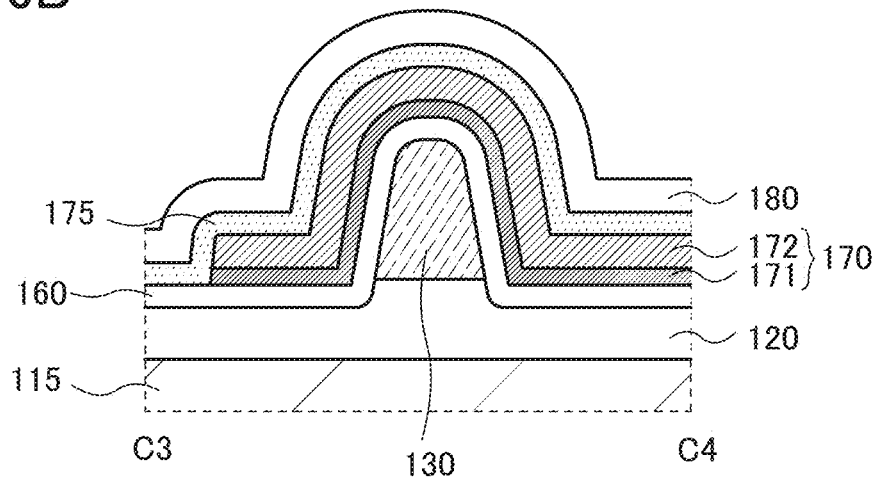

The transistor of one embodiment of the present invention may have a structure illustrated in FIGS. 14C and 14D. FIG. 14C is a top view of a transistor 102. A cross section in the direction of dashed-dotted line C1-C2 in FIG. 14C is illustrated in FIG. 14D. A cross section in the direction of dashed-dotted line C3-C4 in FIG. 14C is illustrated in FIG. 16B. The direction of dashed-dotted line C1-C2 is referred to as a channel length direction, and the direction of dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layers 140 and 150 are covered with the insulating layer 160 and accordingly the resistance between the conductive layer 170 and the conductive layers 140 and 150 is high; therefore, the transistor 102 has low gate leakage current.

The transistors 101 and 102 each have a top-gate structure including a region where the conductive layer 170 overlaps with the conductive layers 140 and 150. To reduce parasitic capacitance, the width of the region in the channel length direction is preferably greater than or equal to 3 nm and less than 300 nm. Since an offset region is not formed in the oxide semiconductor layer 130 in this structure, a transistor with high on-state current can be easily formed.

Figure 14E:
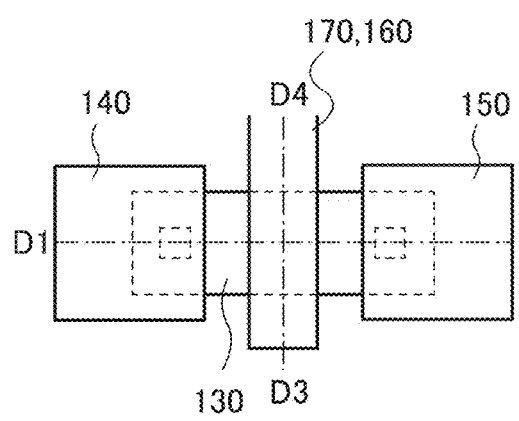
Figure 14F:
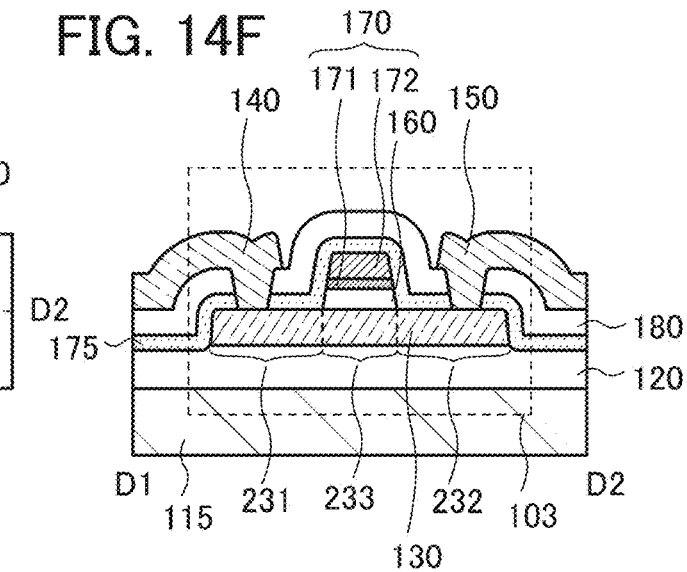

The transistor of one embodiment of the present invention may have a structure illustrated in FIGS. 14E and 14F. FIG. 14E is a top view of a transistor 103. A cross section in the direction of dashed-dotted line D1-D2 in FIG. 14E is illustrated in FIG. 14F. A cross section in the direction of dashed-dotted line D3-D4 in FIG. 14E is illustrated in FIG. 16A. The direction of dashed-dotted line D1-D2 is referred to as a channel length direction, and the direction of dashed-dotted line D3-D4 is referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layers 140 and 150 electrically connected to the oxide semiconductor layer 130 through openings provided in the insulating layers 175 and 180. The transistor 103 may further include, for example, an insulating layer (planarization film) in contact with the insulating layer 180 and the conductive layers 140 and 150 as necessary.

The conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 14F can function as a source region, a drain region, and a channel formation region, respectively. The regions 231 and 232 are in contact with the insulating layer 175. When an insulating material containing hydrogen is used for the insulating layer 175, for example, the resistance of the regions 231 and 232 can be reduced.

Specifically, interaction between an oxygen vacancy generated in the regions 231 and 232 by the steps up to formation of the insulating layer 175 and hydrogen that diffuses into the regions 231 and 232 from the insulating layer 175 changes the regions 231 and 232 to n-type regions with low resistance. As the insulating material containing hydrogen, for example, silicon nitride, aluminum nitride, or the like can be used.

Figure 15A:
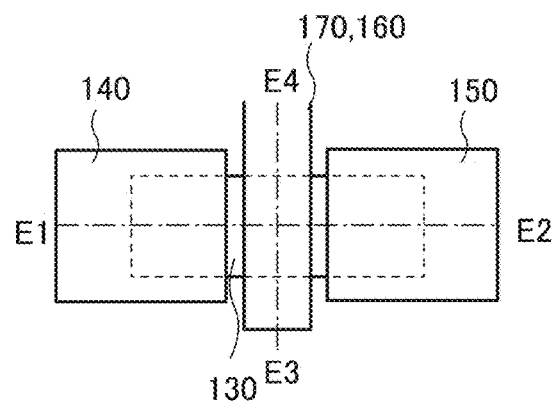
FIGS. 15A to 15F are top views and cross-sectional views illustrating a transistor.
Figure 15B:
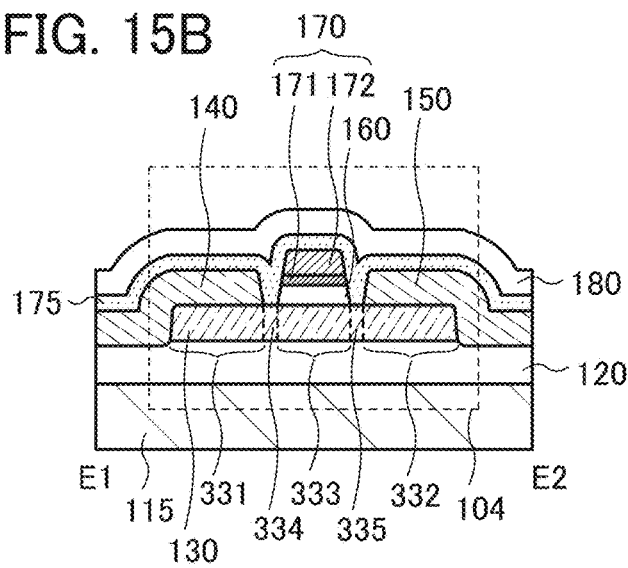

The transistor of one embodiment of the present invention may have a structure illustrated in FIGS. 15A and 15B. FIG.

15A is a top view of a transistor 104. A cross section in the direction of dashed-dotted line E1-E2 in FIG. 15A is illustrated in FIG. 15B. A cross section in the direction of dashed-dotted line E3-E4 in FIG. 15A is illustrated in FIG. 16A. The direction of dashed-dotted line E1-E2 is referred to as a channel length direction, and the direction of dashed-dotted line E3-E4 is referred to as a channel width direction.

The transistor 104 has the same structure as the transistor 103 except that the conductive layers 140 and 150 in contact with the oxide semiconductor layer 130 cover end portions of the oxide semiconductor layer 130.

In FIG. 15B, regions 331 and 334 can function as a source region, regions 332 and 335 can function as a drain region, and a region 333 can function as a channel formation region.

The resistance of the regions 331 and 332 can be reduced in a manner similar to that of the regions 231 and 232 in the transistor 101.

The resistance of the regions 334 and 335 can be reduced in a manner similar to that of the regions 231 and 232 in the transistor 103. In the case where the length of the regions 334 and 335 in the channel length direction is less than or equal to 100 nm, preferably less than or equal to 50 nm, a gate electric field prevents a significant decrease in on-state current. Therefore, a reduction in resistance of the regions 334 and 335 is not performed in some cases.

The transistors 103 and 104 each have a self-aligned structure that does not include a region where the conductive layer 170 overlaps with the conductive layers 140 and 150. A transistor with a self-aligned structure, which has extremely low parasitic capacitance between a gate electrode layer and source and drain electrode layers, is suitable for applications that require high-speed operation.

Figure 15C:
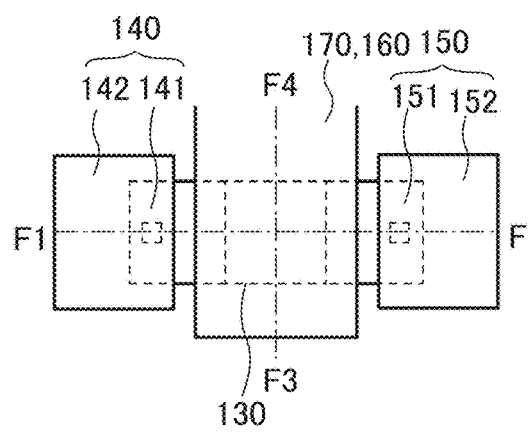
Figure 15D:
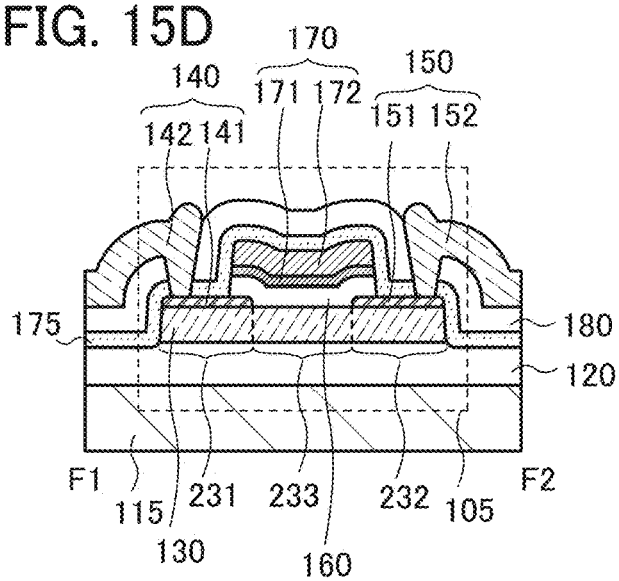

The transistor of one embodiment of the present invention may have a structure illustrated in FIGS. 15C and 15D. FIG. 15C is a top view of a transistor 105. A cross section in the direction of dashed-dotted line F1-F2 in FIG. 15C is illustrated in FIG. 15D. A cross section in the direction of dashed-dotted line F3-F4 in FIG. 15C is illustrated in FIG. 16A. The direction of dashed-dotted line F1-F2 is referred to as a channel length direction, and the direction of dashed-dotted line F3-F4 is referred to as a channel width direction.

The transistor 105 includes the insulating layer 120 in contact with the substrate 115; the oxide semiconductor layer 130 in contact with the insulating layer 120; conductive layers 141 and 151 electrically connected to the oxide semiconductor layer 130; the insulating layer 160 in contact with the oxide semiconductor layer 130 and the conductive layers 141 and 151; the conductive layer 170 in contact with the insulating layer 160; the insulating layer 175 in contact with the oxide semiconductor layer 130, the conductive layers 141 and 151, the insulating layer 160, and the conductive layer 170; the insulating layer 180 in contact with the insulating layer 175; and conductive layers 142 and 152 electrically connected to the conductive layers 141 and 151, respectively, through openings provided in the insulating layers 175 and 180. The transistor 105 may further include, for example, an insulating layer in contact with the insulating layer 180 and the conductive layers 142 and 152 as necessary.

The conductive layers 141 and 151 are in contact with the top surface of the oxide semiconductor layer 130 and are not in contact with side surfaces of the oxide semiconductor layer 130.

The transistor 105 has the same structure as the transistor 101 except that the conductive layers 141 and 151 are provided, that openings are provided in the insulating layers 175 and 180, and that the conductive layers 142 and 152 electrically connected to the conductive layers 141 and 151, respectively, through the openings are provided. The conductive layer 140 (the conductive layers 141 and 142) can function as a source electrode layer, and the conductive layer 150 (the conductive layers 151 and 152) can function as a drain electrode layer.

Figure 15E:
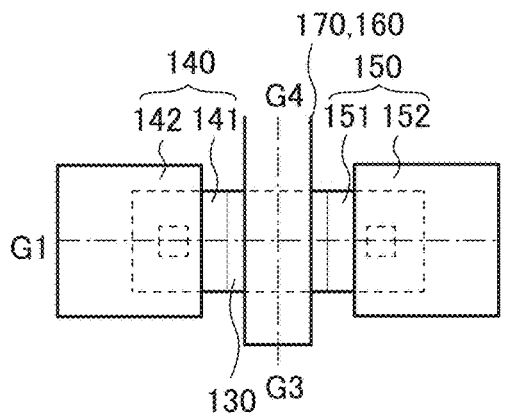
Figure 15F:
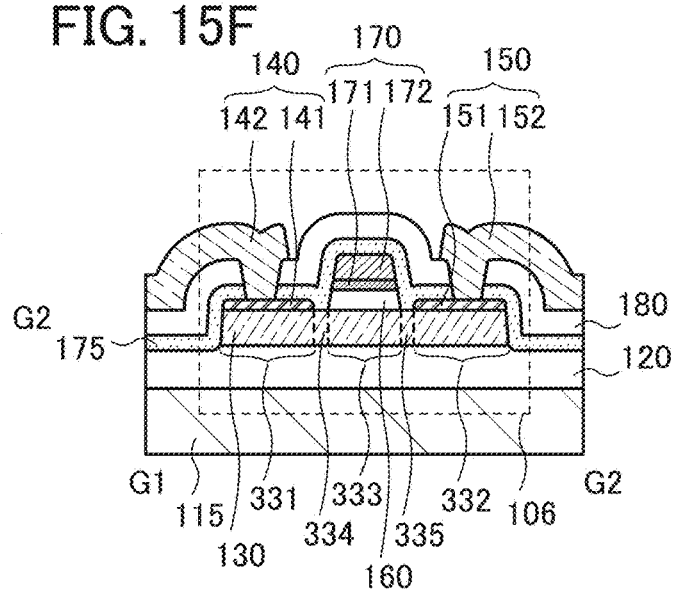

The transistor of one embodiment of the present invention may have a structure illustrated in FIGS. 15E and 15F. FIG. 15E is a top view of a transistor 106. A cross section in the direction of dashed-dotted line G1-G2 in FIG. 15E is illustrated in FIG. 15F. A cross section in the direction of dashed-dotted line G3-G4 in FIG. 15E is illustrated in FIG. 16A. The direction of dashed-dotted line G1-G2 is referred to as a channel length direction, and the direction of dashed-dotted line G3-G4 is referred to as a channel width direction.

The transistor 106 includes the insulating layer 120 in contact with the substrate 115; the oxide semiconductor layer 130 in contact with the insulating layer 120; the conductive layers 141 and 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layers 141 and 151, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 106 may further include, for example, an insulating layer (planarization film) in contact with the insulating layer 180 and the conductive layers 142 and 152 as necessary.

The conductive layers 141 and 151 are in contact with the top surface of the oxide semiconductor layer 130 and are not in contact with side surfaces of the oxide semiconductor layer 130.

The transistor 106 has the same structure as the transistor 103 except that the conductive layers 141 and 151 are provided. The conductive layer 140 (the conductive layers 141 and 142) can function as a source electrode layer, and the conductive layer 150 (the conductive layers 151 and 152) can function as a drain electrode layer.

In the structures of the transistors 105 and 106, the conductive layers 140 and 150 are not in contact with the insulating layer 120. These structures make the insulating layer 120 less likely to be deprived of oxygen by the conductive layers 140 and 150 and facilitate oxygen supply from the insulating layer 120 to the oxide semiconductor layer 130.

An impurity for forming an oxygen vacancy to increase conductivity may be added to the regions 231 and 232 in the transistor 105 and the regions 334 and 335 in the transistors 104 and 106. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property in a manner similar to the oxide semiconductor.

The oxide conductor is a degenerated semiconductor and it is suggested that the conduction band edge equals or substantially equals the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 16C:
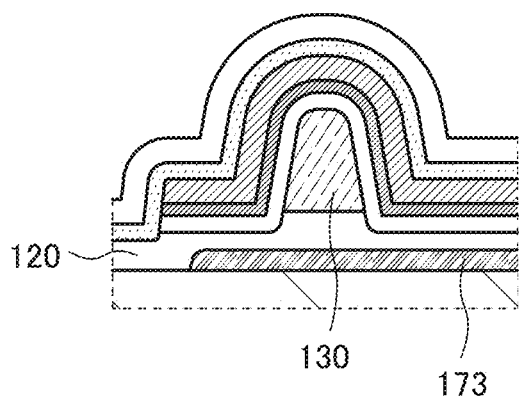
Figure 16D:
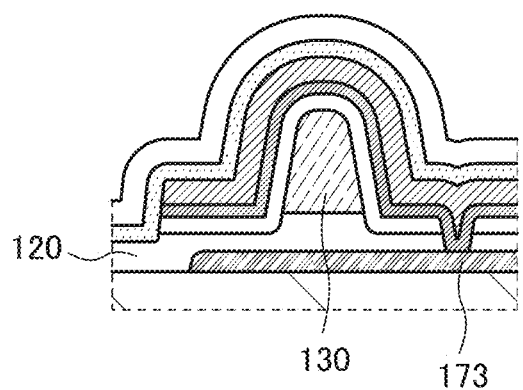
Figure 17A:
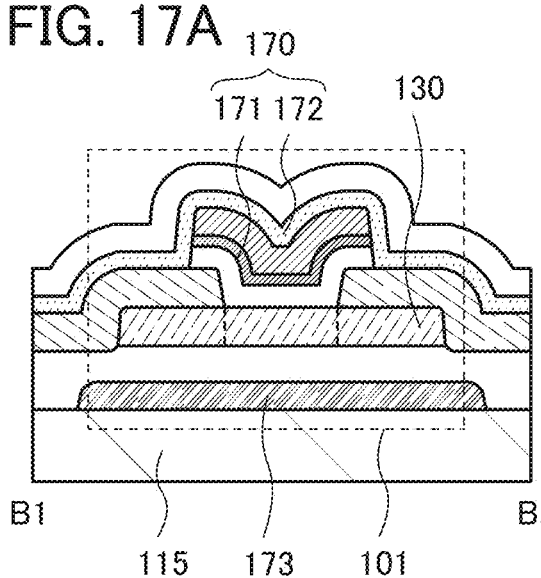
FIGS. 17A to 17F each illustrate a cross section of a transistor in a channel length direction.
Figure 17B:
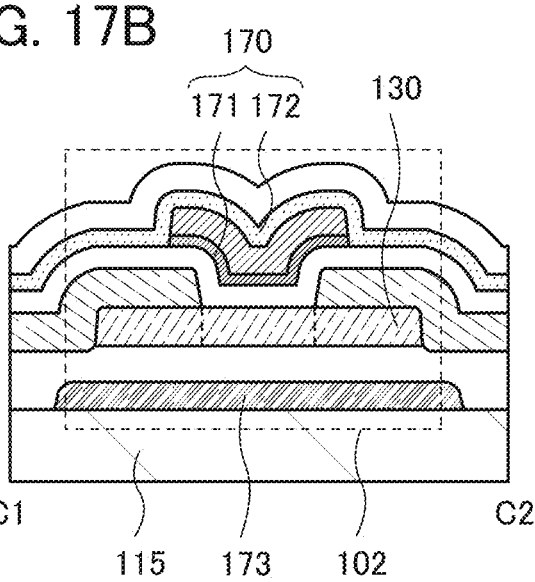
Figure 17C:
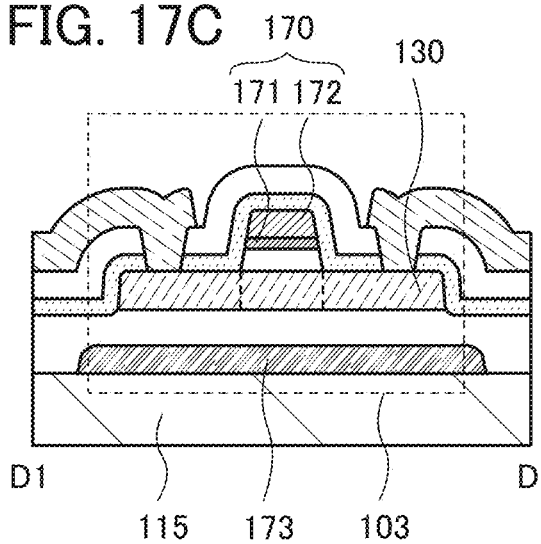
Figure 17D:
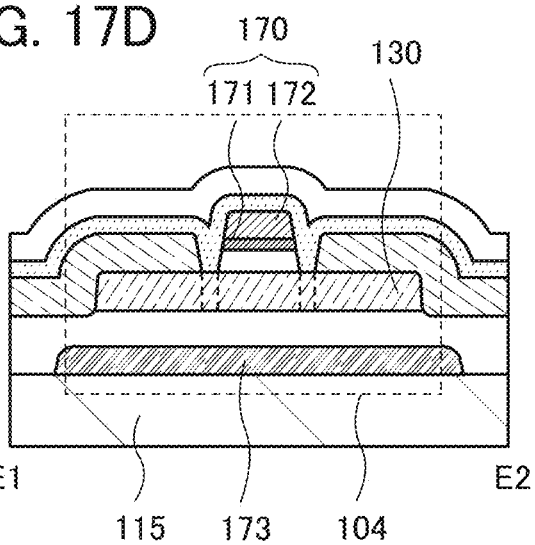
Figure 17E:
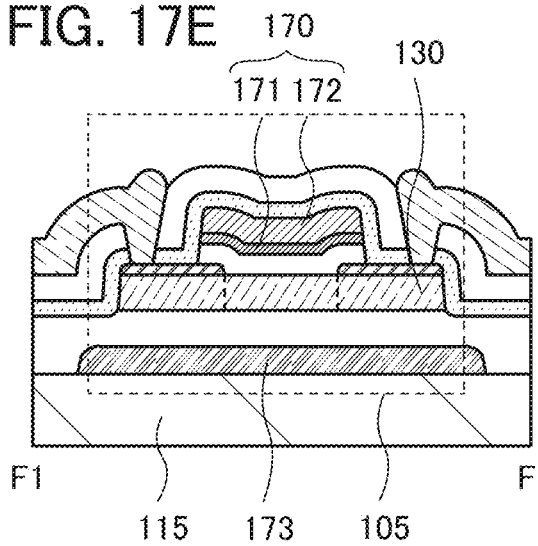
Figure 17F:
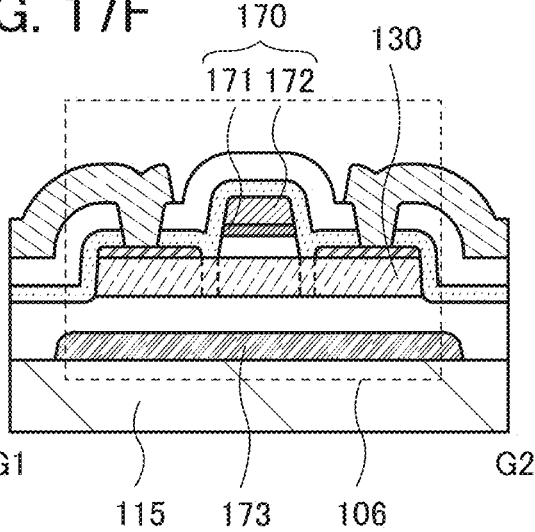

The transistor of one embodiment of the present invention may include a conductive layer 173 between the oxide semiconductor layer 130 and the substrate 115 as illustrated in cross-sectional views in the channel length direction in FIGS. 17A to 17F and cross-sectional views in the channel width direction in FIGS. 16C and 16D. When the conductive layer is used as a second gate electrode layer (back gate), the on-state current can be increased or the threshold voltage can be controlled. In the cross-sectional views in FIGS. 17A to 17F, the width of the conductive layer 173 may be shorter than that of the oxide semiconductor layer 130. Moreover, the width of the conductive layer 173 may be shorter than that of the conductive layer 170.

In order to increase the on-state current, for example, the conductive layers 170 and 173 are made to have the same potential, and the transistor is driven as a double-gate transistor. Furthermore, in order to control the threshold voltage, a fixed potential that is different from the potential of the conductive layer 170 is applied to the conductive layer 173. To set the conductive layers 170 and 173 to the same potential, for example, as illustrated in FIG. 16D, the conductive layers 170 and 173 may be electrically connected to each other through a contact hole.

Although the transistors 101 to 106 in FIGS. 14A to 14F and FIGS. 15A to 15F are examples in which the oxide semiconductor layer 130 is a single layer, the oxide semiconductor layer 130 may be a stacked layer. The oxide semiconductor layer 130 in the transistors 101 to 106 can be replaced with the oxide semiconductor layer 130 in FIGS. 18B and 18C or FIGS. 18D and 18E.

Figure 18A:
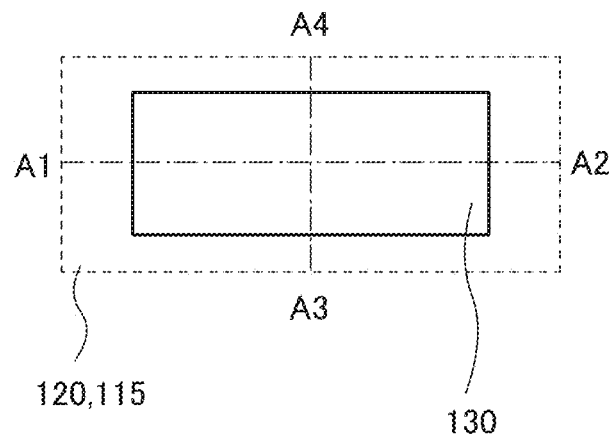
FIGS. 18A to 18E are a top view and cross-sectional views illustrating a semiconductor layer.
Figure 18B:
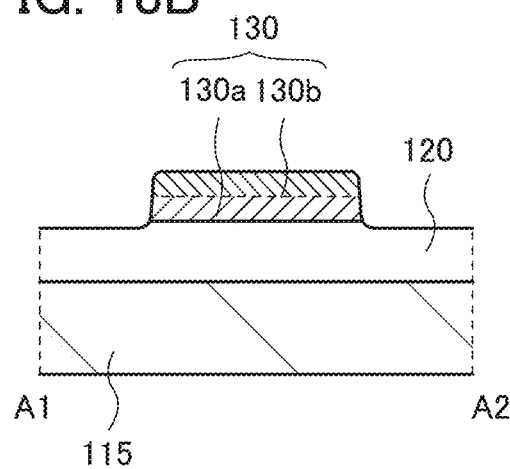
Figure 18D:
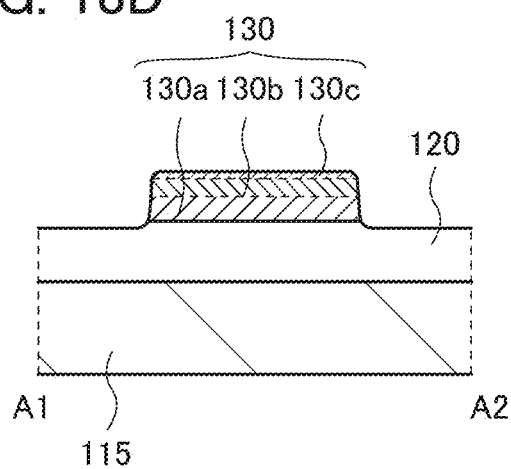
Figure 18C:
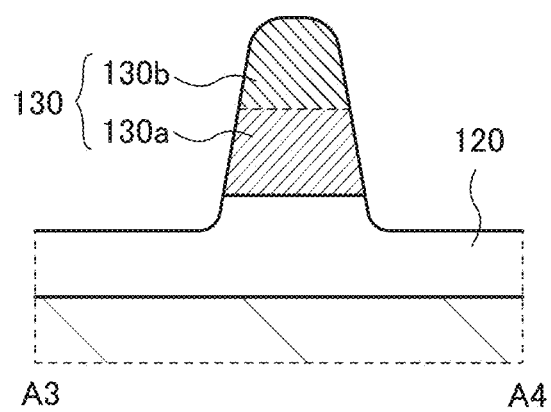
Figure 18E:
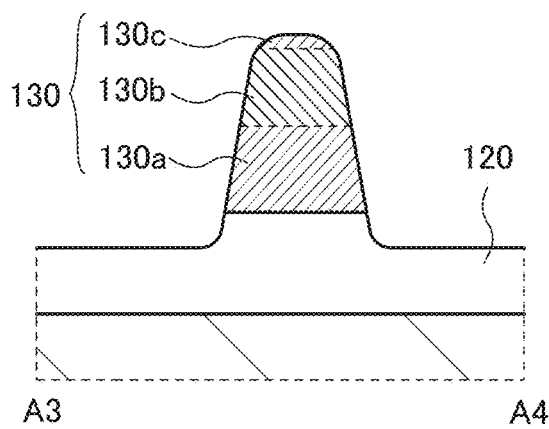

FIG. 18A is a top view of the oxide semiconductor layer 130, and FIGS. 18B and 18C are cross-sectional views of the oxide semiconductor layer 130 with a two-layer structure. FIGS. 18D and 18E are cross-sectional views of the oxide semiconductor layer 130 with a three-layer structure.

Oxide semiconductor layers with different compositions, for example, can be used as an oxide semiconductor layer 130a, an oxide semiconductor layer 130b, and an oxide semiconductor layer 130c.

Figure 19A:
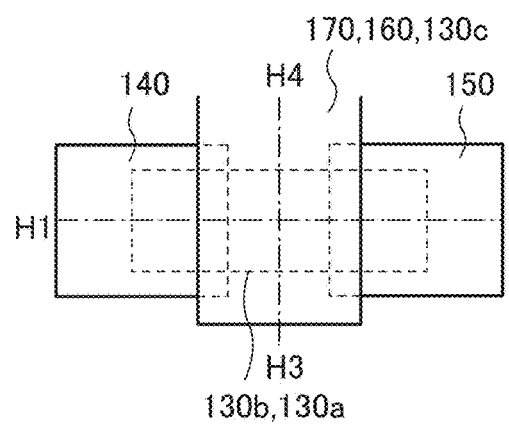
FIGS. 19A to 19F are top views and cross-sectional views illustrating a transistor.
Figure 19B:
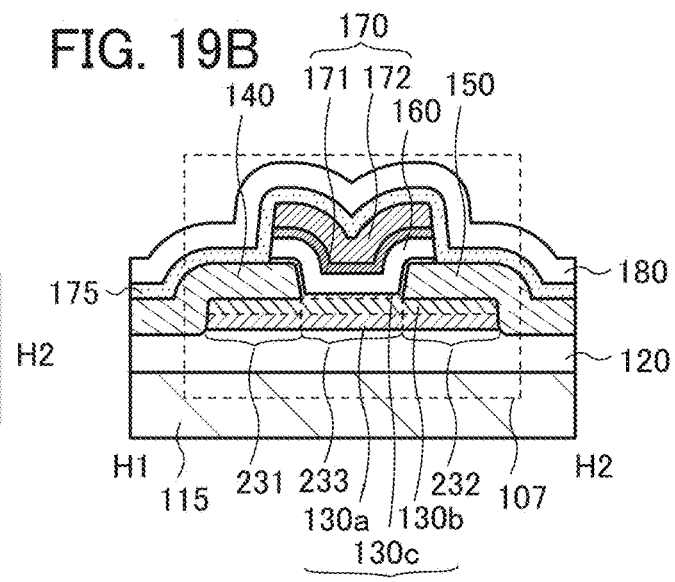
Figure 21A:
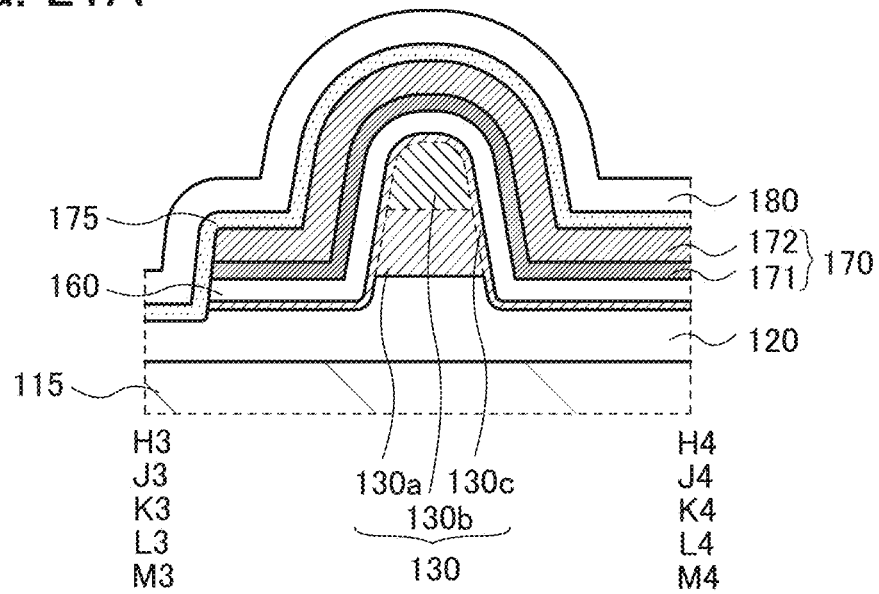
FIGS. 21A to 21D each illustrate a cross section of a transistor in a channel width direction.

The transistor of one embodiment of the present invention may have a structure illustrated in FIGS. 19A and 19B. FIG. 19A is a top view of a transistor 107. A cross section in the direction of dashed-dotted line H1-H2 in FIG. 19A is illustrated in FIG. 19B. A cross section in the direction of dashed-dotted line H3-H4 in FIG. 19A is illustrated in FIG. 21A. The direction of dashed-dotted line H1-H2 is referred to as a channel length direction, and the direction of dashed-dotted line H3-H4 is referred to as a channel width direction.

The transistor 107 includes the insulating layer 120 in contact with the substrate 115; a stack of the oxide semiconductor layers 130a and 130b in contact with the insulating layer 120; the conductive layers 140 and 150 electrically connected to the stack; the oxide semiconductor layer 130c in contact with the stack and the conductive layers 140 and 150; the insulating layer 160 in contact with the oxide semiconductor layer 130c; the conductive layer 170 in contact with the insulating layer 160; the insulating layer 175 in contact with the conductive layers 140 and 150, the oxide semiconductor layer 130c, the insulating layer 160, and the conductive layer 170; and the insulating layer 180 in contact with the insulating layer 175. The insulating layer 180 may function as a planarization film as necessary.

The transistor 107 has the same structure as the transistor 101 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 140 and 150.

Figure 19C:
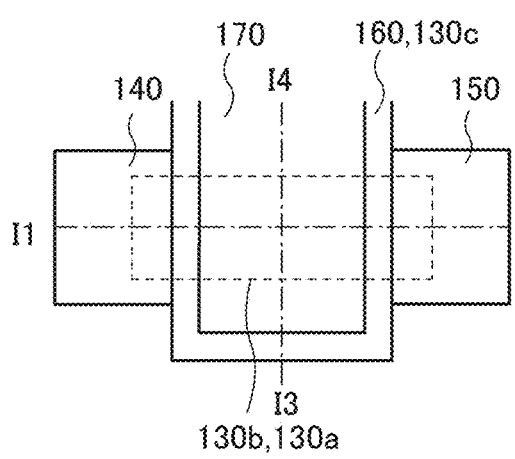
Figure 19D:
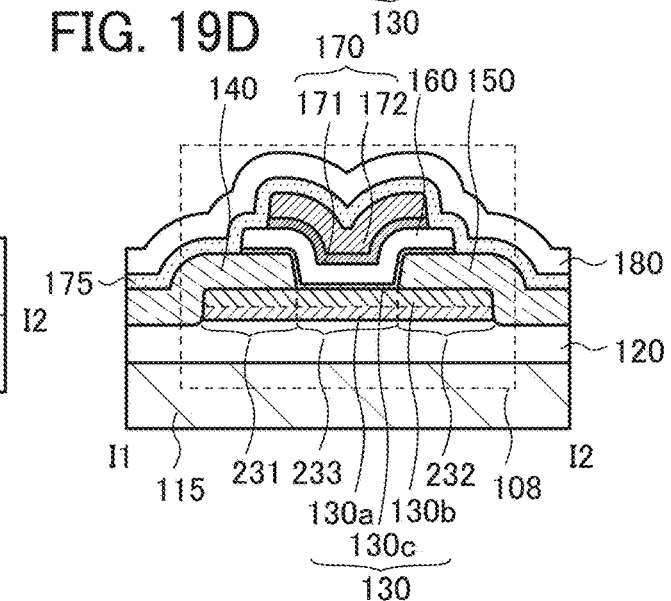
Figure 21B:
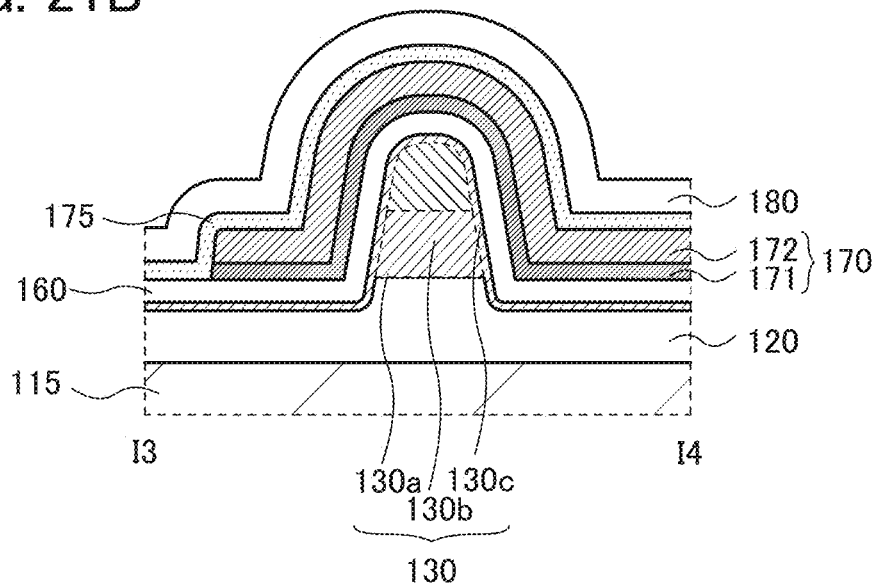

The transistor of one embodiment of the present invention may have a structure illustrated in FIGS. 19C and 19D. FIG. 19C is a top view of a transistor 108. A cross section in the direction of dashed-dotted line I1-I2 in FIG. 19C is illustrated in FIG. 19D. A cross section in the direction of dashed-dotted line I3-I4 in FIG. 19C is illustrated in FIG. 21B. The direction of dashed-dotted line I1-I2 is referred to as a channel length direction, and the direction of dashed-dotted line I3-I4 is referred to as a channel width direction.

The transistor 108 differs from the transistor 107 in that end portions of the insulating layer 160 and the oxide semiconductor layer 130c are not aligned with the end portion of the conductive layer 170.

Figure 19E:
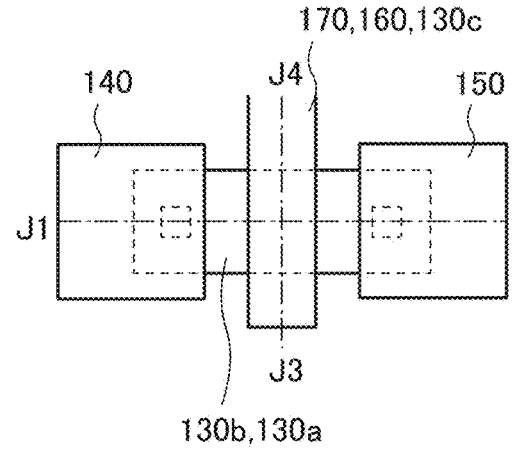
Figure 19F:
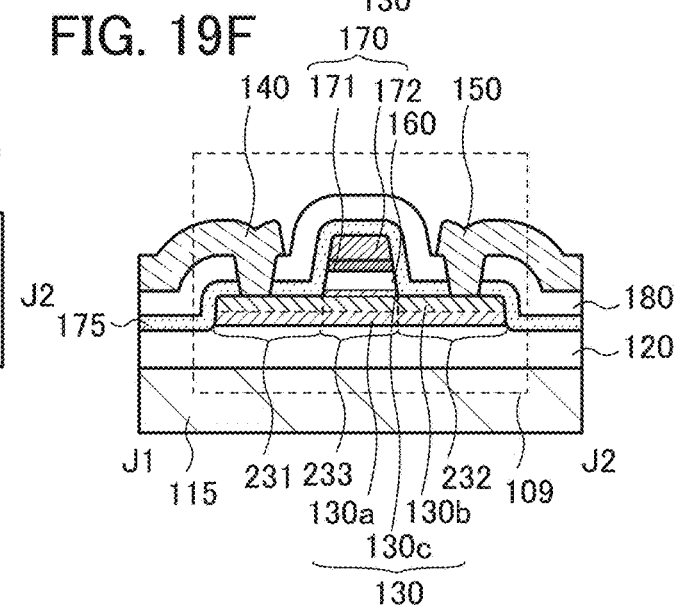

The transistor of one embodiment of the present invention may have a structure illustrated in FIGS. 19E and 19F. FIG. 19E is a top view of a transistor 109. A cross section in the direction of dashed-dotted line J1-J2 in FIG. 19E is illustrated in FIG. 19F. A cross section in the direction of dashed-dotted line J3-J4 in FIG. 19E is illustrated in FIG. 21A. The direction of dashed-dotted line J1-J2 is referred to as a channel length direction, and the direction of dashed-dotted line J3-J4 is referred to as a channel width direction.

The transistor 109 includes the insulating layer 120 in contact with the substrate 115; a stack of the oxide semiconductor layers 130a and 130b in contact with the insulating layer 120; the oxide semiconductor layer 130c in contact with the stack; the insulating layer 160 in contact with the oxide semiconductor layer 130c; the conductive layer 170 in contact with the insulating layer 160; the insulating layer 175 covering the stack, the oxide semiconductor layer 130c, the insulating layer 160, and the conductive layer 170; the insulating layer 180 in contact with the insulating layer 175; and the conductive layers 140 and 150 electrically connected to the stack through openings provided in the insulating layers 175 and 180. The transistor 109 may further include, for example, an insulating layer (planarization film) in contact with the insulating layer 180 and the conductive layers 140 and 150 as necessary.

The transistor 109 has the same structure as the transistor 103 except that the oxide semiconductor layer 130 includes two layers (the oxide semiconductor layers 130a and 130b) in the regions 231 and 232 and that the oxide semiconductor layer 130 includes three layers (the oxide semiconductor layers 130a to 130c) in the region 233.

Figure 20A:
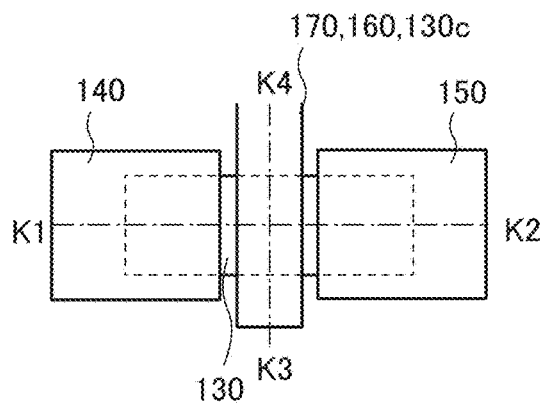
FIGS. 20A to 20F are top views and cross-sectional views illustrating a transistor.
Figure 20B:
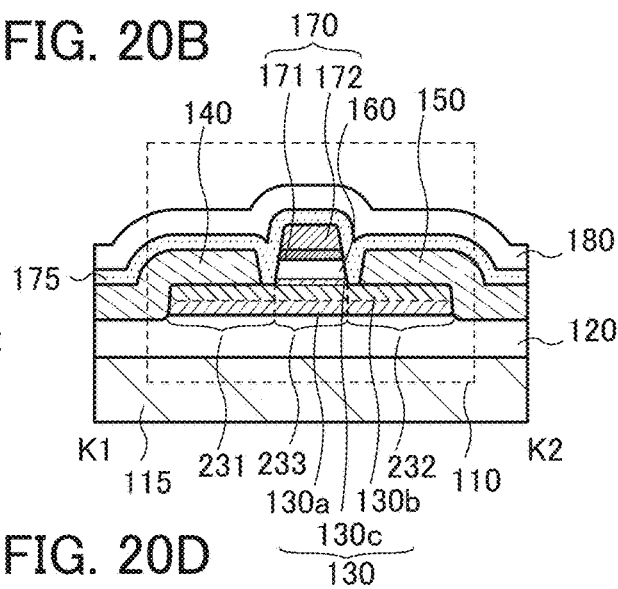

The transistor of one embodiment of the present invention may have a structure illustrated in FIGS. 20A and 20B. FIG. 20A is a top view of a transistor 110. A cross section in the direction of dashed-dotted line K1-K2 in FIG. 20A is illustrated in FIG. 20B. A cross section in the direction of dashed-dotted line K3-K4 in FIG. 20A is illustrated in FIG. 21A. The direction of dashed-dotted line K1-K2 is referred to as a channel length direction, and the direction of dashed-dotted line K3-K4 is referred to as a channel width direction.

The transistor 110 has the same structure as the transistor 104 except that the oxide semiconductor layer 130 includes two layers (the oxide semiconductor layers 130a and 130b) in the regions 331 and 332 and that the oxide semiconductor layer 130 includes three layers (the oxide semiconductor layers 130a to 130c) in the region 333.

Figure 20C:
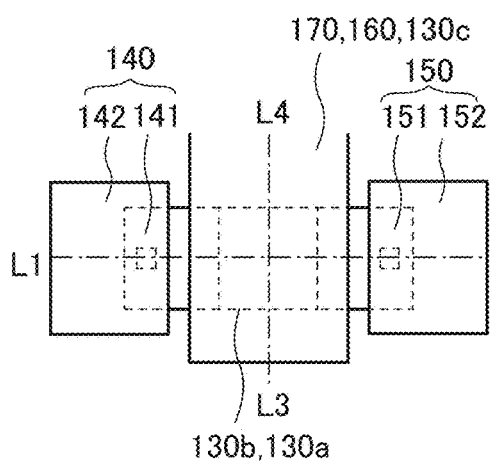
Figure 20D:
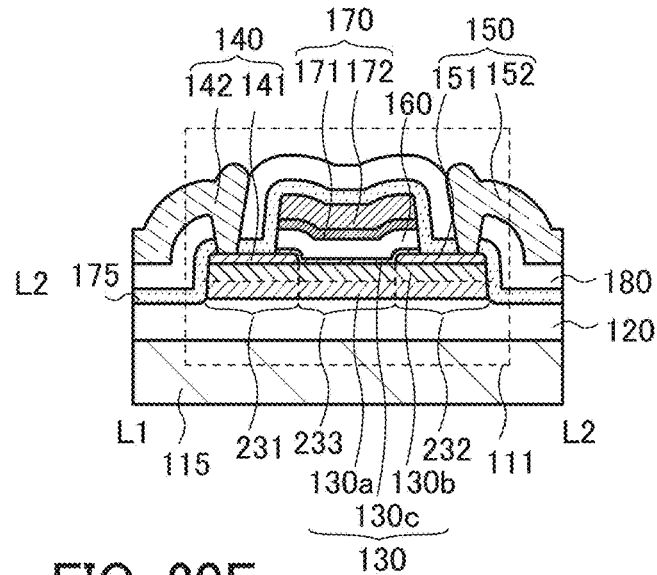

The transistor of one embodiment of the present invention may have a structure illustrated in FIGS. 20C and 20D. FIG. 20C is a top view of a transistor 111. A cross section in the direction of dashed-dotted line L1-L2 in FIG. 20C is illustrated in FIG. 20D. A cross section in the direction of dashed-dotted line L3-L4 in FIG. 20C is illustrated in FIG. 21A. The direction of dashed-dotted line L1-L2 is referred to as a channel length direction, and the direction of dashed-dotted line L3-L4 is referred to as a channel width direction.

The transistor 111 includes the insulating layer 120 in contact with the substrate 115; a stack of the oxide semiconductor layers 130a and 130b in contact with the insulating layer 120; the conductive layers 141 and 151 electrically connected to the stack; the oxide semiconductor layer 130c in contact with the stack and the conductive layers 141 and 151; the insulating layer 160 in contact with the oxide semiconductor layer 130c; the conductive layer 170 in contact with the insulating layer 160; the insulating layer 175 in contact with the stack, the conductive layers 141 and 151, the oxide semiconductor layer 130c, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 111 may further include, for example, an insulating layer (planarization film) in contact with the insulating layer 180 and the conductive layers 142 and 152 as necessary.

The transistor 111 has the same structure as the transistor 105 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 141 and 151.

Figure 20E:
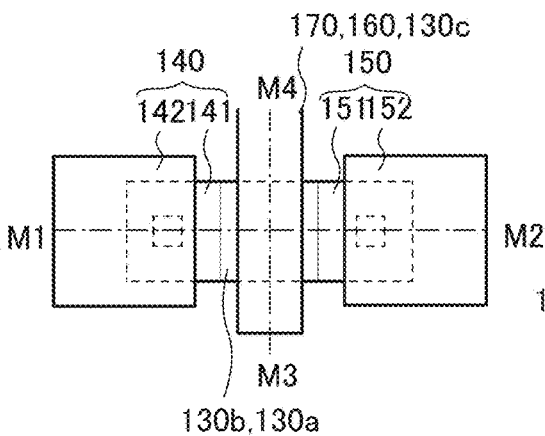
Figure 20F:
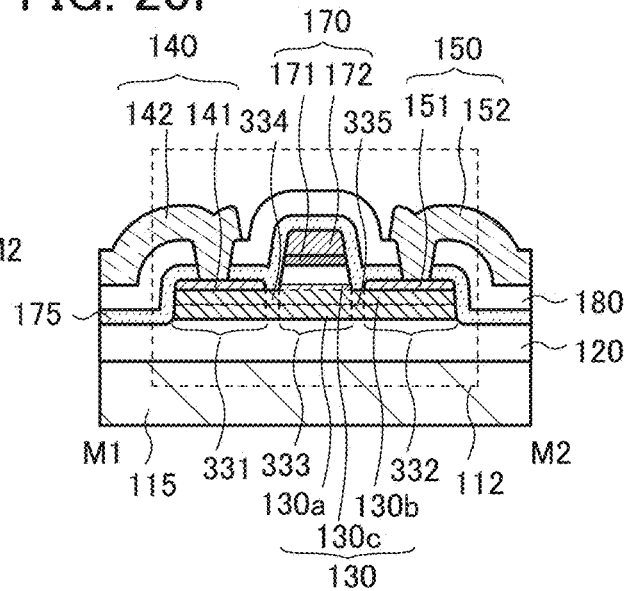

The transistor of one embodiment of the present invention may have a structure illustrated in FIGS. 20E and 20F. FIG. 20E is a top view of a transistor 112. A cross section in the direction of dashed-dotted line M1-M2 in FIG. 20E is illustrated in FIG. 20F. A cross section in the direction of dashed-dotted line M3-M4 in FIG. 20E is illustrated in FIG. 21A. The direction of dashed-dotted line M1-M2 is referred to as a channel length direction, and the direction of dashed-dotted line M3-M4 is referred to as a channel width direction.

The transistor 112 has the same structure as the transistor 106 except that the oxide semiconductor layer 130 includes two layers (the oxide semiconductor layers 130a and 130b) in the regions 331, 332, 334, and 335, and that the oxide semiconductor layer 130 includes three layers (the oxide semiconductor layers 130a to 130c) in the region 333.

Figure 21C:
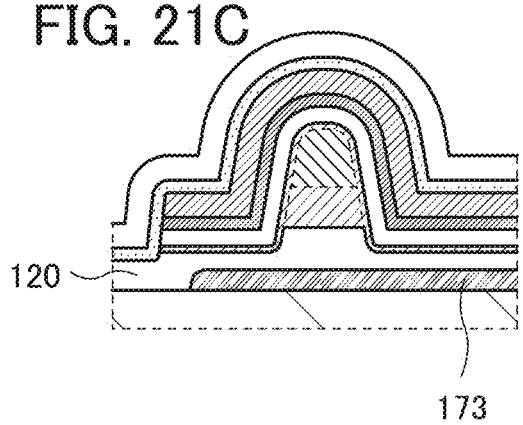
Figure 21D:
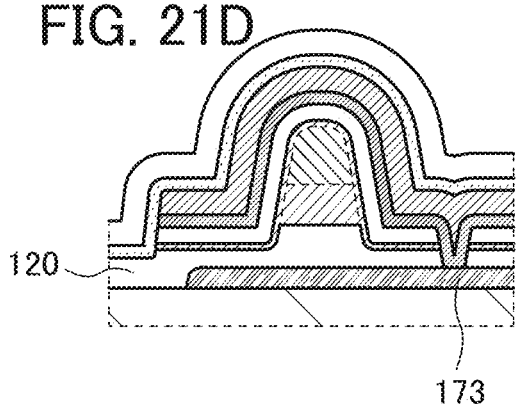
Figure 22A:
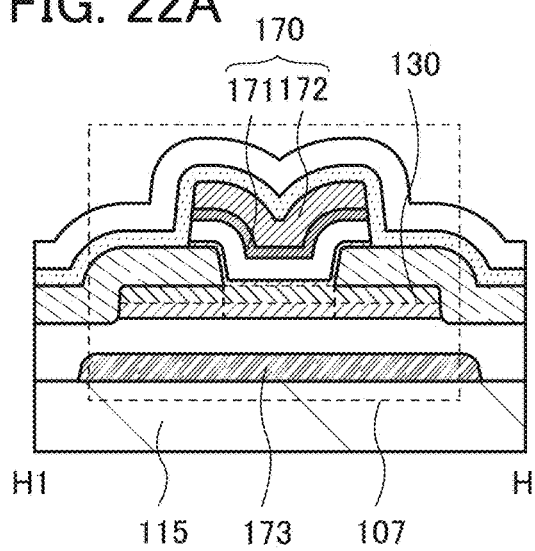
FIGS. 22A to 22F each illustrate a cross section of a transistor in a channel length direction.
Figure 22B:
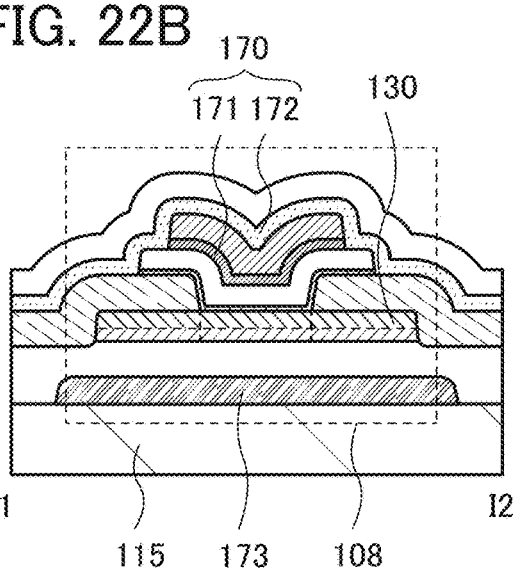
Figure 22C:
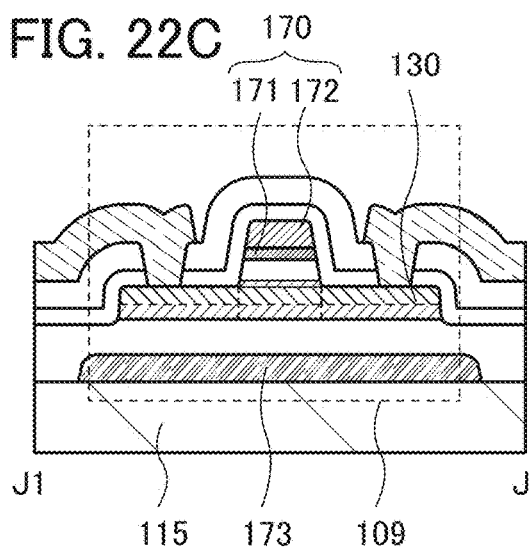
Figure 22D:
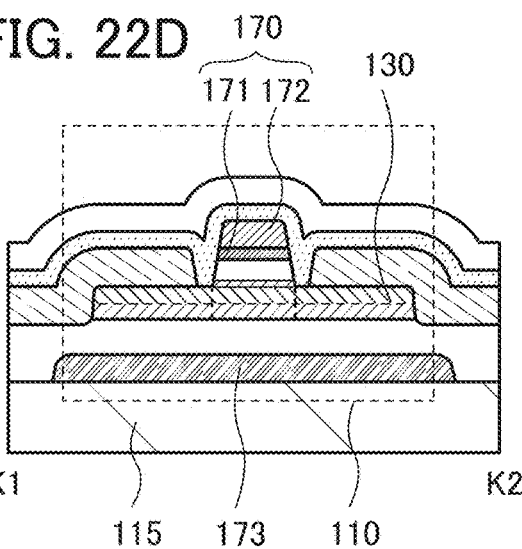
Figure 22E:
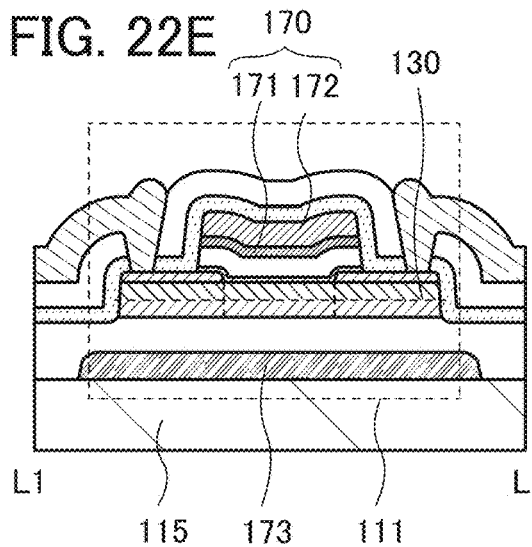
Figure 22F:
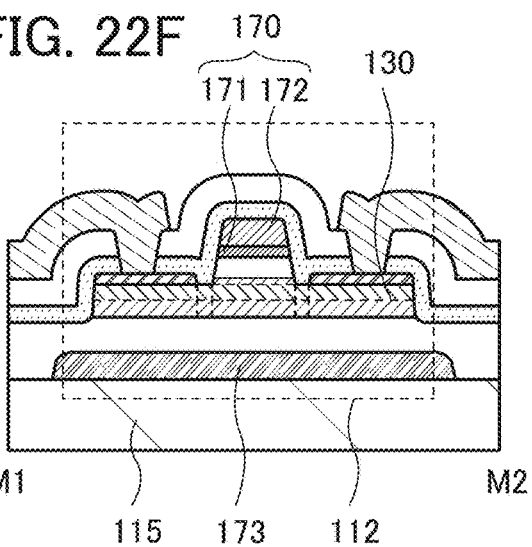

The transistor of one embodiment of the present invention may include the conductive layer 173 between the oxide semiconductor layer 130 and the substrate 115 as illustrated in cross-sectional views in the channel length direction in FIGS. 22A to 22F and cross-sectional views in the channel width direction in FIGS. 21C and 21D. When the conductive layer is used as a second gate electrode layer (back gate), the on-state current can be increased or the threshold voltage can be controlled. In the cross-sectional views in FIGS. 22A to 22F, the width of the conductive layer 173 may be shorter than that of the oxide semiconductor layer 130. Moreover, the width of the conductive layer 173 may be shorter than that of the conductive layer 170.

Figure 23A:
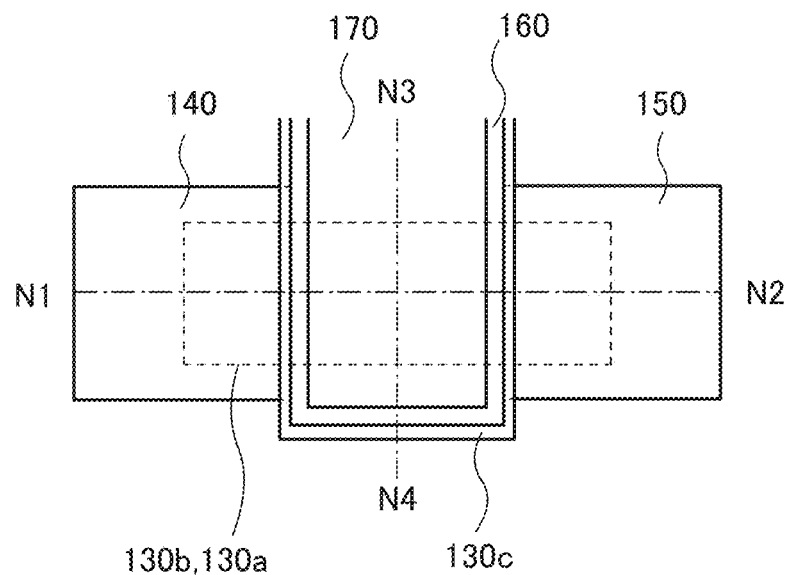
FIGS. 23A and 23B are a top view and a cross-sectional view illustrating a transistor.
Figure 23B:
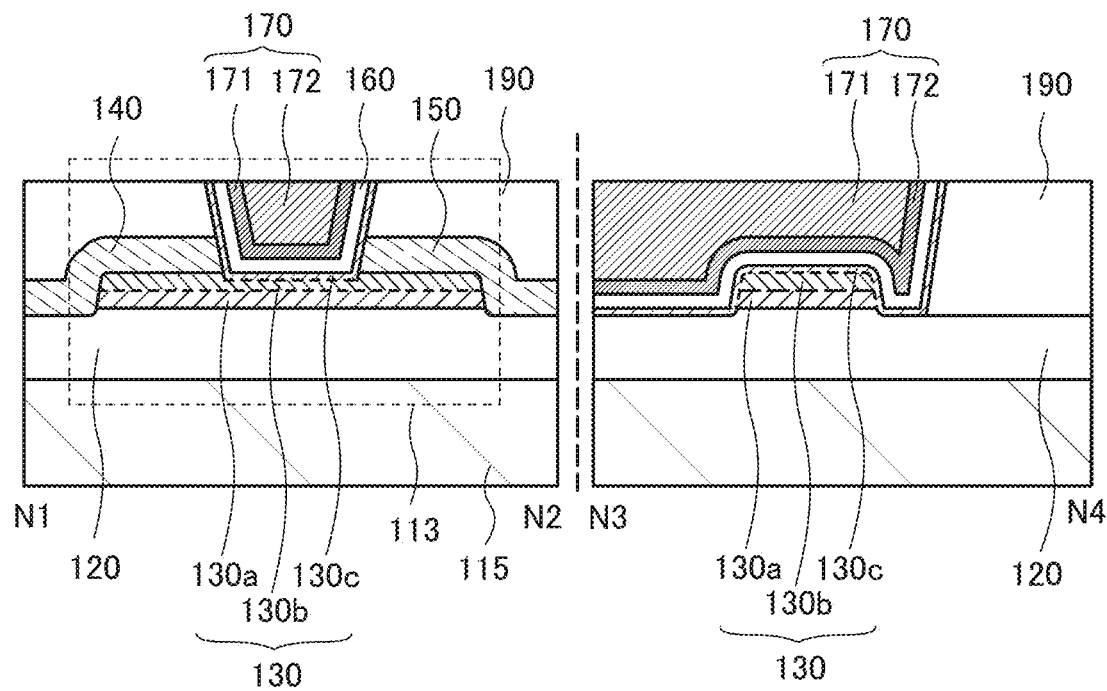

The transistor of one embodiment of the present invention can have a structure illustrated in FIGS. 23A and 23B. FIG. 23A is a top view and FIG. 23B is a cross-sectional view taken along dashed-dotted line N1-N2 and dashed-dotted line N3-N4 in FIG. 23A. Note that for simplification of the drawing, some components are not illustrated in the top view in FIG. 23A.

A transistor 113 in FIGS. 23A and 23B includes the substrate 115, the insulating layer 120 over the substrate 115, the oxide semiconductor layer 130 (the oxide semiconductor layers 130a to 130c) over the insulating layer 120, the conductive layers 140 and 150 that are in contact with the oxide semiconductor layer 130 and are apart from each other, the insulating layer 160 in contact with the oxide semiconductor layer 130c, and the conductive layer 170 in contact with the insulating layer 160. Note that the oxide semiconductor layer 130c, the insulating layer 160, and the conductive layer 170 are provided in an opening that is provided in the insulating layer 190 over the transistor 113 and reaches the oxide semiconductor layers 130a and 130b and the insulating layer 120.

The transistor 113 has a smaller region in which a conductor serving as a source or a drain overlaps with a conductor serving as a gate electrode than the other transistors described above; thus, parasitic capacitance in the transistor 113 can be reduced. Therefore, the transistor 113 is preferable as a component of a circuit that needs high-speed operation. As illustrated in FIG. 23B, a top surface of the transistor 113 is preferably planarized by chemical mechanical polishing (CMP) or the like, but is not necessarily planarized.

Figure 24A:
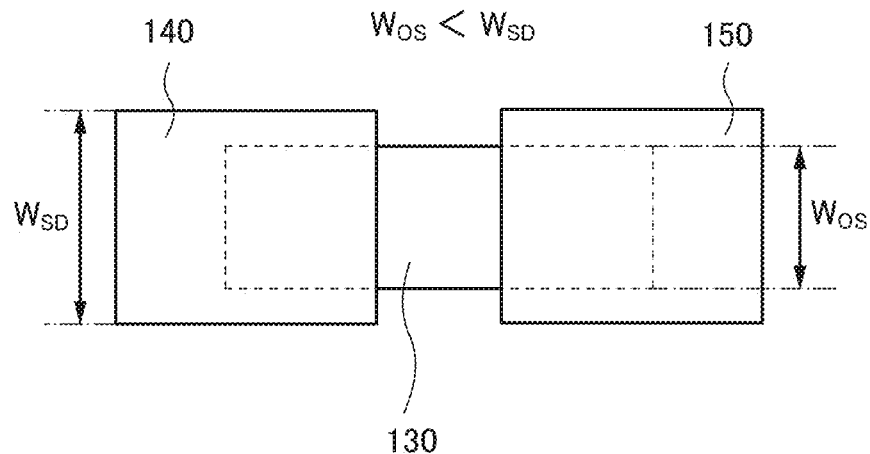
FIGS. 24A to 24C are top views each illustrating a transistor.
Figure 24B:
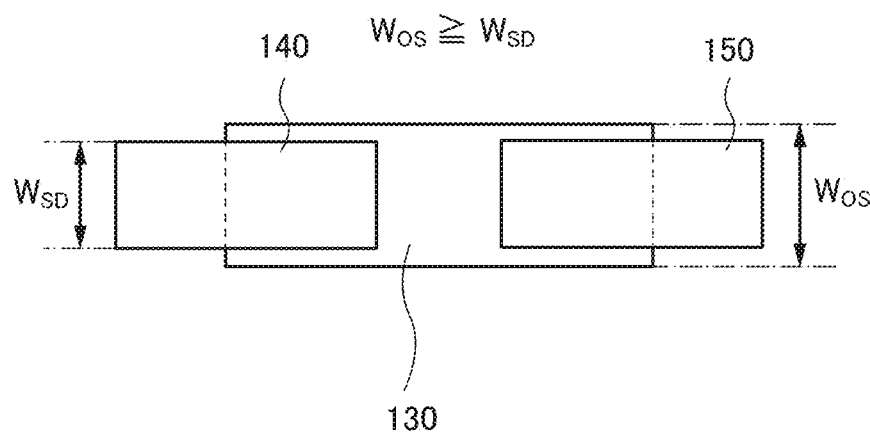
Figure 24C:
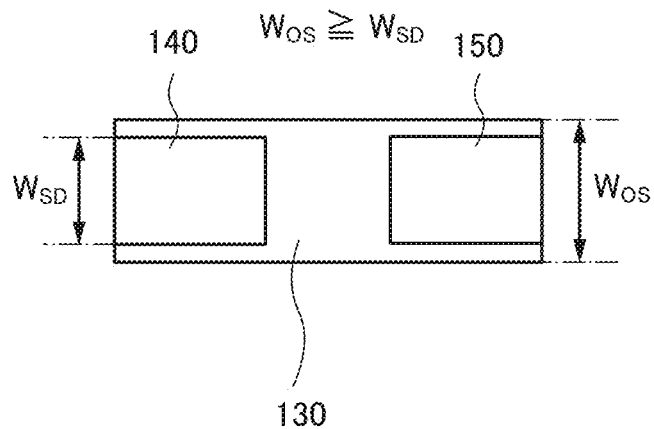

As illustrated in FIGS. 24A and 24B (illustrating only the oxide semiconductor layer 130, the conductive layer 140, and the conductive layer 150), the width ($W_{SD}$) of the conductive layer 140 (source electrode layer) and the conductive layer 150 (drain electrode layer) in the transistor of one embodiment of the present invention may be either longer than or shorter than the width ($W_{OS}$) of the oxide semiconductor layer 130. When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved. As illustrated in FIG. 24C, the conductive layers 140 and 150 may be formed only in a region that overlaps with the oxide semiconductor layer 130.

In the transistor of one embodiment of the present invention (any of the transistors 101 to 113), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layers 130a and 130b and the transistor including the oxide semiconductor layers 130a to 130c, selecting appropriate materials for the two or three layers forming the oxide semiconductor layer 130 makes current flow to the oxide semiconductor layer 130b. Since current flows in the oxide semiconductor layer 130b, the current is hardly influenced by interface scattering, leading to high on-state current. Therefore, increasing the thickness of the oxide semiconductor layer 130b might increase the on-state current.

With the above structure, electrical characteristics of the transistor can be improved.

The structure described in this embodiment can be used in appropriate combination with any of the structures described in the other embodiments.

Embodiment 3

In this embodiment, components of the transistors described in Embodiment 2 will be described in detail.

As the substrate 115, a glass substrate, a quartz substrate, a semiconductor substrate, a ceramic substrate, a metal substrate having a surface subjected to insulation treatment, or the like can be used. Alternatively, a silicon substrate provided with a transistor and/or a photodiode can be used, and an insulating layer, a wiring, a conductor functioning as a contact plug, and the like may be provided over the silicon substrate. Note that when p-channel transistors are formed using the silicon substrate, a silicon substrate with n⁻-type conductivity is preferably used. Alternatively, an SOI substrate including an n⁻-type or i-type silicon layer may be used. In the case where a p-channel transistor is formed using the silicon substrate, a surface of the silicon substrate where the transistor is formed preferably has a (110) plane orientation. Forming a p-channel transistor with the (110) plane can increase mobility.

The insulating layer 120 can have a function of supplying oxygen to the oxide semiconductor layer 130 as well as a function of preventing diffusion of impurities from a component included in the substrate 115. For this reason, the insulating layer 120 is preferably an insulating film containing oxygen and further preferably, the insulating layer 120 is an insulating film containing oxygen in which the oxygen content is higher than that in the stoichiometric composition. For example, the insulating layer 120 is a film of which the amount of released oxygen when converted into oxygen atoms is $1.0 \times 10^{19}$ atoms/cm³ or more in thermal desorption spectroscopy (TDS) analysis performed such that the surface temperature of the film is higher than or equal to 100° C. and lower than or equal to 700° C., and preferably higher than or equal to 100° C. and lower than or equal to 500° C. In the case where the substrate 115 is provided with another device, the insulating layer 120 also functions as an interlayer insulating film. In that case, the insulating layer 120 is preferably subjected to planarization treatment such as CMP so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating layer 120 may be a stack of any of the above materials.

The oxide semiconductor layer 130 can have a three-layer structure in which the oxide semiconductor layers 130a, 130b, and 130c are sequentially stacked from the insulating layer 120 side.

Note that in the case where the oxide semiconductor layer 130 is a single layer, a layer corresponding to the oxide semiconductor layer 130b described in this embodiment is used.

In the case where the oxide semiconductor layer 130 has a two-layer structure, a stack in which a layer corresponding to the oxide semiconductor layer 130a and a layer corresponding to the oxide semiconductor layer 130b are sequentially stacked from the insulating layer 120 side is used. In such a case, the oxide semiconductor layers 130a and 130b can be replaced with each other.

For the oxide semiconductor layer 130b, for example, an oxide semiconductor whose electron affinity (an energy difference between a vacuum level and the conduction band minimum) is higher than those of the oxide semiconductor layers 130a and 130c is used.

In such a structure, when an electric field is applied to the conductive layer 170, a channel is formed in the oxide semiconductor layer 130b whose conduction band minimum is the lowest in the oxide semiconductor layer 130. Therefore, the oxide semiconductor layer 130b can be regarded as having a region serving as a semiconductor, while the oxide semiconductor layer 130a and the oxide semiconductor layer 130c can be regarded as having a region serving as an insulator or a semi-insulator.

An oxide semiconductor that can be used for each of the oxide semiconductor layers 130a to 130c preferably contains at least In or Zn. Both In and Zn are preferably contained. In order to reduce variations in electrical characteristics of the OS transistor, the oxide semiconductor preferably contains a stabilizer such as Al, Ga, Y, or Sn in addition to In and Zn.

The oxide semiconductor layers 130a to 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Tl, Mo, W, Ni, Mn, Nd, and Sc and alloys of any of these metal materials can be used. It is also possible to use a stack of any of the above materials and Cu or an alloy such as Cu—Mn, which has low resistance. In the transistors 105, 106, 111, and 112, for example, it is possible to use W for the conductive layers 141 and 151 and use a stack of Ti and Al for the conductive layers 142 and 152.

The above materials are capable of extracting oxygen from an oxide semiconductor layer. Therefore, in a region of the oxide semiconductor layer that is in contact with any of the above materials, oxygen is released from the oxide semiconductor layer and an oxygen vacancy is formed. Hydrogen slightly contained in the layer and the oxygen vacancy are bonded to each other, so that the region is markedly changed to an n-type region. Accordingly, the n-type region can serve as a source or a drain of the transistor.

In the case where W is used for the conductive layers 140 and 150, the conductive layers 140 and 150 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 140 and 150 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials. The insulating layer 160 may contain La, N, Zr, or the like as an impurity.

An example of a stacked structure of the insulating layer 160 is described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constants than silicon oxide and silicon oxynitride. Therefore, the insulating layer 160 using hafnium oxide or aluminum oxide can have larger thickness than the insulating layer 160 using silicon oxide, so that leakage current due to tunnel current can be reduced. That is, a transistor with low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with low off-state current. Examples of the crystal structure include a monoclinic crystal structure and a cubic crystal structure. Note that one embodiment of the present invention is not limited to the above examples.

For the insulating layers 120 and 160 in contact with the oxide semiconductor layer 130, a film that releases less nitrogen oxide is preferably used. In the case where the oxide semiconductor is in contact with an insulating layer that releases a large amount of nitrogen oxide, the density of states due to nitrogen oxide becomes high in some cases. For the insulating layers 120 and 160, for example, an oxide insulating layer such as a silicon oxynitride film or an aluminum oxynitride film that releases less nitrogen oxide can be used.

The silicon oxynitride film that releases less nitrogen oxide is a film that releases ammonia more than nitrogen oxide in TDS; the amount of released ammonia is typically greater than or equal to $1\times10^{18}$ cm$^{-3}$ and less than or equal to $5\times10^{19}$ cm$^{-3}$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating layer for the insulating layers 120 and 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, T1, Cr, Co, Ni, Cu, Y, Zr, Mo, Ru, Ag, Mn, Nd, Sc, Ta, W, or the like can be used. Alternatively, an alloy or a conductive nitride of any of these materials may be used. Alternatively, a stack of a plurality of materials selected from these materials, alloys of these materials, and conductive nitrides of these materials may be used. Typically, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 171 and tungsten is used for the conductive layer 172 to form the conductive layer 170.

Furthermore, as the conductive layer 170, an oxide conductive layer of an In—Ga—Zn oxide, zinc oxide, indium oxide, tin oxide, indium tin oxide, or the like may be used.

As the insulating layer 175, a silicon nitride film, an aluminum nitride film, or the like containing hydrogen can be used. In the transistors 103, 104, 106, 109, 110, and 112 described in Embodiment 2, when an insulating film containing hydrogen is used as the insulating layer 175, part of the oxide semiconductor layer can have n-type conductivity. In addition, a nitride insulating film also functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 2. The aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120.

The insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. In this manner, stable electrical characteristics of the transistor can be achieved.

High integration of a semiconductor device requires miniaturization of a transistor. However, miniaturization of a transistor tends to cause deterioration of electrical characteristics of the transistor. For example, a decrease in channel width causes a reduction in on-state current.

In the transistors 107 to 112 of one embodiment of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor of one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and effective channel width is increased, leading to a further increase in the on-state current.

Although the variety of films such as the metal films, the semiconductor films, and the inorganic insulating films that are described in this embodiment typically can be formed by sputtering or plasma-enhanced CVD, such films may be formed by another method such as thermal CVD. Examples of thermal CVD include metal organic chemical vapor deposition (MOCVD) and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas is introduced to be adsorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal films, the semiconductor films, and the inorganic insulating films that have been disclosed in the embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed with a deposition apparatus using ALD, two kinds of gases, i.e., ozone ($O_3$) as an oxidizer and a source material gas which is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide) hafnium) are used.

For example, in the case where an aluminum oxide film is formed with a deposition apparatus using ALD, two kinds of gases, i.e., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed with a deposition apparatus using ALD, hexachlorodisilane is adsorbed on a surface where a film is to be formed, and radicals of an oxidizing gas (e.g., $O_2$ or dinitrogen monoxide) are supplied to react with the adsorbate.

For example, in the case where a tungsten film is formed with a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor layer, e.g., an In—Ga—Zn—O film, is formed with a deposition apparatus using ALD, an $In(CH_3)_3$ gas and an $O_3$ gas) are sequentially introduced to form an In—O layer, a $Ga(CH_3)_3$ gas and an $O_3$ gas) are sequentially introduced to form a Ga—O layer, and then a $Zn(CH_3)_2$ gas and an $O_3$ gas) are sequentially introduced to form a Zn—O layer. Note that the order of these layers is not limited to this example. A mixed compound layer such as an In—Ga—O layer, an In—Zn—O layer, or a Ga—Zn—O layer may be formed by using these gases. Although an $H_2O$ gas which is obtained by bubbling with an inert gas such as Ar may be used instead of an $O_3$ gas), it is preferable to use an $O_3$ gas), which does not contain H.

A facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in a film can be reduced. In addition, the use of the facing-target-type sputtering apparatus enables low-pressure deposition. Accordingly, the concentration of impurities (e.g., hydrogen, a rare gas (e.g., argon), or water) in a deposited oxide semiconductor layer can be lowered.

The structure described above in this embodiment can be combined with any of the structures described in the other embodiments as appropriate.

Embodiment 4

In this embodiment, the material of an oxide semiconductor that can be used for one embodiment of the present invention will be described.

An oxide semiconductor preferably contains at least indium or zinc. In particular, indium and zinc are preferably contained. In addition, aluminum, gallium, yttrium, tin, or the like is preferably contained as an element M. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained as an element M.

Here, the case where an oxide semiconductor contains indium, an element M, and zinc is considered.

First, preferred ranges of the atomic ratio of indium, the element M, and zinc contained in an oxide semiconductor of the present invention are described with reference to FIGS. 25A to 25C. Note that the proportion of oxygen atoms is not shown. The terms of the atomic ratio of indium, the element M, and zinc contained in the oxide semiconductor are denoted by [In], [M], and [Zn], respectively.

Figure 25A:
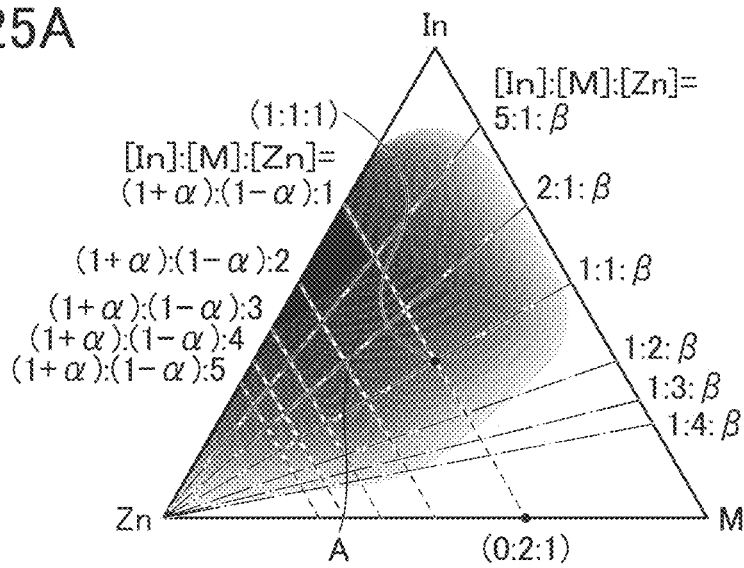
FIGS. 25A to 25C each show the range of the atomic ratio of an oxide semiconductor.
Figure 25B:
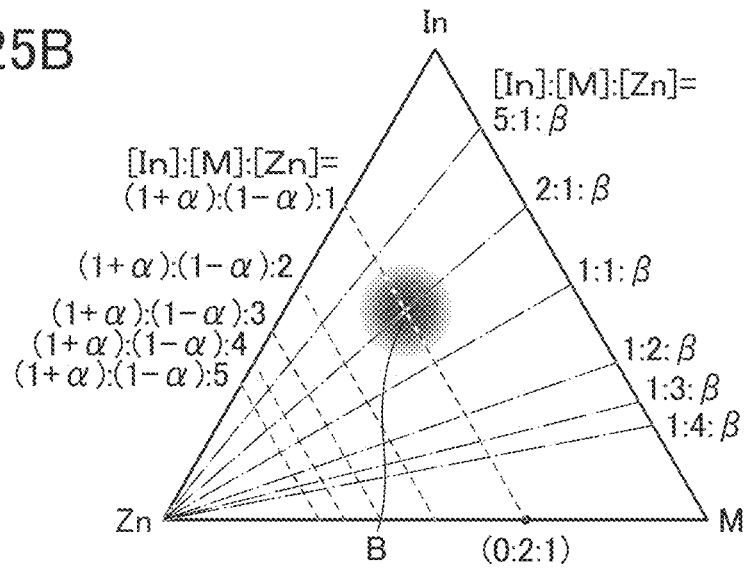
Figure 25C:
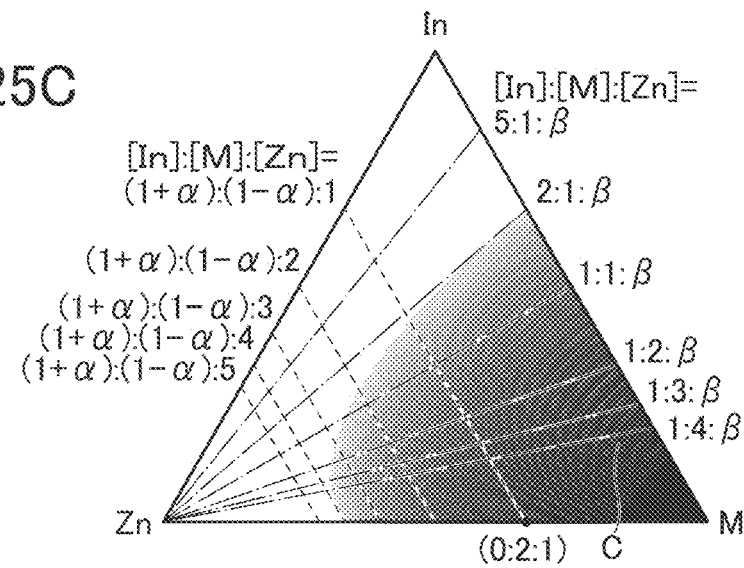

In FIGS. 25A to 25C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1\beta$, where $\beta \geq 0$, a line where the atomic ratio [In]:[M]:[Zn] is $1:2\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1\beta$, and a line where the atomic ratio [In]:[M]:[Zn] is $5:1:\beta$.

Furthermore, an oxide semiconductor with the atomic ratio of [In]:[M]:[Zn]=0:2:1 or a neighborhood thereof in FIGS. 25A to 25C tends to have a spinel crystal structure.

FIGS. 25A and 25B show examples of the preferred ranges of the atomic ratio of indium, the element M, and zinc contained in an oxide semiconductor of one embodiment of the present invention.

Figure 26:
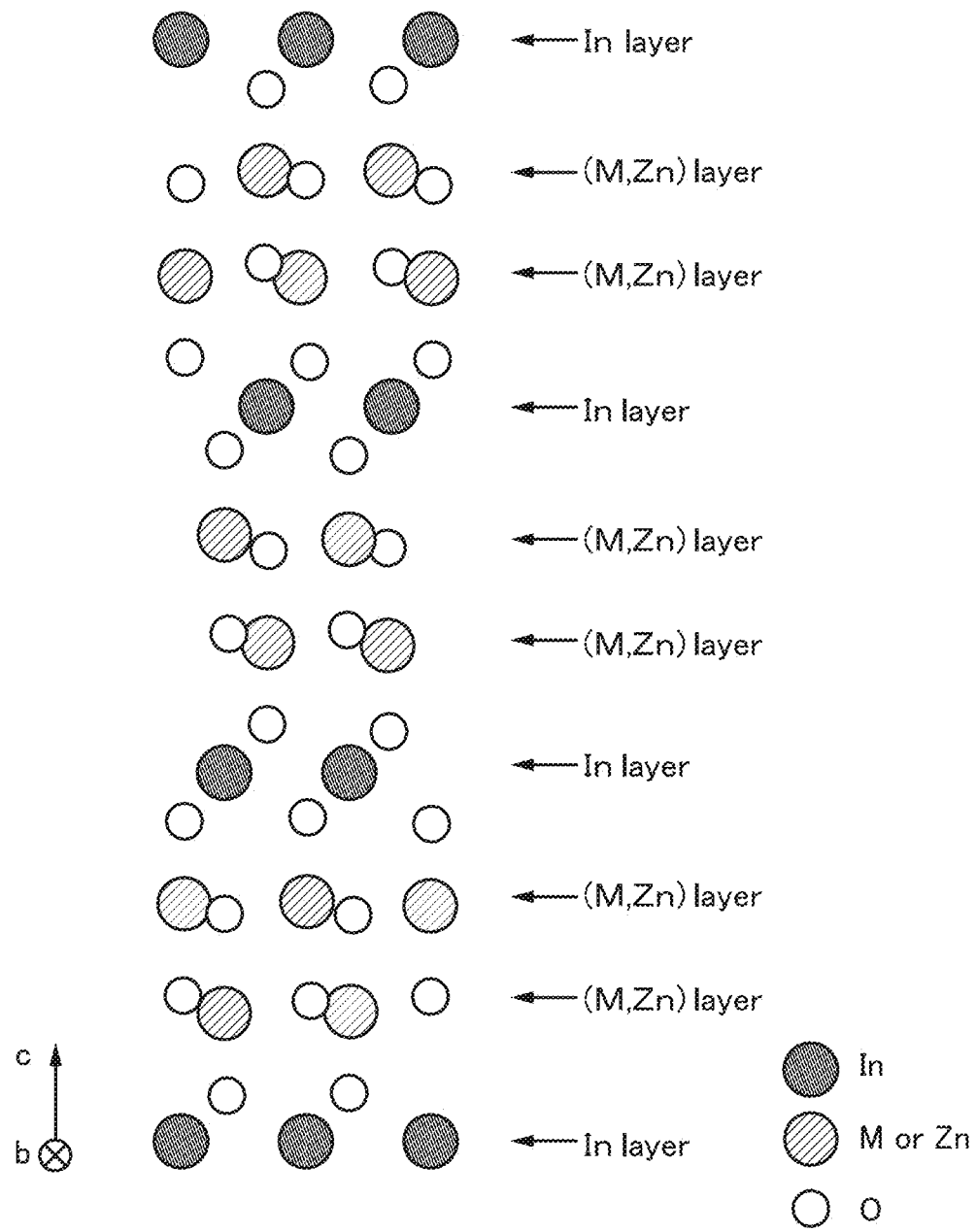
FIG. 26 shows the crystal structure of $InMZnO_4$.

FIG. 26 shows an example of the crystal structure of InMZnO$_4$ whose atomic ratio [In]:[M]:[Zn] is 1:1:1. The crystal structure shown in FIG. 26 is of InMZnO$_4$ observed from a direction parallel to a b-axis. Note that a metal element in a layer that contains M, Zn, and oxygen (hereinafter, this layer is referred to as an "(M,Zn) layer") in FIG. 26 represents the element M or zinc. In that case, the proportion of the element M is the same as the proportion of zinc. The element M and zinc can be replaced with each other, and their arrangement is random.

InMZnO$_4$ has a layered crystal structure (also referred to as a layered structure) and includes one layer that contains indium and oxygen (hereinafter referred to as an In layer) for every two (M,Zn) layers that contain the element M, zinc, and oxygen, as shown in FIG. 26.

Indium and the element M can be replaced with each other. Therefore, when the element M in the (M,Zn) layer is replaced with indium, the layer can also be referred to as an (In,M,Zn) layer. In that case, a layered structure that contains one In layer for every two (In,M,Zn) layers is obtained.

An oxide semiconductor whose atomic ratio [In]:[M]:[Zn] is 1:1:2 has a layered structure that contains one In layer for every three (M,Zn) layers. In other words, if [Zn] is higher than [In] and [M], the proportion of the (M,Zn) layer to the In layer becomes higher when the oxide semiconductor is crystallized.

Note that in the case where the number of (M,Zn) layers for every In layers is not an integer in the oxide semiconductor, the oxide semiconductor might have plural kinds of layered structures where the number of (M,Zn) layers for every In layers is an integer. For example, in the case of [In]:[M]:[Zn]=1:1:1.5, the oxide semiconductor might have the following layered structures: a layered structure of one In layer for every two (M,Zn) layers and a layered structure of one In layer for every three (M,Zn) layers.

For example, in the case where the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

In addition, the oxide semiconductor containing indium in a higher proportion can have high carrier mobility (electron mobility). This is because in an oxide semiconductor containing indium, the element M, and zinc, the s orbital of heavy metal mainly contributes to carrier transfer, and when the indium content in the oxide semiconductor is increased, overlaps of the s orbitals of indium atoms are increased; therefore, an oxide semiconductor having a high content of indium has higher carrier mobility than an oxide semiconductor having a low content of indium.

In contrast, when the indium content and the zinc content in an oxide semiconductor become lower, carrier mobility becomes lower. Thus, with an atomic ratio of [In]:[Zn]=0:1:0 and the vicinity thereof (e.g., a region C in FIG. 25C), insulation performance becomes better.

Accordingly, an oxide semiconductor in one embodiment of the present invention preferably has an atomic ratio represented by a region A in FIG. 25A. With the atomic ratio, a layered structure with high carrier mobility and a few grain boundaries is easily obtained.

A region B in FIG. 25B represents an atomic ratio of [In]:[Zn]=4:2:3 to 4:2:4.1 and the vicinity thereof. The vicinity includes an atomic ratio of [In]:[M]:[Zn]=5:3:4. An oxide semiconductor with an atomic ratio represented by the region B is an excellent oxide semiconductor that has particularly high crystallinity and high carrier mobility.

Note that a condition where an oxide semiconductor forms a layered structure is not uniquely determined by an atomic ratio. There is a difference in the degree of difficulty in forming a layered structure among atomic ratios. Even with the same atomic ratio, whether a layered structure is formed or not depends on a formation condition. Therefore, the illustrated regions each represent an atomic ratio with which an oxide semiconductor has a layered structure, and boundaries of the regions A to C are not clear.

Next, the case where the oxide semiconductor is used for a transistor is described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. For example, an oxide semiconductor whose carrier density is lower than $8 \times 10^{11}/cm^3$, preferably lower than $1\times10^{11}/cm^3$, further preferably lower than $1\times10^{10}/cm^3$, and greater than or equal to $1\times10^{-9}/cm^3$ is used.

A highly purified intrinsic or substantially highly purified intrinsic oxide semiconductor has few carrier generation sources and thus can have a low carrier density. The highly purified intrinsic or substantially highly purified intrinsic oxide semiconductor has a low density of defect states and accordingly has a low density of trap states in some cases.

Charge trapped by the trap states in the oxide semiconductor takes a long time to be released and may behave like fixed charge. Thus, a transistor whose channel region is formed in an oxide semiconductor having a high density of trap states has unstable electrical characteristics in some cases.

In order to obtain stable electrical characteristics of the transistor, it is effective to reduce the concentration of impurities in the oxide semiconductor. In addition, in order to reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

Here, the influence of impurities in the oxide semiconductor is described.

When silicon or carbon that is one of Group 14 elements is contained in the oxide semiconductor, defect states are formed. Thus, the oxide semiconductor is formed to have a region where the concentration of silicon or carbon (measured by secondary ion mass spectrometry (SIMS)) is controlled to be lower than or equal to $2\times10^{18}$ atoms/$cm^3$, preferably lower than or equal to $2\times10^{17}$ atoms/$cm^3$ in the oxide semiconductor or around an interface with the oxide semiconductor.

When the oxide semiconductor contains alkali metal or alkaline earth metal, defect states are formed and carriers are generated, in some cases. Thus, an OS transistor that contains alkali metal or alkaline earth metal is likely to be normally-on. Therefore, it is preferable to reduce the concentration of alkali metal or alkaline earth metal in the oxide semiconductor. Specifically, the oxide semiconductor is formed to have a region where the concentration of alkali metal or alkaline earth metal measured by SIMS is controlled to be lower than or equal to $1\times10^{18}$ atoms/$cm^3$, preferably lower than or equal to $2\times10^{16}$ atoms/$cm^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; the oxide semiconductor is formed to have a region where the concentration of nitrogen measured by SIMS is, for example, controlled to be lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still more preferably lower than or equal to $5\times10^{17}$ atoms/$cm^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, an OS transistor that contains hydrogen is likely to be normally-on. Accordingly, it is preferable that hydrogen in the oxide semiconductor be reduced as much as possible. Specifically, the oxide semiconductor is formed to have a region where the concentration of hydrogen measured by SIMS is controlled to be lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurity concentration is used for a channel formation region in a transistor, the transistor can have stable electrical characteristics. The transistor in which a highly purified oxide semiconductor is used for a channel formation region exhibits extremely low off-state current. When voltage between a source and a drain is set to about 0.1 V, 5 V, or 10 V, for example, the off-state current per channel width of the transistor can be as low as several yoctoamperes per micrometer to several zeptoamperes per micrometer.

Next, the case where the oxide semiconductor has a two-layer structure or a three-layer structure is described. A band diagram of insulators that are in contact with a stacked structure of an oxide semiconductor S1, an oxide semiconductor S2, and an oxide semiconductor S3 and a band diagram of insulators that are in contact with a stacked structure of the oxide semiconductor S2 and the oxide semiconductor S3 are described with reference to FIGS. 27A and 27B. Note that the oxide semiconductor S1, the oxide semiconductor S2, and the oxide semiconductor S3 correspond to the oxide semiconductor layer 130a, the oxide semiconductor layer 130b, and the oxide semiconductor layer 130c, respectively.

Figure 27A:
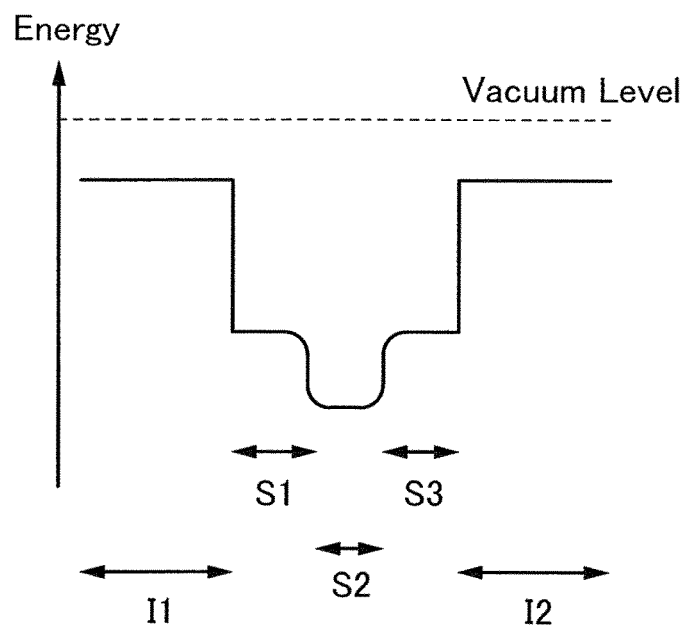
FIGS. 27A and 27B are band structures in a stacked-layer structure of an oxide semiconductor.
Figure 27B:
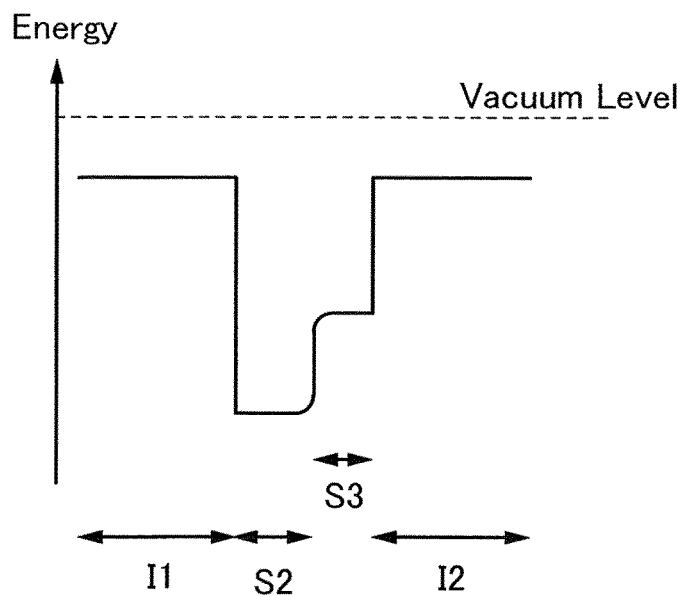

FIG. 27A is an example of a band diagram of a stacked structure including an insulator I1, the oxide semiconductor S1, the oxide semiconductor S2, the oxide semiconductor S3, and an insulator I2 in a film thickness direction. FIG. 27B is an example of a band diagram of a stacked structure including the insulator I1, the oxide semiconductor S2, the oxide semiconductor S3, and the insulator I2 in a film thickness direction. Note that for easy understanding, the band diagrams show the energy level of the conduction band minimum (Ec) of each of the insulator I1, the oxide semiconductor S1, the oxide semiconductor S2, the oxide semiconductor S3, and the insulator I2.

The energy level of the conduction band minimum of each of the oxide semiconductors S1 and S3 is closer to the vacuum level than that of the oxide semiconductor S2. Typically, a difference in energy level between the conduction band minimum of the oxide semiconductor S2 and the conduction band minimum of each of the oxide semiconductors S1 and S3 is preferably greater than or equal to 0.15 eV or greater than or equal to 0.5 eV, and less than or equal to 2 eV or less than or equal to 1 eV. That is, the electron affinity of the oxide semiconductor S2 is higher than the electron affinity of each of the oxide semiconductors S1 and S3, and the difference between the electron affinity of each of the oxide semiconductors S1 and S3 and the electron affinity of the oxide semiconductor S2 is greater than or equal to 0.15 eV or greater than or equal to 0.5 eV, and less than or equal to 2 eV or less than or equal to 1 eV.

As shown in FIGS. 27A and 27B, the energy level of the conduction band minimum of each of the oxide semiconductors S1 to S3 is gradually varied. In other words, the energy level of the conduction band minimum is continuously varied or continuously connected. In order to obtain such a band diagram, the density of defect states in a mixed layer formed at an interface between the oxide semiconductors S1 and S2 or an interface between the oxide semiconductors S2 and S3 is preferably made low.

Specifically, when the oxide semiconductors S1 and S2 or the oxide semiconductors S2 and S3 contain the same element (as a main component) in addition to oxygen, a mixed layer with a low density of defect states can be formed. For example, in the case where the oxide semiconductor S2 is an In—Ga—Zn oxide semiconductor, it is preferable to use an In—Ga—Zn oxide semiconductor, a Ga—Zn oxide semiconductor, gallium oxide, or the like as each of the oxide semiconductors S1 and S3.

At this time, the oxide semiconductor S2 serves as a main carrier path. Since the density of defect states at the interface between the oxide semiconductors S1 and S2 and the interface between the oxide semiconductors S2 and S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The oxide semiconductors S1 and S3 can make the trap state apart from the oxide semiconductor S2. This structure can prevent the positive shift of the threshold voltage of the transistor.

A material whose conductivity is sufficiently lower than that of the oxide semiconductor S2 is used for the oxide semiconductors S1 and S3. In that case, the oxide semiconductor S2, the interface between the oxide semiconductors S1 and S2, and the interface between the oxide semiconductors S2 and S3 mainly function as a channel region. For example, an oxide semiconductor with high insulation performance and the atomic ratio represented by the region C in FIG. 25C may be used as the oxide semiconductors S1 and S3.

In the case where an oxide semiconductor with the atomic ratio represented by the region A is used as the oxide semiconductor S2, it is particularly preferable to use an oxide semiconductor with an atomic ratio where [M]/[In] is greater than or equal to 1, preferably greater than or equal to 2 as each of the oxide semiconductors S1 and S3. In addition, it is suitable to use an oxide semiconductor with sufficiently high insulation performance and an atomic ratio where [M]/([Zn]+[In]) is greater than or equal to 1 as the oxide semiconductor S3.

The structure described above in this embodiment can be combined with any of the structures described in the other embodiments as appropriate.

Embodiment 5

The structure of an oxide semiconductor that can be used for one embodiment of the present invention is described below.

In this specification, the term "parallel" indicates that the angle formed between two straight lines is greater than or equal to $-10°$ and less than or equal to $10°$, and accordingly includes the case where the angle is greater than or equal to $-5°$ and less than or equal to $5°$. The term "perpendicular" indicates that the angle formed between two straight lines is greater than or equal to $80°$ and less than or equal to $100°$, and accordingly includes the case where the angle is greater than or equal to $85°$ and less than or equal to $95°$.

In this specification, the trigonal and rhombohedral crystal systems are included in the hexagonal crystal system.

<Structure of Oxide Semiconductor>

The structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 28A:
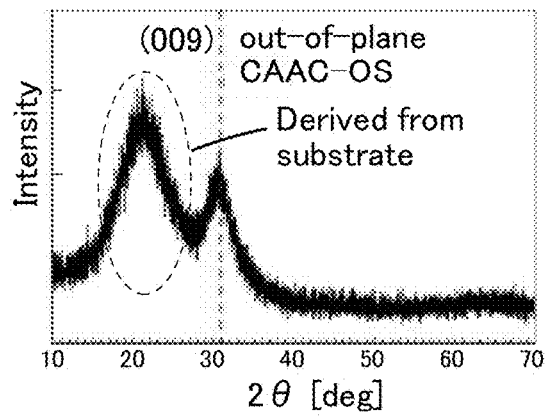
FIGS. 28A to 28E show structural analysis results of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 28A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 28B:
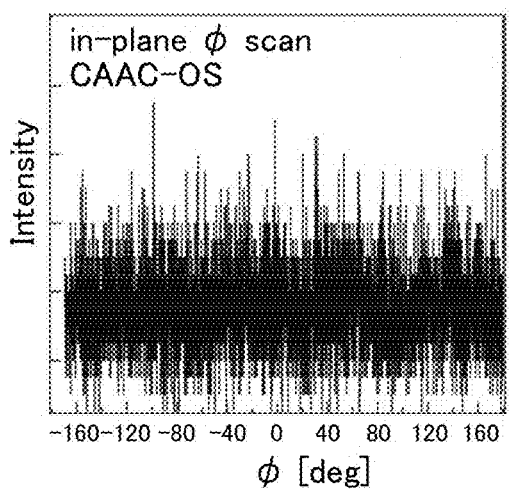
Figure 28C:
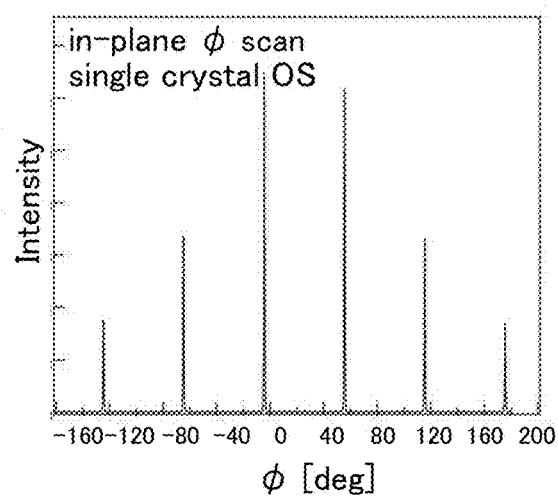

On the other hand, in structural analysis of the CAAC-OS by an in-plane method in which an X-ray is incident on the CAAC-OS in a direction parallel to the formation surface, a peak appears at a 2θ of around 56°. This peak is derived from the (110) plane of the InGaZnO$_4$ crystal. When analysis (φ scan) is performed with 2θ fixed at around 56° and with the sample rotated using a normal vector to the sample surface as an axis (φ axis), as shown in FIG. 28B, a peak is not clearly observed. In contrast, in the case where single crystal InGaZnO$_4$ is subjected to φ scan with 2θ fixed at around 56°, as shown in FIG. 28C, six peaks which are derived from crystal planes equivalent to the (110) plane are observed. Accordingly, the structural analysis using XRD shows that the directions of a-axes and b-axes are irregularly oriented in the CAAC-OS.

Figure 28D:
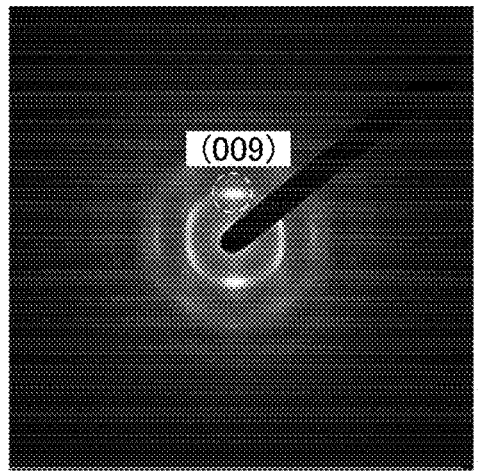
Figure 28E:
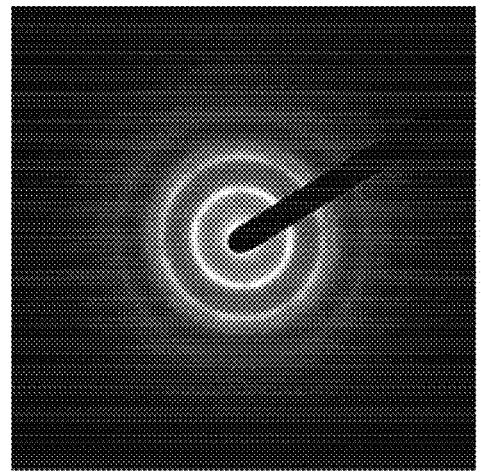

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 28D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 28E shows a diffraction pattern obtained in such a manner that an electron beam with a probe diameter of 300 nm is incident on the same sample in a direction perpendicular to the sample surface. As shown in FIG. 28E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 28E is considered to be derived from the (010) plane, the (100) plane, and the like of the InGaZnO$_4$ crystal. The second ring in FIG. 28E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 29A:
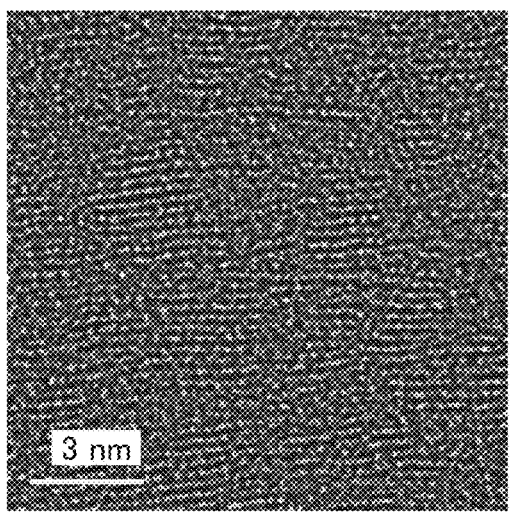
FIGS. 29A to 29E show a cross-sectional TEM image and plan-view TEM images of a CAAC-OS and images obtained through analysis thereof.

FIG. 29A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 29A shows pellets in which metal atoms are arranged in a layered manner. FIG. 29A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 29B:
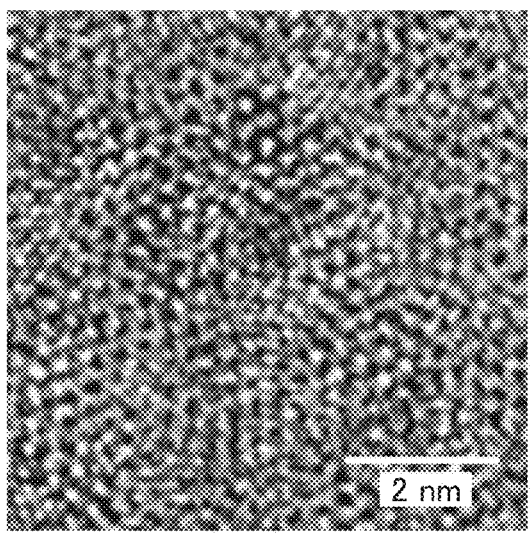
Figure 29C:
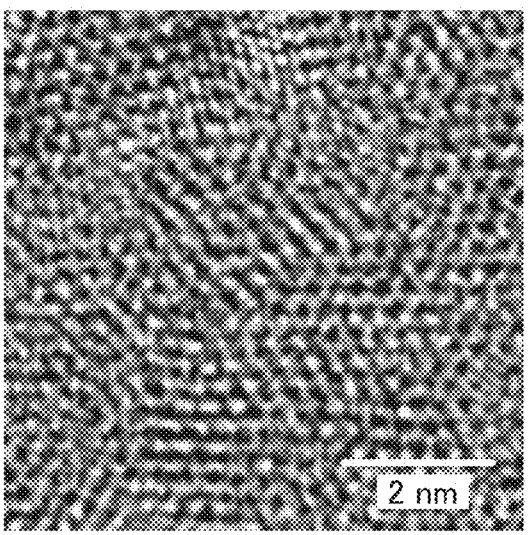
Figure 29D:
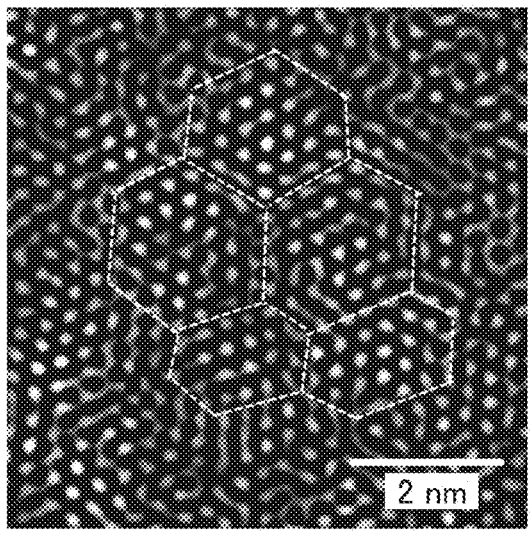
Figure 29E:
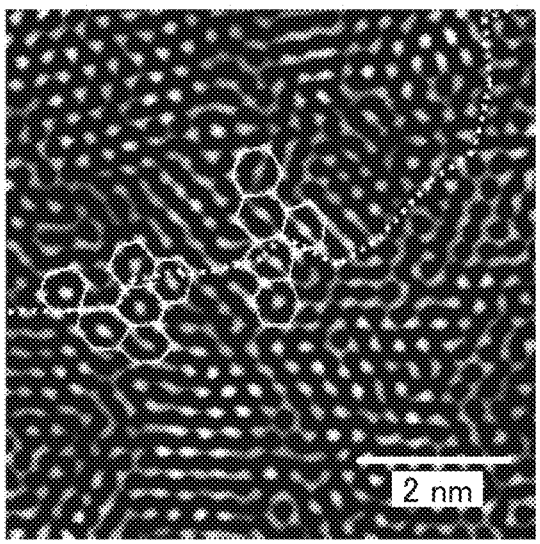

FIGS. 29B and 29C show Cs-corrected high-resolution TEM images of a plane of the CAAC-OS observed from a direction substantially perpendicular to the sample surface. FIGS. 29D and 29E are images obtained through image processing of FIGS. 29B and 29C. The method of image processing is as follows. The image in FIG. 29B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 29D, a portion where a lattice arrangement is broken is shown by a dashed line. A region surrounded by a dashed line is one pellet. The portion shown by the dashed line is a junction of pellets. The dashed line draws a hexagon, which means that the pellet has a hexagonal shape. Note that the shape of the pellet is not always a regular hexagon but is a non-regular hexagon in many cases.

In FIG. 29E, a dotted line denotes a portion between a region where a lattice arrangement is well aligned and another region where a lattice arrangement is well aligned. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of interatomic distance in an a-b plane direction, an interatomic distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}$ cm$^{-3}$, preferably lower than $1\times10^{11}$ cm$^{-3}$, further preferably lower than $1\times10^{10}$ cm$^{-3}$, and is higher than or equal to $1\times10^{-9}$ cm$^{-3}$). Such an oxide semiconductor is referred to as a highly purified intrinsic or substantially highly purified intrinsic oxide semiconductor. A CAAC-OS has a low impurity concentration and a low density of defect states. That is, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, for example, a peak indicating orientation does not appear. That is, a crystal of an nc-OS does not have orientation.

Figure 30A:
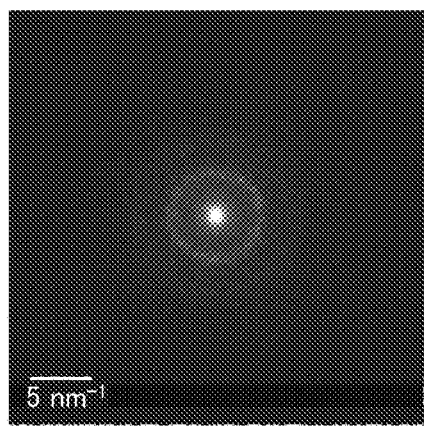
FIGS. 30A to 30D show electron diffraction patterns and a cross-sectional TEM image of an nc-OS.
Figure 30B:
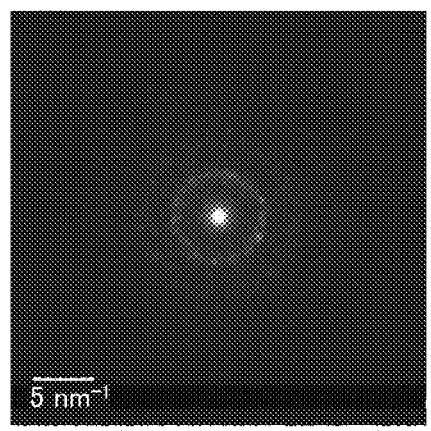

For example, when an electron beam with a probe diameter of 50 nm is incident on a 34-nm-thick region of a thinned nc-OS including an $InGaZnO_4$ crystal in a direction parallel to the formation surface, a ring-shaped diffraction pattern (nanobeam electron diffraction pattern) shown in FIG. 30A is observed. FIG. 30B shows a diffraction pattern obtained when an electron beam with a probe diameter of 1 nm is incident on the same sample. As shown in FIG. 30B, a plurality of spots are observed in a ring-like region. In other words, ordering in an nc-OS is not observed with an electron beam with a probe diameter of 50 nm but is observed with an electron beam with a probe diameter of 1 nm.

Figure 30C:
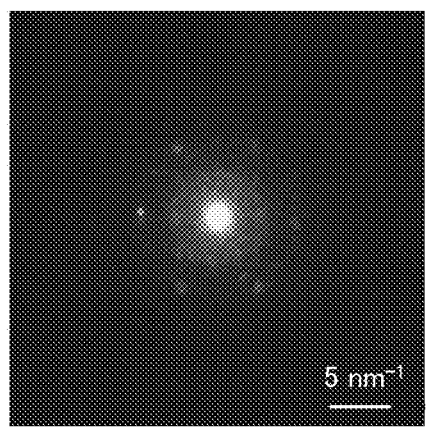

Furthermore, an electron diffraction pattern in which spots are arranged in an approximately regular hexagonal shape is observed in some cases as shown in FIG. 30C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 30D:
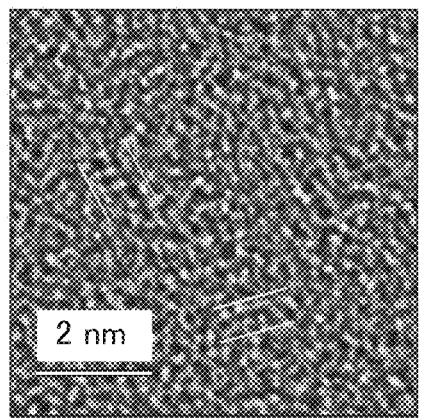

FIG. 30D shows a Cs-corrected high-resolution TEM image of a cross section of an nc-OS observed from the direction substantially parallel to the formation surface. In a high-resolution TEM image, an nc-OS has a region in which a crystal part is observed, such as a part indicated by additional lines in FIG. 30D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS might be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has high regularity than an amorphous oxide semiconductor. Thus, the nc-OS has a lower density of defect states than the a-like OS and the amorphous oxide semiconductor. Note that there is no regularity of crystal orientation between different pellets in the nc-OS; thus, the nc-OS has a higher density of defect states than the CAAC-OS.

<a-Like OS>

An a-like OS is an oxide semiconductor having a structure between the nc-OS and the amorphous oxide semiconductor.

Figure 31A:
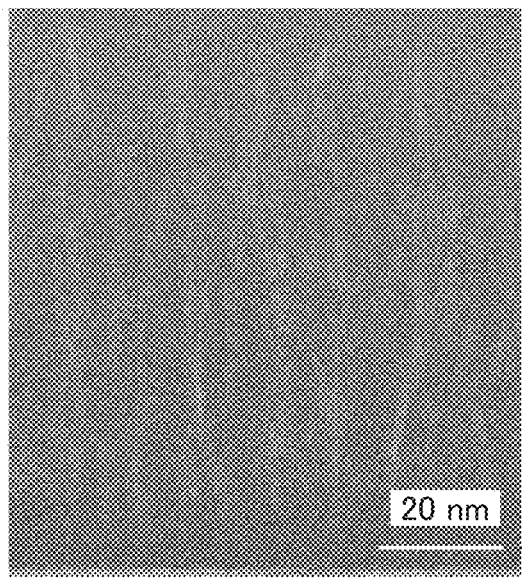
FIGS. 31A and 31B show cross-sectional TEM images of an a-like OS.
Figure 31B:
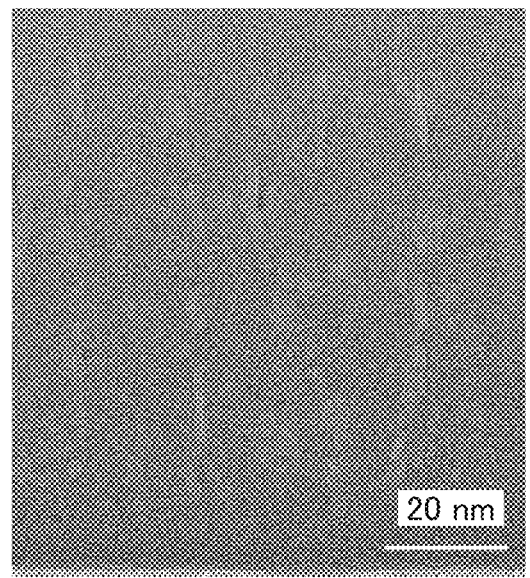

FIGS. 31A and 31B are high-resolution cross-sectional TEM images of an a-like OS. FIG. 31A is the high-resolution cross-sectional TEM image of the a-like OS at the start of electron irradiation. FIG. 31B is the high-resolution cross-sectional TEM image of a-like OS after electron (e) irradiation at $4.3 \times 10^8$ $e^-/nm^2$. FIGS. 31A and 31B show that stripe-like bright regions extending vertically are observed in the a-like OS from the start of electron irradiation. It can be also found that the shape of the bright region changes after electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

Note that it is known that a unit cell of the $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as a d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 32:
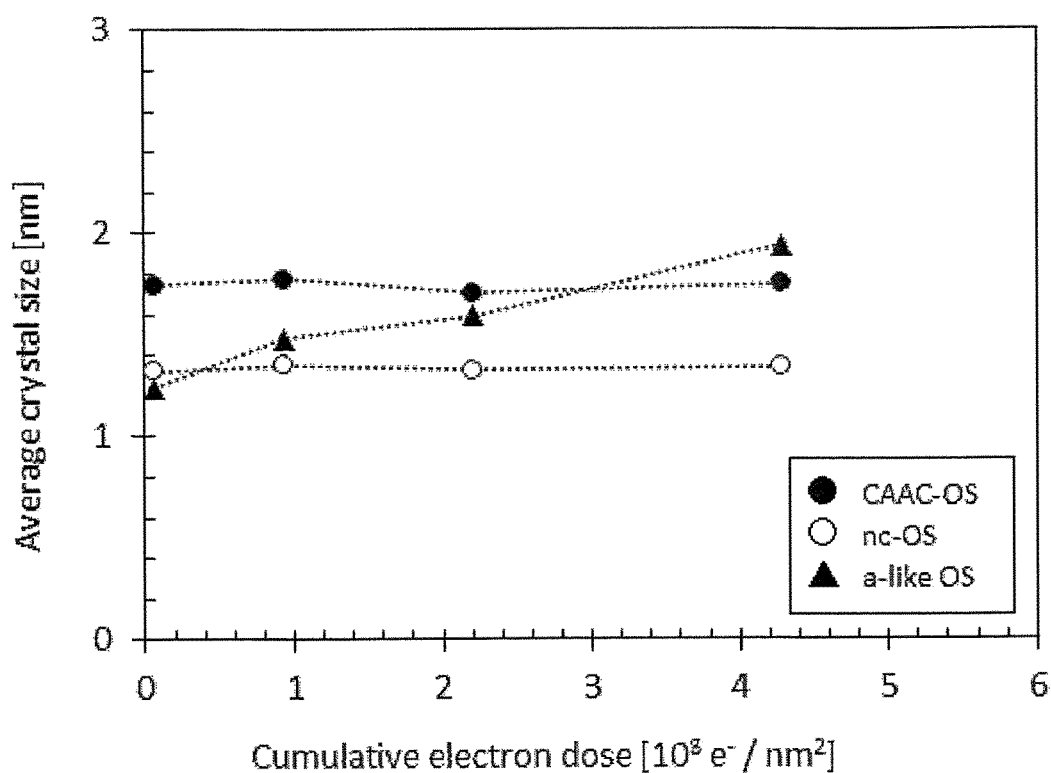
FIG. 32 shows changes in crystal parts of In—Ga—Zn oxides induced by electron irradiation.

FIG. 32 shows changes in the average size of crystal parts (at 22 to 30 points) in each sample. Note that the crystal part size corresponds to the length of the lattice fringe. FIG. 32 indicates that the crystal part size in the a-like OS increases with an increase in the cumulative electron dose in obtaining TEM images, for example. As shown in FIG. 32, a crystal part of approximately 1.2 nm (also referred to as an initial nucleus) at the start of TEM observation grows to a size of approximately 1.9 nm at a cumulative electron (e) dose of $4.2 \times 10^8$ $e^-/nm^2$. In contrast, the crystal part sizes in the nc-OS and the CAAC-OS show little change from the start of electron irradiation to a cumulative electron dose of $4.2 \times 10^8$ $e^-/nm^2$. As shown in FIG. 32, the crystal part sizes in the nc-OS and the CAAC-OS are approximately 1.3 nm and approximately 1.8 nm, respectively, regardless of the cumulative electron dose. For electron beam irradiation and TEM observation, a Hitachi H-9000NAR transmission electron microscope was used. The conditions of electron beam irradiation were as follows: accelerating voltage was 300 kV; current density was $6.7 \times 10^5 e^-/(nm^2 \cdot s)$; and the diameter of an irradiation region was 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78% of the density of the single crystal oxide semiconductor.

For example, in the case of an oxide semiconductor with an atomic ratio of In:Ga:Zn=1:1:1, the density of single-crystal InGaZnO$_4$ with a rhombohedral crystal structure is 6.357 g/cm$^3$. Thus, for example, in the case of the oxide semiconductor with an atomic ratio of In:Ga:Zn=1:1:1, the density of an a-like OS is higher than or equal to 5.0 g/cm$^3$ and lower than 5.9 g/cm$^3$. In addition, for example, in the case of the oxide semiconductor with an atomic ratio of In:Ga:Zn=1:1:1, the density of an nc-OS or a CAAC-OS is higher than or equal to 5.9 g/cm$^3$ and lower than 6.3 g/cm$^3$.

Note that in the case where single crystal oxide semiconductors with the same composition do not exist, by combining single crystal oxide semiconductors with different compositions at a given proportion, it is possible to estimate density that corresponds to the density of a single crystal oxide semiconductor with a desired composition. The density of the single crystal oxide semiconductor with a desired composition may be estimated using weighted average with respect to the combination ratio of the single crystal oxide semiconductors with different compositions. Note that it is preferable to combine as few kinds of single crystal oxide semiconductors as possible for density estimation.

As described above, oxide semiconductors have various structures and various properties. An oxide semiconductor may be a stacked film including two or more of an amorphous oxide semiconductor, an a-like OS, an nc-OS, and a CAAC-OS, for example.

The structure described in this embodiment can be used in appropriate combination with any of the structures described in the other embodiments.

Embodiment 6

In this embodiment, an example of a semiconductor device in which the oscillator of one embodiment of the present invention or the PLL including the oscillator is used as a generator circuit of a clock signal will be described.

The PLL can be incorporated in a processing unit, for example, and can function as a clock generator circuit. Examples of the processing unit include a central processing unit (CPU), a graphics processing unit (GPU), a programmable logic device (PLD), a digital signal processor (DSP), a microcontroller unit (MCU), a custom LSI, and a wireless IC that can send and receive data wirelessly.

Figure 33:
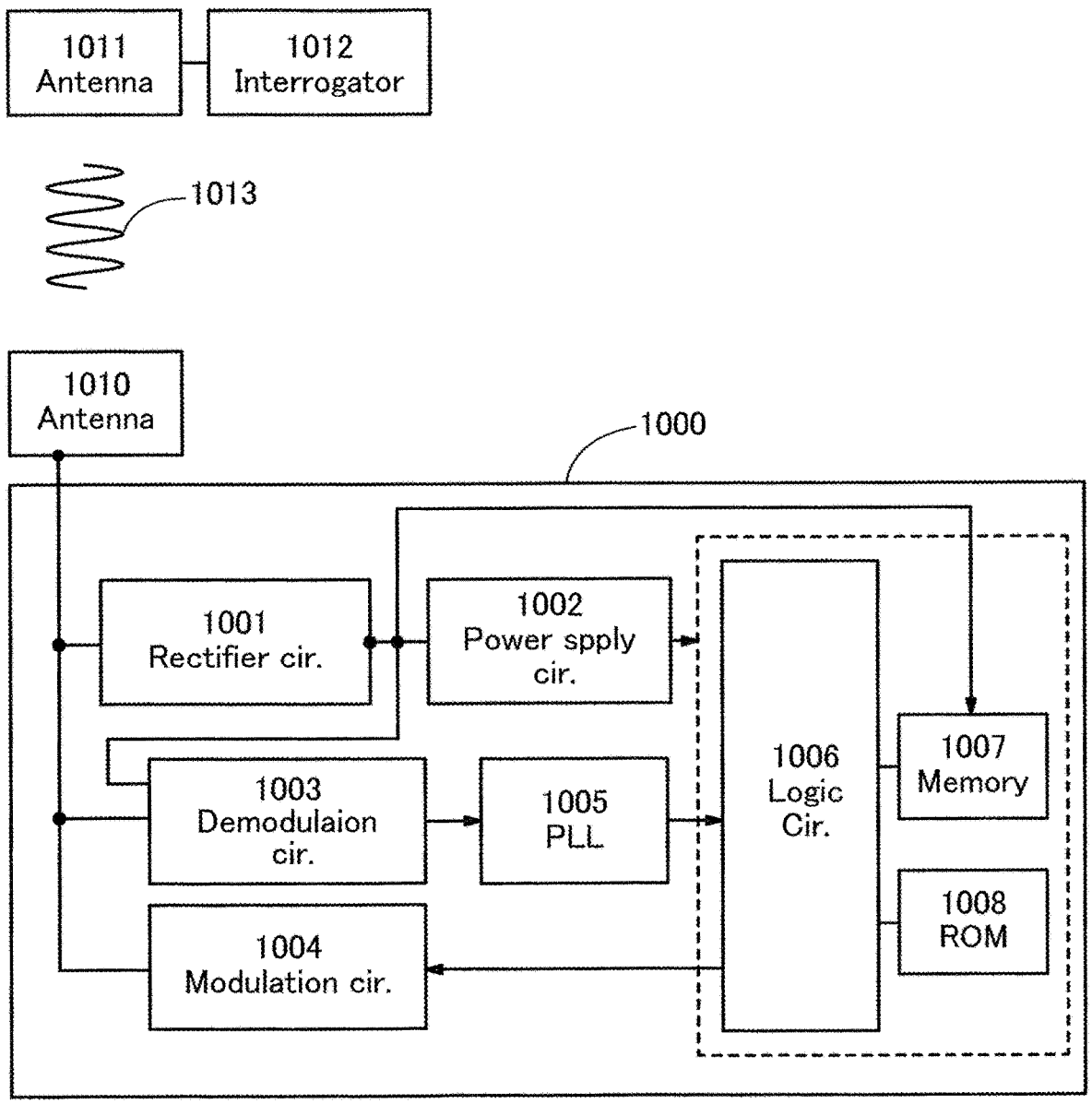
FIG. 33 is a block diagram illustrating a configuration example of a processing unit (wireless IC)

FIG. 33 shows an example of a wireless IC. The wireless IC may be referred to as a wireless chip, an RFIC, an RF chip, or the like. A carrier wave or a clock signal synchronized with a demodulated signal can be generated, for example, by incorporating a PLL in a wireless IC.

A wireless IC 1000 illustrated in FIG. 33 includes a rectifier circuit 1001, a power supply circuit 1002, a demodulation circuit 1003, a modulation circuit 1004, a PLL 1005, a logic circuit 1006, a memory device 1007, and a read-only memory (ROM) 1008. Decision whether each of these circuits is provided or not can be made as appropriate as needed. The wireless IC 1000 is electrically connected to an antenna 1010. For the PLL 1005, the oscillator of one embodiment of the present invention or a PLL including the oscillator can be used.

The kind of the wireless IC 1000 of this embodiment is not specifically limited. In FIG. 33, the wireless IC 1000 is a passive wireless IC as an example; however, the wireless IC 1000 may be an active wireless IC with a built-in battery. A communication method of the wireless IC 1000, a structure of the antenna 1010, and the like can be determined depending on a frequency band to be used.

The antenna 1010 exchanges a radio signal 1013 with the antenna 1011 which is connected to an interrogator 1012. The antenna 1010 has performance corresponding to its communication zone. As data transmission methods, the following methods can be given: an electromagnetic coupling method in which a pair of coils is provided so as to face each other and communicates with each other by mutual induction, an electromagnetic induction method in which communication is performed using an induction field, and a radio wave method in which communication is performed using a radio wave.

The rectifier circuit 1001 generates an input potential by rectification, for example, half-wave voltage doubler rectification of an input alternating signal generated by reception of a radio signal at the antenna 1010 and smoothing of the rectified signal with a capacitor element provided in a lower stage. A limiter circuit may be provided on an input side or an output side of the rectifier circuit 1001. The limiter circuit controls electric power so that electric power which is higher than or equal to certain electric power is not input to a circuit in a later stage if the amplitude of the input alternating signal is high and an internal generation voltage is high.

The power supply circuit 1002 generates a stable power supply voltage from an input potential and supplies it to each circuit. The power supply circuit 1002 may include a reset signal generator circuit. The reset signal generator circuit is a circuit which generates a reset signal of the logic circuit 1006 by utilizing rise of the stable power supply voltage.

The demodulation circuit 1003 demodulates the input alternating signal by envelope detection and generates a demodulated signal. The modulation circuit 1004 performs modulation in accordance with data to be output from the antenna 1010. The PLL 1005 is a circuit for generating a clock signal synchronized with the demodulated signal.

The logic circuit 1006 has a function of decoding the demodulated signal and performing processing based on the decoded result. The logic circuit 1006 includes, for example, a code recognition/determination circuit, an encoding circuit, and the like. The code recognition/determination circuit analyzes a code of the demodulated signal based on a clock signal to obtain its corresponding data. The logic circuit 1006 communicates data with the memory device 1007 in accordance with the analyzed code. The data output from the memory device 1007 is encoded in the encoding circuit. An encoded signal is output to the modulation circuit 1004.

The memory device 1007 includes a row decoder, a column decoder, a memory region, and the like and stores input data. The ROM 1008 stores an identification number (ID) and the like and outputs data in accordance with the processing of the logic circuit 1006.

Figure 34:
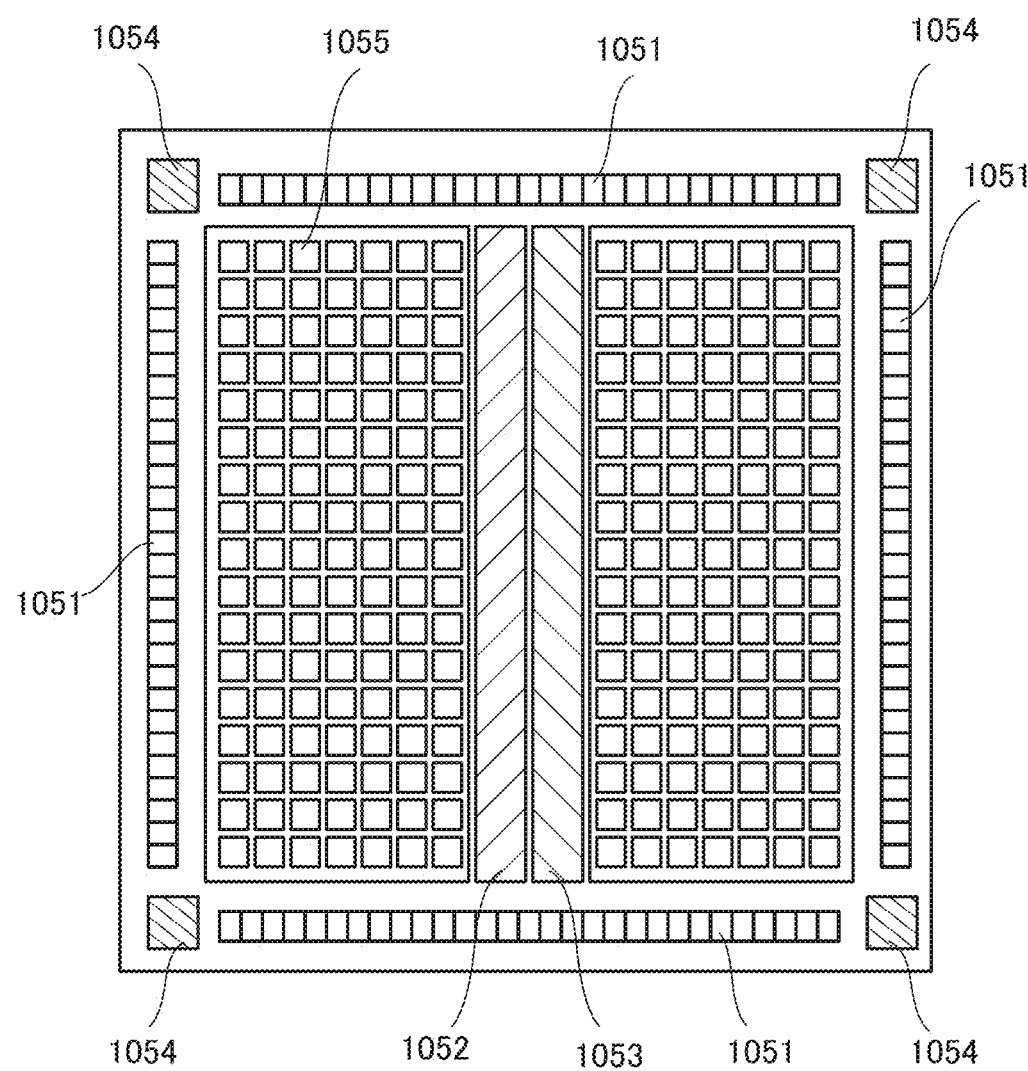
FIG. 34 is a schematic diagram illustrating a configuration example of a processing unit (PLD)

FIG. 34 illustrates an example of a programmable logic device (PLD). A PLD 1050 in FIG. 34 includes an input output (I/O) element 1051, a random access memory (RAM) 1052, a multiplier 1053, a PLL 1054, and a programmable logic element (PLE) 1055. The I/O element 1051 functions as an interface that controls input of a signal from a circuit outside the PLD 1050 or output of a signal to the circuit outside the PLD 1050. The PLL 1054 has a function of generating a clock signal. The RAM 1052 has a function of storing data used for a logical operation. The multiplier 1053 corresponds to a logic circuit for multiplication only. When the PLD 1050 includes a function of executing multiplication, the multiplier 1053 is not necessarily provided.

Figure 35:
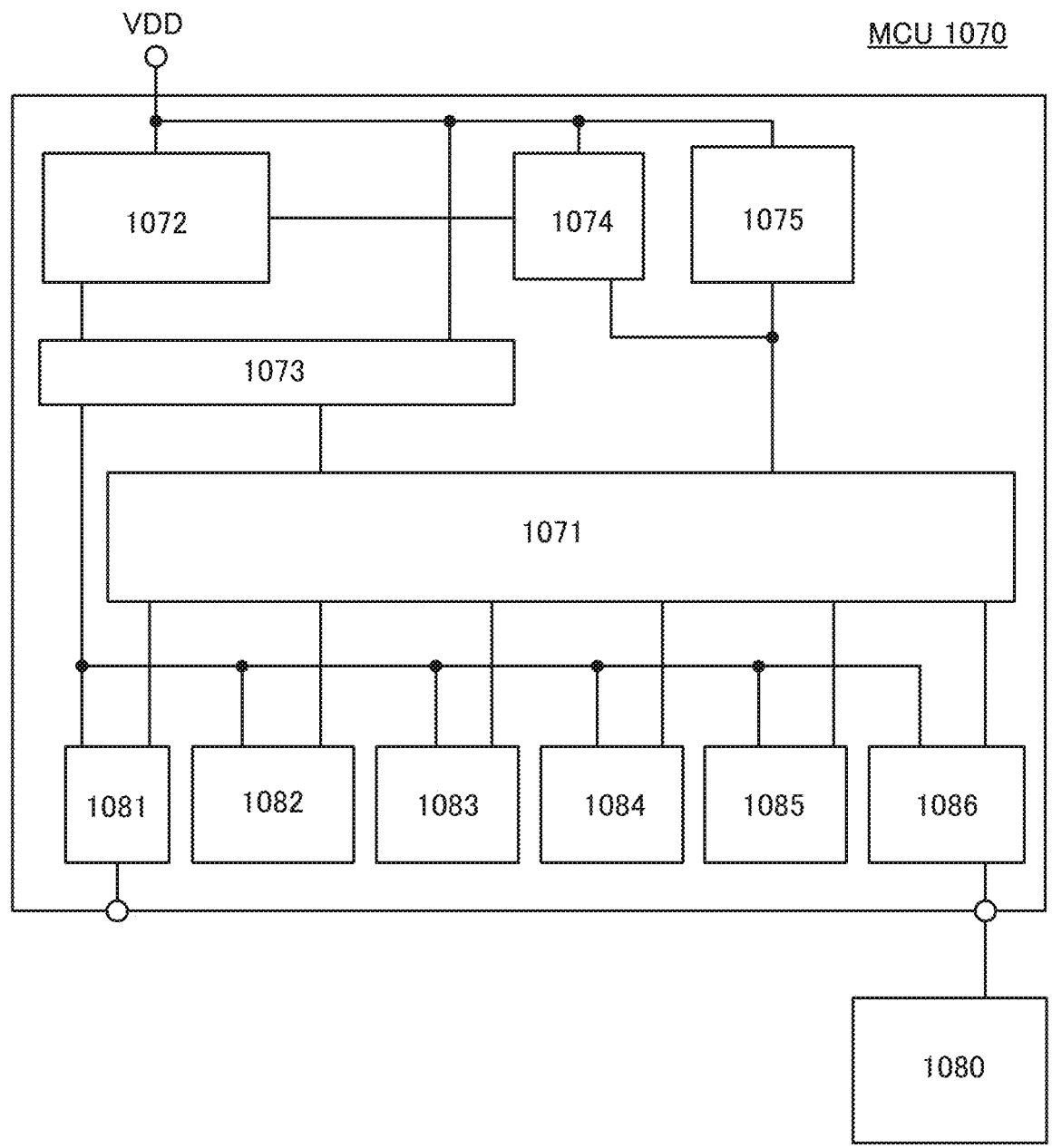
FIG. 35 is a block diagram illustrating a configuration example of a processing unit (MCU)

FIG. 35 illustrates an example of a microcontroller unit (MCU) 1070. The MCU 1070 includes a CPU core 1071, a power source management unit (PMU) 1072, a power gate 1073, a timer 1074, a PLL 1075, an analog-digital converter (ADC) 1081, a watchdog timer 1082, a ROM 1083, a nonvolatile memory (NVM) 1084, a power supply circuit 1085, an interface (IF) element 1086, and the like.

The PLL 1075 generates a clock signal and outputs it to internal circuits such as the CPU core 1071 and the timer 1074. The CPU core 1071 and the timer 1074 have a function of performing processing using the clock signal. The PMU 1072 controls the power gate 1073 and controls the supply of the power supply voltage VDD to the internal circuit of the MCU 1070. The VDD can be supplied to the timer 1074 and the PLL 1075 without passing through the power gate 1073. The PMU 1072 controls the power gate 1073 so as to stop supply of power to the internal circuit that does not need to operate.

FIG. 35 shows an example in which the MCU 1070 controls the wireless module 1080 capable of wireless communication. A semiconductor device such as a sensor unit or the like is connected to the ADC 1081. The MCU 1070 is capable of processing a signal input to the ADC 1081 and performing control so that the wireless module 1080 transmits the processed result to the other wireless modules. Alternatively, the MCU 1070 is capable of processing a received signal of the wireless module 1080 and performing control so that the wireless module 1080 transmits the processed result to the other wireless module.

The power gate 1073 is turned on by the PMU 1072, whereby the CPU core 1071, the watchdog timer 1082, the ROM 1083, the power supply circuit 1085, and the IF element 1086 operate. Data that is arithmetically processed in the CPU core 1071 is output to the wireless module 1080 via the IF element 1086. The wireless module 1080 wirelessly transmits data. An output signal of the wireless module 1080 is input to the ADC 1081 via the IF element 1086. The ADC 1081 converts the input signal to a digital signal and outputs it to the CPU core 1071. The input signal is arithmetically processed by the CPU core 1071. The signal that is arithmetically processed is output to the wireless module 1080 via the IF element 1086. The wireless module 1080 wirelessly transmits the data. After the transmission, the PMU 1072 turns off the power gate 1073, and stops supply of power to the CPU core 1071 and the like. After the supply of power is stopped, the PMU 1072 controls the timer 1074, and starts time measurement. When the time measurement of the timer 1074 reaches a set value, the PMU 1072 restarts the supply of power to the CPU core 1071 and the like by turning on the power gate 1073 again.

Figure 36:
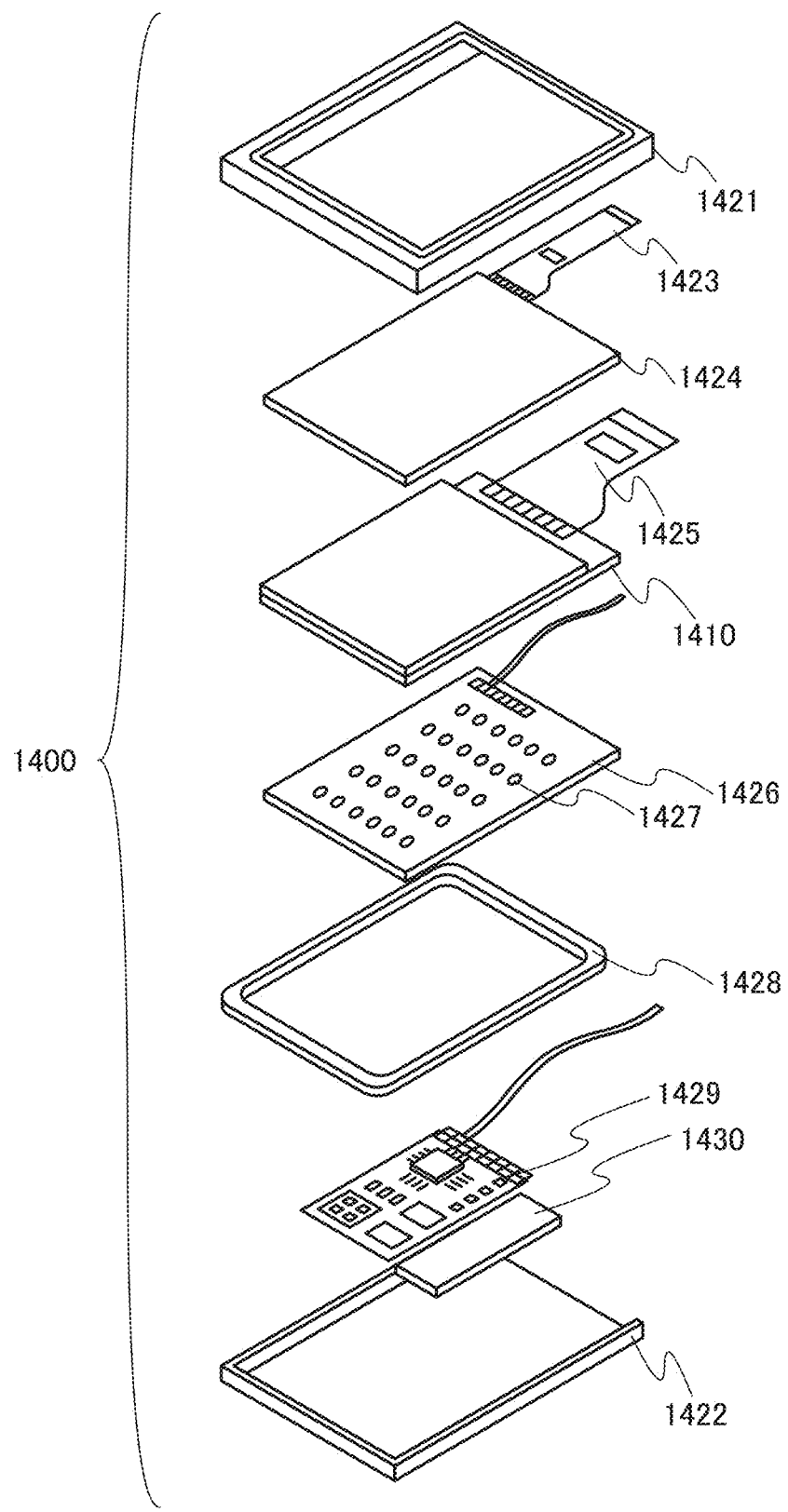
FIG. 36 is a perspective exploded view showing an example of a display device.

FIG. 36 shows an example of a display device. FIG. 36 is an exploded perspective view of the display device. The PLL is incorporated so that a clock signal is supplied to a driver circuit of a display device.

In a display device 1400 illustrated in FIG. 36, a touch panel unit 1424 connected to an FPC 1423, a display panel 1410 connected to an FPC 1425, a backlight unit 1426, a frame 1428, a printed board 1429, and a battery 1430 are provided between an upper cover 1421 and a lower cover 1422. Note that the backlight unit 1426, the battery 1430, the touch panel unit 1424, and the like are not provided in some cases. For example, in the case where the display device 1400 is a reflective liquid crystal display device or an electroluminescent (EL) display device, the backlight unit 1426 is unnecessary. The display device 1400 may be additionally provided with a member such as a polarizing plate, a retardation plate, or a prism sheet.

The shapes and sizes of the upper cover 1421 and the lower cover 1422 can be changed as appropriate in accordance with the sizes of the touch panel unit 1424 and the display panel 1410.

The touch panel unit 1424 can be a resistive touch panel or a capacitive touch panel and may be formed so as to overlap the display panel 1410. A counter substrate (sealing substrate) of the display panel 1410 can have a touch panel function. Alternatively, a photosensor may be provided in each pixel of the display panel 1410 to form an optical touch panel. An electrode for a touch sensor may be provided in each pixel of the display panel 1410 so that a capacitive touch panel is obtained.

The backlight unit 1426 includes a light source 1427. The light source 1427 may be provided at an end portion of the backlight unit 1426 and a light diffusing plate may be used.

The frame 1428 protects the display panel 1410 and functions as an electromagnetic shield for blocking electromagnetic waves generated by the operation of the printed board 1429. The frame 1428 may function as a radiator plate.

The printed board 1429 is provided with a power supply circuit and a signal processing circuit for outputting a video signal and a clock signal. The PLL is incorporated in the signal processing circuit. A clock signal generated in the PLL is supplied to the driver circuit of the display panel 1410, and the driver circuit of the touch panel unit 1424. As a power source for supplying power to the power supply circuit, an external commercial power source or a power source using the battery 1430 provided separately may be used. The battery 1430 can be omitted in the case of using a commercial power source.

Figure 37A:
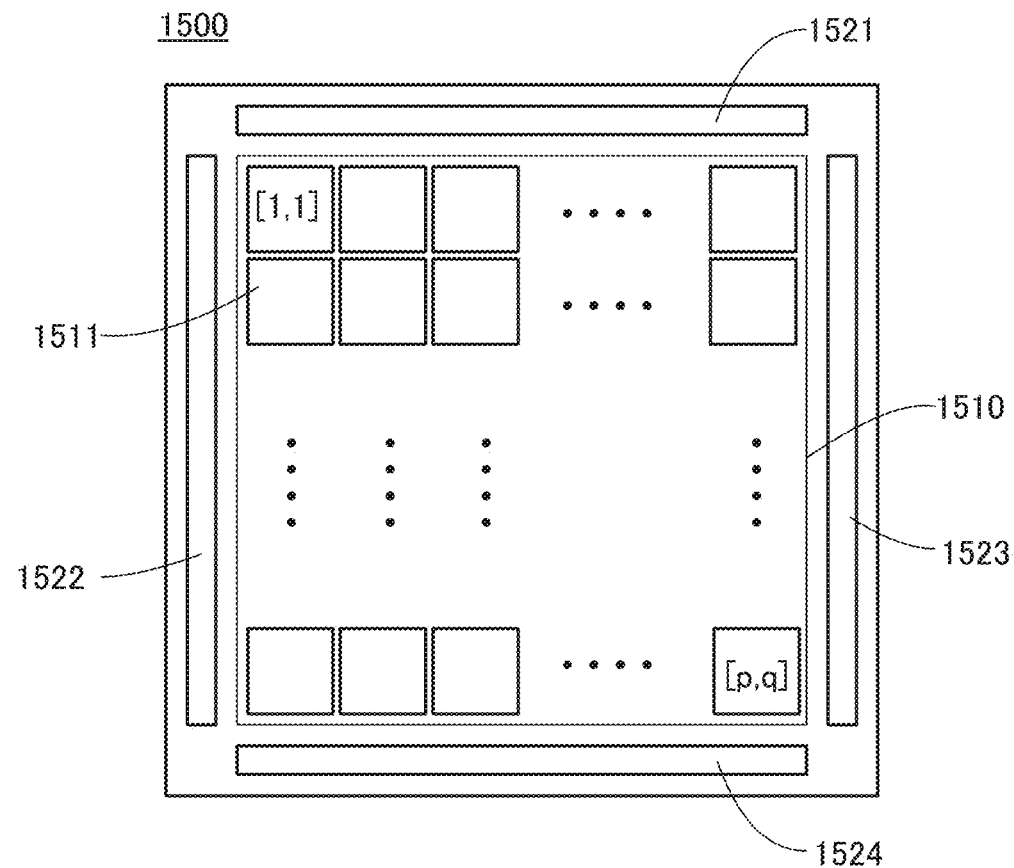
FIG. 37A is a block diagram illustrating a configuration example of an imaging device.

An imaging device 1500 in FIG. 37A includes a pixel portion 1510, a driver circuit 1521, a driver circuit 1522, a driver circuit 1523, and a driver circuit 1524. The PLL can be incorporated in an imaging device. The PLL generates a clock signal in a driver circuit for driving a pixel portion.

The pixel portion 1510 includes a plurality of pixels 1511 (imaging elements) arranged in matrix with p rows and q columns (p and q are each an integer greater than or equal to 2). The driver circuits 1521 to 1524 are each electrically connected to the pixel portion 1510 and supply signals for driving the pixel portion 1510. The pixels 1511 include photoelectric conversion elements and pixel circuits. The pixel circuit has a function of generating an analog signal corresponding to the amount of light received by the photoelectric conversion element.

For example, the driver circuit 1522 or the driver circuit 1523 has a function of generating and outputting a selection signal for selecting a pixel 1511 from which a signal is read. Note that the driver circuit 1522 or the driver circuit 1523 is referred to as a row selection circuit or a vertical driver circuit in some cases. At least one of the driver circuits 1521 to 1524 may be omitted. For example, one of the driver circuit 1521 and the driver circuit 1524 may be omitted, and the function of the omitted driver circuit may be added to the other driver circuit. For example, one of the driver circuit 1522 and the driver circuit 1523 may be omitted, and the function of the omitted driver circuit may be added to the other driver circuit. For example, one of the driver circuits 1521 to 1524 may have the functions of all of the driver circuits 1521 to 1524, and the other driver circuits may be omitted.

Figure 37B:
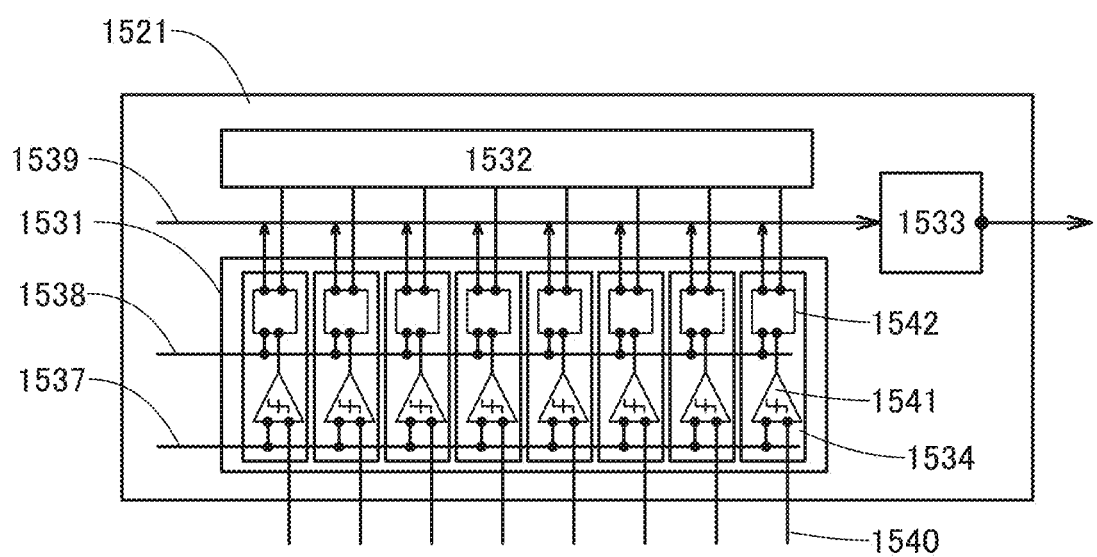
FIG. 37B is a block diagram illustrating a configuration example of a driver circuit.

For example, the driver circuit 1521 or the driver circuit 1524 has a function of processing an analog signal output from the pixels 1511. For example, FIG. 37B shows a configuration example of the driver circuit 1521. The driver circuit 1521 in FIG. 37B may include a signal processing circuit 1531, a column driver circuit 1532, an output circuit 1533, and the like.

The signal processing circuit 1531 includes a circuit 1534 provided for each column. The circuit 1534 can have a function of performing signal processing such as removal of noise and analog-digital conversion. The circuit 1534 shown in FIG. 37B has a function of analog-digital conversion. The signal processing circuit 1531 can function as a column-parallel (column type) analog-digital conversion device.

The circuit 1534 includes a comparator 1541 and a counter circuit 1542. The comparator 1541 has a function of comparing potentials of an analog signal input from a wiring 1540 that is provided in each column and a reference potential signal (e.g., a ramp wave signal) input from a wiring 1537. A clock signal is input to a wiring 1538 from the PLL. The counter circuit 1542 has a function of measuring the length of a period during which a first value is output by the comparison operation in the comparator 1541 and holding the measurement result as an N-bit digital value.

The column driver circuit 1532 is also referred to as a column selection circuit, a horizontal driver circuit, or the like. The column driver circuit 1532 generates a selection signal for selecting a column from which a signal is read. The column driver circuit 1532 can be formed using a shift register or the like. Columns are sequentially selected by the column driver circuit 1532, and an output signal from the circuit 1534 in the selected column is input to the output circuit 1533 via a wiring 1539. The wiring 1539 can function as a horizontal transfer line.

A signal input to the output circuit 1533 is processed in the output circuit 1533, and is output outside the imaging device 1500. The output circuit 1533 can be formed using a buffer circuit, for example. The output circuit 1533 may have a function of controlling the timing at which a signal is output outside the imaging device 1500.

The variety of processing units and the semiconductor device such as a display device can be incorporated in various electronic devices. For example, when the wireless IC in FIG. 33 is incorporated in an electronic device, the electronic device can have a wireless communication function. For example, when the display device in FIG. 36 is incorporated in an electronic device, the electronic device can have an information display function. For example, the imaging device in FIGS. 37A and 37B is incorporated in an electronic device, the electronic device can have an imaging function.

Examples of an electronic device include display devices, personal computers, image memory devices or image reproducing devices provided with storage media, mobile phones, game machines (including portable game consoles), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 38A to 38F illustrate specific examples of these electronic devices.

Figure 38A:
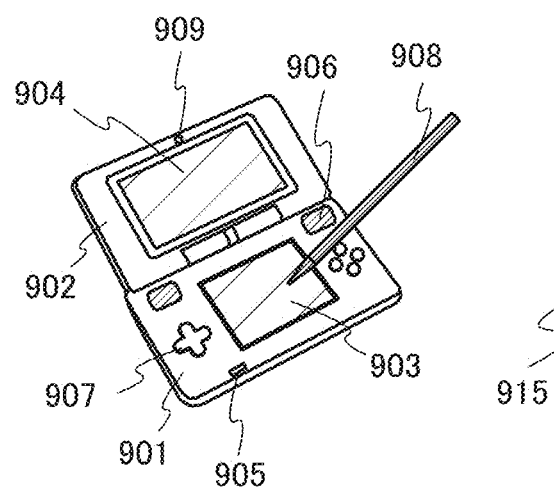
FIGS. 38A to 38F illustrate structure examples of electronic devices.

FIG. 38A illustrates a portable game console, which includes a housing 901, a housing 902, a display portion 903, a display portion 904, a microphone 905, a speaker 906, an operation key 907, a stylus 908, a camera 909, and the like. Although the portable game console in FIG. 38A has the two display portions 903 and 904, the number of display portions included in a portable game console is not limited to this.

Figure 38B:
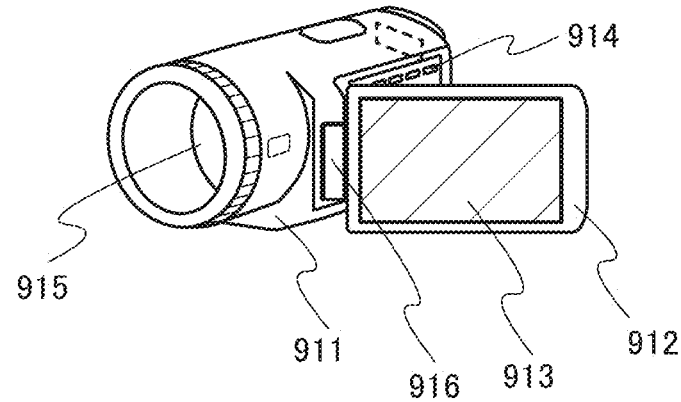

FIG. 38B illustrates a video camera, which includes a first housing 911, a second housing 912, a display portion 913, operation keys 914, a lens 915, a joint 916, and the like. The operation keys 914 and the lens 915 are provided for the first housing 911, and the display portion 913 is provided for the second housing 912. The first housing 911 and the second housing 912 are connected to each other with the joint 916, and the angle between the first housing 911 and the second housing 912 can be changed with the joint 916. An image on the display portion 913 may be switched depending on the angle between the first housing 911 and the second housing 912 at the joint 916.

Figure 38C:
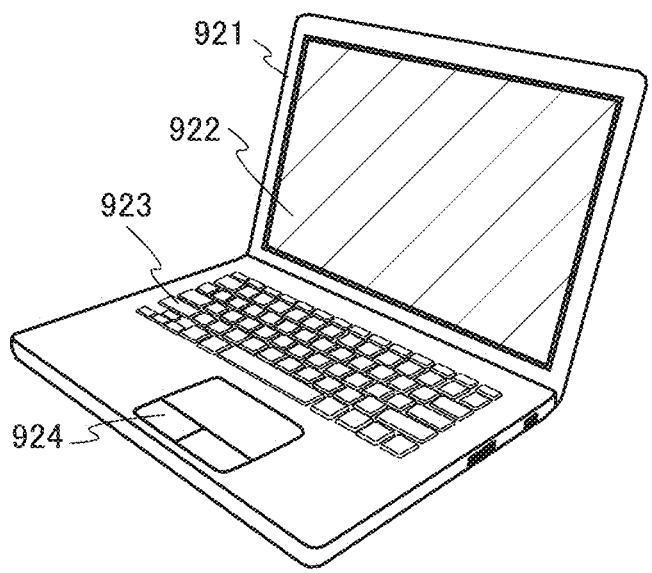

FIG. 38C illustrates a laptop personal computer, which includes a housing 921, a display portion 922, a keyboard 923, a pointing device 924, and the like.

Figure 38D:
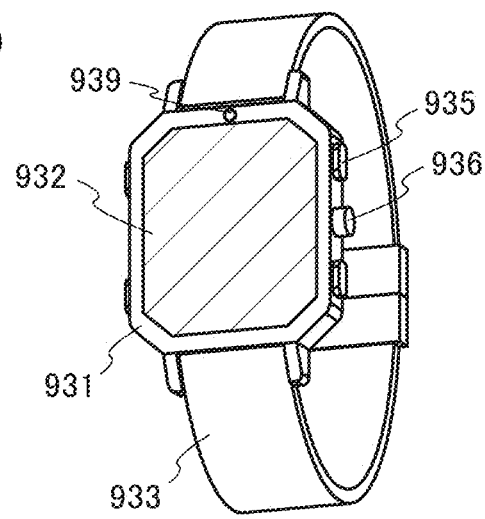

FIG. 38D illustrates a wrist-watch-type information terminal, which includes a housing 931, a display portion 932, a wristband 933, operation buttons 935, a winder 936, a camera 939, and the like. The display portion 932 may have a touch panel function. The imaging device of one embodiment of the present invention can be included as a component for obtaining an image in the information terminal.

Figure 38E:
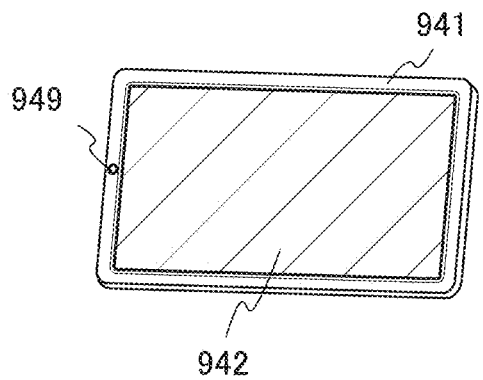

FIG. 38E illustrates a portable information terminal, which includes a first housing 941, a display portion 942, a camera 949, and the like. A touch panel function of the display portion 942 enables input of information.

Figure 38F:
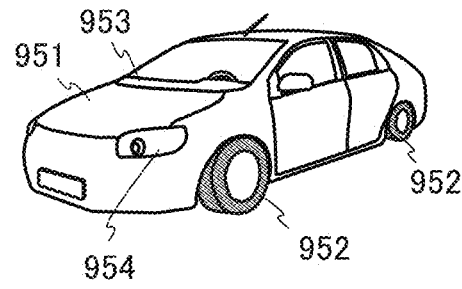

FIG. 38F illustrates a car including a car body 951, wheels 952, a dashboard 953, lights 954, and the like.

The structure described in this embodiment can be used in appropriate combination with any of the structures described in the other embodiments.

This application is based on Japanese Patent Application serial No. 2015-213708 filed with Japan Patent Office on Oct. 30, 2015, the entire contents of which are hereby incorporated by reference.

What is claimed is:
1. A semiconductor device comprising:
   first to ninth transistors; and
   first and second capacitors,
   wherein the first transistor is a p-channel transistor,
   wherein the second to ninth transistors are n-channel transistors,
   wherein a gate of the first transistor is electrically connected to a gate of the second transistor,
   wherein one of a source and a drain of the first transistor is electrically connected to one of a source and a drain of the second transistor and one of a source and a drain of the fifth transistor,
   wherein the other of the source and the drain of the first transistor is electrically connected to a gate of the fifth transistor,
   wherein a gate of the third transistor is electrically connected to one of a source and a drain of the fourth transistor and a first electrode of the first capacitor, wherein a second electrode of the first capacitor is electrically connected to the other of the source and the drain of the second transistor,
wherein one of a source and a drain of the third transistor is electrically connected to the other of the source and the drain of the fifth transistor,
wherein the other of the source and the drain of the third transistor is electrically connected to one of a source and a drain of the sixth transistor,
wherein the other of the source and the drain of the fifth transistor is directly connected to one of a source and a drain of the seventh transistor,
wherein the other of the source and the drain of the seventh transistor is electrically connected to one of a source and a drain of the ninth transistor,
wherein a gate of the seventh transistor is electrically connected to one of a source and a drain of the eighth transistor and a first electrode of the second capacitor,
wherein a second electrode of the second capacitor is electrically connected to the other of the source and the drain of the second transistor, and
wherein the other of the source and the drain of the ninth transistor is electrically connected to the other of the source and the drain of the sixth transistor.

2. The semiconductor device according to claim 1,
wherein the other of the source and the drain of the first transistor is electrically connected to a first power supply line,
wherein the other of the source and the drain of the second transistor is electrically connected to a second power supply line, and
wherein a potential of the first power supply line is higher than a potential of the second power supply line.

3. The semiconductor device according to claim 1, wherein the third transistor, the fifth transistor, the sixth transistor, the seventh transistor, and the ninth transistor each comprise an oxide semiconductor in a channel formation region.

4. The semiconductor device according to claim 3,
wherein the oxide semiconductor comprises In, Zn, and M, and
wherein M is one of Al, Ga, Y, and Sn.

5. The semiconductor device according to claim 1, wherein the second transistor comprises an oxide semiconductor in a channel formation region.

6. The semiconductor device according to claim 5,
wherein the oxide semiconductor comprises In, Zn, and M, and
wherein M is one of Al, Ga, Y, and Sn.

7. A semiconductor device comprising:
first to ninth transistors; and
first and second capacitors,
wherein the first transistor is a p-channel transistor,
wherein the second to ninth transistors are n-channel transistors,
wherein a gate of the first transistor is electrically connected to a gate of the second transistor,
wherein one of a source and a drain of the first transistor is electrically connected to one of a source and a drain of the second transistor and one of a source and a drain of the fifth transistor,
wherein the other of the source and the drain of the first transistor is electrically connected to a gate of the fifth transistor,
wherein a gate of the third transistor is directly connected to one of a source and a drain of the fourth transistor and a first electrode of the first capacitor,
wherein a second electrode of the first capacitor is electrically connected to the other of the source and the drain of the second transistor,
wherein one of a source and a drain of the third transistor is electrically connected to the other of the source and the drain of the fifth transistor,
wherein the other of the source and the drain of the third transistor is electrically connected to one of a source and a drain of the sixth transistor,
wherein the other of the source and the drain of the fifth transistor is directly connected to one of a source and a drain of the seventh transistor,
wherein the other of the source and the drain of the seventh transistor is electrically connected to one of a source and a drain of the ninth transistor,
wherein a gate of the seventh transistor is electrically connected to one of a source and a drain of the eighth transistor and a first electrode of the second capacitor,
wherein a second electrode of the second capacitor is electrically connected to the other of the source and the drain of the second transistor, and
wherein the other of the source and the drain of the ninth transistor is electrically connected to the other of the source and the drain of the sixth transistor.

8. The semiconductor device according to claim 7,
wherein the other of the source and the drain of the first transistor is electrically connected to a first power supply line,
wherein the other of the source and the drain of the second transistor is electrically connected to a second power supply line, and
wherein a potential of the first power supply line is higher than a potential of the second power supply line.

9. The semiconductor device according to claim 7, wherein the third transistor, the fifth transistor, the sixth transistor, the seventh transistor, and the ninth transistor each comprise an oxide semiconductor in a channel formation region.

10. The semiconductor device according to claim 9,
wherein the oxide semiconductor comprises In, Zn, and M, and
wherein M is one of Al, Ga, Y, and Sn.

11. The semiconductor device according to claim 7, wherein the second transistor comprises an oxide semiconductor in a channel formation region.

12. The semiconductor device according to claim 11,
wherein the oxide semiconductor comprises In, Zn, and M, and
wherein M is one of Al, Ga, Y, and Sn.

13. A semiconductor device comprising:
first to ninth transistors; and
first and second capacitors,
wherein the first transistor is a p-channel transistor,
wherein the second to ninth transistors are n-channel transistors,
wherein a gate of the first transistor is electrically connected to a gate of the second transistor,
wherein one of a source and a drain of the first transistor is electrically connected to one of a source and a drain of the second transistor and one of a source and a drain of the fifth transistor,
wherein the other of the source and the drain of the first transistor is electrically connected to a gate of the fifth transistor,
wherein a gate of the third transistor is electrically connected to one of a source and a drain of the fourth transistor and a first electrode of the first capacitor, wherein a second electrode of the first capacitor is electrically connected to the other of the source and the drain of the second transistor, wherein one of a source and a drain of the third transistor is electrically connected to the other of the source and the drain of the fifth transistor, wherein the other of the source and the drain of the third transistor is electrically connected to one of a source and a drain of the sixth transistor, wherein the other of the source and the drain of the fifth transistor is directly connected to one of a source and a drain of the seventh transistor, wherein the other of the source and the drain of the seventh transistor is electrically connected to one of a source and a drain of the ninth transistor, wherein a gate of the seventh transistor is directly connected to one of a source and a drain of the eighth transistor and a first electrode of the second capacitor, wherein a second electrode of the second capacitor is electrically connected to the other of the source and the drain of the second transistor, and wherein the other of the source and the drain of the ninth transistor is electrically connected to the other of the source and the drain of the sixth transistor.

14. The semiconductor device according to claim 13,
wherein the other of the source and the drain of the first transistor is electrically connected to a first power supply line,
wherein the other of the source and the drain of the second transistor is electrically connected to a second power supply line, and
wherein a potential of the first power supply line is higher than a potential of the second power supply line.

15. The semiconductor device according to claim 13, wherein the third transistor, the fifth transistor, the sixth transistor, the seventh transistor, and the ninth transistor each comprise an oxide semiconductor in a channel formation region.

16. The semiconductor device according to claim 15,
wherein the oxide semiconductor comprises In, Zn, and M, and
wherein M is one of Al, Ga, Y, and Sn.

17. The semiconductor device according to claim 13, wherein the second transistor comprises an oxide semiconductor in a channel formation region.

18. The semiconductor device according to claim 17,
wherein the oxide semiconductor comprises In, Zn, and M, and
wherein M is one of Al, Ga, Y, and Sn.

* * * * *